(12) United States Patent
Shimano et al.

(10) Patent No.: US 7,738,312 B2
(45) Date of Patent: Jun. 15, 2010

(54) SEMICONDUCTOR MEMORY DEVICE

(75) Inventors: Hiroki Shimano, Tokyo (JP); Fukashi Morishita, Tokyo (JP); Kazutami Arimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 375 days.

(21) Appl. No.: 12/000,343

(22) Filed: Dec. 12, 2007

(65) Prior Publication Data

US 2008/0137394 A1 Jun. 12, 2008

(30) Foreign Application Priority Data

Dec. 12, 2006 (JP) ............................. 2006-334688

(51) Int. Cl.
*G11C 8/00* (2006.01)
(52) U.S. Cl. ..................... 365/230.05; 365/63; 365/207
(58) Field of Classification Search ............ 365/230.05, 365/63, 72, 207
See application file for complete search history.

(56) References Cited

U.S. PATENT DOCUMENTS

| | | | | |
|---|---|---|---|---|
| 6,538,954 B2 * | 3/2003 | Kunikiyo | ............... | 365/230.05 |
| 7,285,832 B2 * | 10/2007 | Hoefler et al. | ............... | 257/393 |
| 7,652,927 B2 * | 1/2010 | Morishita et al. | ...... | 365/185.21 |

OTHER PUBLICATIONS

Hidaka, H., et al., "A High-Density Dual-Port Memory Cell Operation and Array Architecture for ULSI DRAM's", IEEE Journal of Solid-State Circuits, Apr. 1992, pp. 610-617, vol. 27 No. 4, IEEE.
Agata, Y., et al., "An 8-ns Random Cycle Embedded RAM Macro With Dual-Port Interleaved DRAM Architecture ($D_2RAM$)", IEEE Journal of Solid-State Circuits, Nov. 2000, pp. 1668-1672, vol. 35 No. 11, IEEE.
Morishita, F., et al., "A Capacitorless Twin-Transistor Random Access Memory (TTRAM) on SOI", IEEE 2005 Custom Integrated Circuits Conference, 2005, pp. 435-438.
Arimoto, K., et al., "A Configurable Enhanced $T_2RAM$ Macro for System-Level Power Management Unified Memory", 2006 Symposium on VLSI Circuits Digest of Technical Papers, 2006.

* cited by examiner

*Primary Examiner*—Huan Hoang
(74) *Attorney, Agent, or Firm*—McDermott Will & Emery LLP

(57) ABSTRACT

One memory cell is formed of a first port access transistor, a second port access transistor and a storage transistor coupled commonly to these access transistors. The first port access transistor is coupled to a first electrode of the storage transistor, and the second port access transistor is coupled to a third electrode of the storage transistor. These first and second port access transistors enter a selected state when first and second port word lines are selected, respectively, to couple corresponding second and third electrodes of the corresponding storage transistor to first and second port bit lines, respectively. A dual-port memory cell of which scalability can follow miniaturization in a process can be provided.

25 Claims, 33 Drawing Sheets

CELL CAPACITOR RESTORING IS UNNECESSARY, ALLOWING FAST ACCESS TIMING

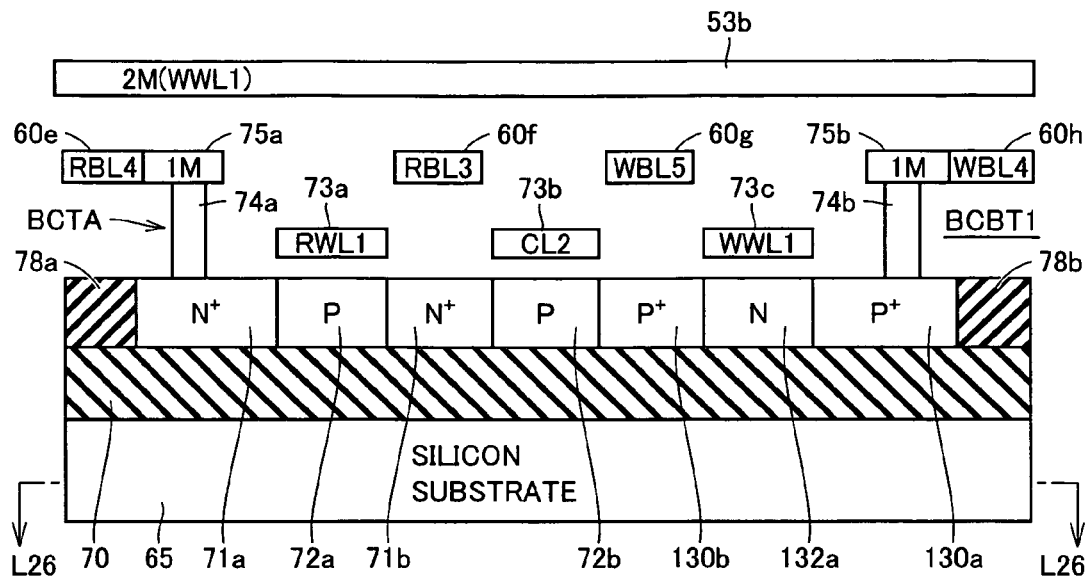
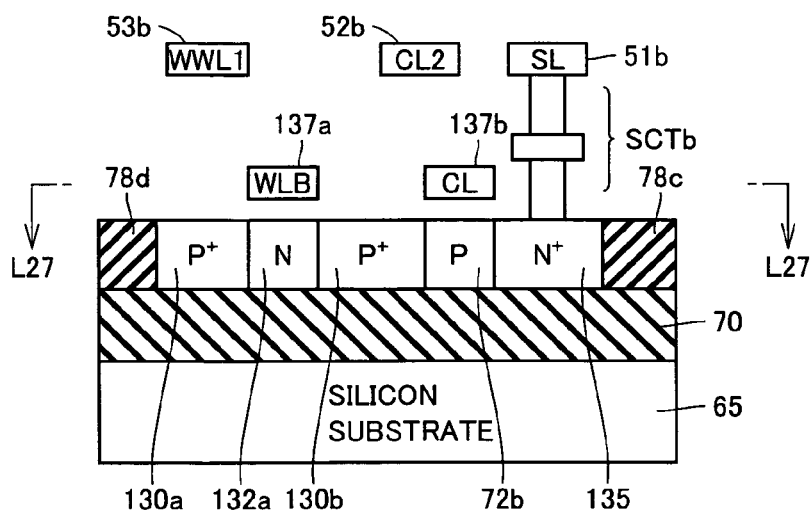

SEMICONDUCTOR MEMORY DEVICE

BACKGROUND OF THE invention

1. Field of the Invention

The present invention relates to a semiconductor memory device, and particularly to a semiconductor memory device including transistors of an SOI (Silicon On Insulator) structure formed on an insulating film. Specifically, the present invention relates to an arrangement of a memory cell array in a multiport semiconductor memory device that can be accessed via multiple ports.

2. Description of the Background Art

In fields of image data processing and the like, system LSIs in which a logic such as a processor and a memory device are integrated on a single semiconductor chip have been widely used for high-speed processing of a large amount of data. In these system LSIs, the logic and the memory device are interconnected via on-chip interconnection lines, so that the following advantages can be achieved.

(1) A load on a signal line is smaller than that on an on-board interconnection line, and data and signals can be transmitted fast.

(2) Since the number of pin terminals is not restricted, a data bus width can be increased, and a band width of data transfer can be increased.

(3) Since various components are integrated on the semiconductor chip, a small-size and light system can be achieved.

(4) Macros prepared in a library can be arranged as components to be formed on the semiconductor chip, so that design efficiency is improved.

For the above reasons, the system LSIs have been widely used in various fields. For the integrated memory devices, the system LSIs employs, e.g., a Dynamic Random Access Memory (DRAM), an Static Random Access Memory (SRAM) and a nonvolatile semiconductor memory device such as a flash memory. For the logics, the system LSI employs, e.g., a processor performing control and data processing, an analog processing circuit such as an analog-to-digital converter circuit and the like, and a logic circuit performing dedicated logical processing.

The memory devices include a dual-port RAM that has two ports each allowing individual access for realizing a fast-access memory system. The dual-port RAM allows write/read of data via one of the access ports while data is being read or written via the other access port.

A dual-port RAM based on an SRAM cell has been widely known. Memory capacities must be increased as a data processing amount increases. Therefore, the dual-portion RAM based on the DRAM memory cell has been developed as disclosed in an article 1 (H. Hidaka, et al., "A High-Density Dual-Port Memory Cell Operation and Array Architecture for ULSI DRAM's", ISSCC, vol. 27, No. 4, 1992, pp. 610-617) and an article 2 (Y. Agata, et al., "An 8-ns Random Cycle Embedded RAM Macro With Dual-Port Interleaved DRAM Architecture ($D^2RAM$)", IEEE JOURNAL OF SOLID-STATE CIRCUITS, vol. 35, No. 11, 2000, pp. 1668-1672).

In the dual-port RAM disclosed in the article 1, one memory cell is formed using one capacitor and two transistors. Bit lines of different ports are arranged alternately to each other for reducing noises due to capacitive coupling between the bit lines. Sense amplifiers are arranged on the opposite sides of the bit lines, and are coupled to divided and undivided bit lines. By utilizing imbalance of the bit line capacitances, a read voltage difference of memory cell data is produced, and the sense amplifiers on the opposite sides amplify data read onto the divided and undivided bit lines in parallel with each other.

In the article 1, a folded bit line structure is used, and a sense amplifier is arranged for each bit line pair so that memory cells may be arranged at a high density. Also, the bit lines of the different ports are arranged alternately to each other for improving a noise margin.

The structure disclosed in the article 2 (Y. Agata, et al., "An 8-ns Random Cycle Embedded RAM Macro With Dual-Port Interleaved DRAM Architecture ($D^2RAM$)", IEEE JOURNAL OF SOLID-STATE CIRCUITS, vol. 35, No. 11, 2000, pp. 1668-1672) likewise uses two-transistor/one-capacitor DRAM cells. In the structure disclosed in the article 2, the memory cells are arranged to provide an open bit structure for reducing an arrangement pitch of the sense amplifiers to reducing the memory cell size. The bit lines for the different ports are arranged alternately to each other, and it is intended to reduce the inter-bit-line capacitive coupling noise by using the bit line of one of the ports as a shield line when the other port is being accessed.

In the structure disclosed in the article 2, the access is made alternately to the two ports, and an internal data transfer operation is pipelined, so that fast access may be achieved. Further, for achieving a fast write operation, data is written into the memory cell before a transfer operation, and sense and restore operations are performed after the data writing so the write time may be reduced.

A memory cell structure that reduces power consumption and achieves a fast operation is disclosed in an article 3 (F. Morishita, et al., "A Capacitorless Twin-Transistor Random Access Memory (TTRAM) on SOI", Proc. CICC, 2005, pp. 435-438) and an article 4 (K. Arimoto, et al., "A Configurable Enhanced $T^2RAM$ Macro for System-Level Power Management Unified Memory", Proc. VLSI Symp.).

In the structure disclosed in the article 3, a memory cell is formed of two SOI (Silicon On Insulator) transistors connected in series. A body region of one of the transistors is used as a storage node, and the other transistor is used as an access transistor. A threshold voltage of the transistor for data storage changes according to a potential of the body region. A source node of the data storage transistor is kept at a power supply voltage level. In a data read operation, a current flowing through the memory cell is sensed for performing the data reading.

In the memory cell structure disclosed in the article 3, capacitive coupling between the body region and the control electrode of the data storage transistor is utilized for performing the data writing.

In the structure disclosed in the article 4 (K. Arimoto, et al., "A Configurable Enhanced $T^2RAM$ Macro for System-Level Power Management Unified Memory", Proc. VLSI Symp.), the access transistor and the data storage transistor for one memory cell. The data read operation is substantially the same as that disclosed in the article 3, but the data write operation utilizes a GIDL (Gate Induced Drain Leakage) current in addition to the capacitive coupling between the gate and body regions.

In the article 4, this GIDL current is utilized to increase the potential of the storage node nearly to the power supply voltage level.

In the structure disclosed in the article 4, a transistor having a control gate directly connected to a body region is used as a sense amplifier. By directly connecting the gate to the body region, it is intended to use the body effect to do a high-speed sensing of potential changes of a control electrode (bit line) of a sense transistor. Thus, the transistors each having the body region and the gate electrode mutually connected are cross-coupled to implement the sense amplifier. By using the cross-coupled sense amplifier, the sense amplifier is arranged for each bit line pair so that it may be used for both the writing and reading.

As the miniaturization of manufacturing process is further advanced, elements are miniaturized according to a scaling rule, and a power supply voltage is lowered. In a DRAM cell, data is read by sensing a difference (read voltage) between a bit line voltage and a reference voltage. The read voltage depends on a capacitance ratio between a bit line and a memory cell capacitor. For obtaining a sufficient read voltage, a capacitance value of the memory cell capacitor must be determined according to the bit line capacitance.

In the DRAM cell, therefore, the size of the transistor can be reduced according to the scaling rule, but the scaling of the capacitor is impossible. Therefore, a further complicated DRAM process is required for scaling the memory cell in the large-capacity, dual-port RAM of the DRAM cell type disclosed in the articles 1 and 2. For example, it is necessary to form a capacitor of a three-dimensional structure or to form a small roughness on a surface of a capacitor electrode. This results in a problem of further increase in process cost.

In the DRAM-cell-type, dual-port RAM cell, destructive read is performed, and thus data reading destroys storage data of the memory cell. Therefore, when the access is being performed to a memory cell via one port, the access via the one port must be kept until restoring of the data to this memory cell is completed. During this operation, it is necessary to inhibit the access to the same memory cell via the other access port. When the memory cell at the same address is simultaneously access via the two ports, for example, the stored charges in the memory cell capacitor of the DRAM cell disperse to the two ports, so that a read voltage lowers, and a read failure may occur. For preventing this, it is necessary to perform address arbitration for inhibiting the simultaneous access to the word line at the same address for the multiple ports.

Therefore, the access to the same address from the multiple ports is restricted, and efficient access cannot be performed. For avoiding such an address conflict, an external processor or an external logic is kept in a wait state, which lowers the processing efficiency.

In the memories disclosed in the articles 3 and 4, the memory cell is formed of the transistors connected in series so that the scaling of the memory cell size can follow the miniaturization in the manufacturing process. In these articles 3 and 4, consideration is given only to a single-port structure, and no consideration is given to multi-port structures such as a dual-port structure.

Particularly, in the memories (TTRAM; Twin-Transistor RAM) disclosed in the articles 3 and 4, a source node of the transistor for storage in the memory cell is fixed, e.g., to a power supply voltage level. The data is read by sensing the current flowing through a series connection of the storage transistor and the access transistor. Therefore, for arranging the access transistors for different ports relative to the transistor for the data storage, it is necessary to devise the arrangement of the transistors in the memory cell, so that read currents for the respective ports may be equal in magnitude to each other.

Particularly, in the memory cell layout disclosed in the article 3, an active region of the access transistor is arranged parallel to and overlaps in a planar layout with the bit line, and it is difficult in such layout to achieve the two-port structure. Thus, the transistor for data storage and the transistor for access arranged on one column are aligned to each other in a column direction so that it is difficult to arranged the access transistor having two ports symmetrically with respect to the transistor for data storage.

SUMMARY OF THE INVENTION

An object of the invention is to provide a dual-port RAM having memory cells of which scalability can follow miniaturization in a manufacturing process.

Another object of the invention is to provide a dual-port RAM which significantly alleviate restrictions imposed on access to each port.

In summary, the invention achieves a dual-port RAM through the use of a Twin-Transistor RAM (TTRAM) cell as a base with a structure of its storage transistor changed into a structure suitable for a two-port operation.

According to an embodiment of the invention, a semiconductor memory device has a plurality of memory cells, arranged in rows and columns, each formed on an insulating film. Each of the memory cells includes a first transistor storing information, a second transistor connected in series to the first transistor and a third transistor connected in series to the first transistor. First and second word lines are arranged corresponding to each of the memory cell rows. The first word line is connected to control electrodes of the second transistors of the memory cells in the corresponding row. Each of the second word lines is connected to control electrodes of the third transistors of the memory cells in the corresponding row. The second and third transistors are connected to conduction nodes located on the same side opposed to a conduction node receiving a fixed voltage of the first transistor.

Further, a plurality of charge lines are arranged corresponding to the memory cell rows or columns. Each charge line is connected to the control electrodes of the first transistors of the memory cells in the corresponding row. First and second bit lines are arranged corresponding to each of the memory cell columns. The first bit line is connected to the second transistors of the memory cells in the corresponding column. The second bit line is connected to the third transistors of the memory cells in the corresponding column.

In another embodiment, charges are transferred to a body region of a memory cell storage transistor via an access transistor, or a voltage on the body region is received by and read onto a read gate. In still another embodiment, a transistor for reading is also used as a storage transistor.

In the semiconductor memory device according to the invention, the dual-port RAM is formed using the TTRAM cell as a base. Therefore, a discrete capacitor element is not used for data storage, so that the scaling of the memory cell can follow the miniaturization in the manufacturing process.

A time for restoring charges into the memory cell capacitor is not required, and fast access is achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 schematically shows a sectional structure taken along line L26-L26 in FIG. 25.

FIG. 27 schematically shows a sectional structure taken along line L27-L27 in FIG. 25.

FIG. 42 schematically shows a layout of impurity regions and gate electrodes of a memory cell shown in FIG. 39.

DESCRIPTION OF THE PREFERRED EMBODIMENTS

Element Structure Forming Basis of the Invention

Figure 1:
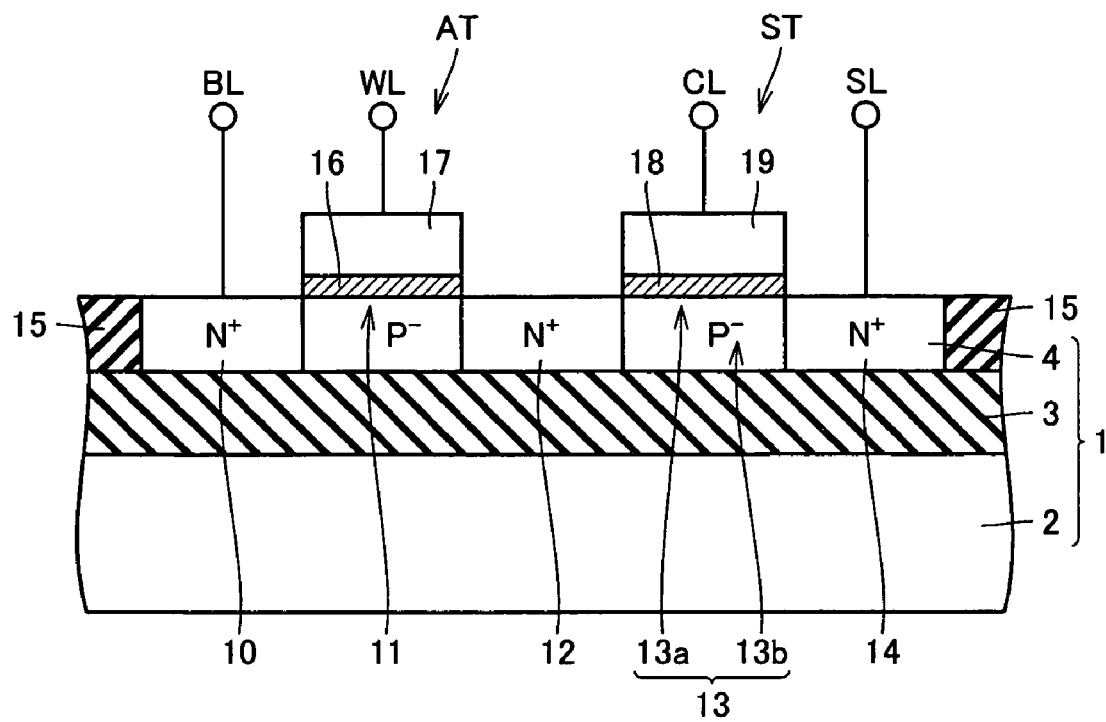
FIG. 1 schematically shows a sectional structure of a TTRAM cell serving as a base of the invention.

FIG. 1 schematically shows a sectional structure of a single-port TTRAM cell that serves as the base of the invention. In FIG. 1, a TTRAM cell is formed on a SOI substrate 1. SOI substrate 1 includes a silicon substrate 2, a buried insulating layer 3 formed on silicon substrate 2 and a silicon layer (active layer) 4 formed on buried insulating layer 3.

Silicon layer 4 includes N-type impurity regions 10, 12 and 14, a P-type impurity region 11 formed between N-type impurity regions 10 and 12, and a P-type impurity region 13 formed between N-type impurity regions 12 and 14. One TTRAM cell is formed by silicon layer 4.

A full-trench isolation region 15 substantially of a shallow trench isolation (STI) structure isolates the adjacent memory cells from each other. A gate insulating film 16 and a gate electrode 17 are successively stacked on P-type impurity region 11. Gate electrode 17 is connected to a word line WL. A gate insulating film 18 and a gate electrode 19 are successively stacked in this order on P-type impurity region 13. Gate electrode 19 is coupled to a charge line CL.

Impurity regions 10-12, gate insulating film 16 and gate electrode 17 form an access transistor AT. Likewise, impurity regions 12-14, gate insulating film 18 and gate electrode 19 form a charge storage transistor ST storing information.

Charge storage transistor ST has a body region formed of P-type impurity region 13. P-type impurity region 13 includes a channel formation region 13*a* in which a channel is formed, and a charge accumulation node 13*b* for storing charges. Buried insulating layer 3 is formed under impurity region 13, and is in the floating state. This charge storage transistor ST for storing the charges (which will be simply referred to as the "storage transistor" hereinafter) is formed of an SOI transistor, and its floating body (a body region in the floating state) is used for storing the charges.

Figure 2:
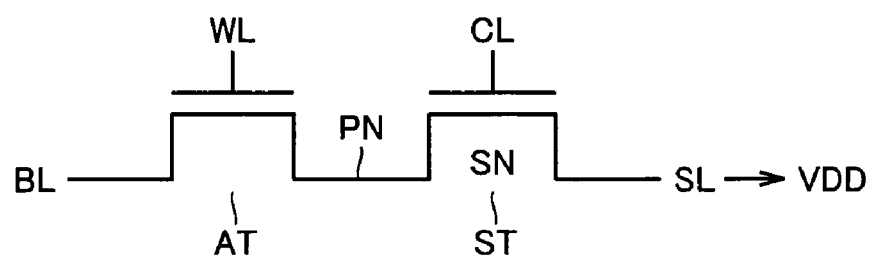
FIG. 2 shows an electrically equivalent circuit of the TTRAM cell shown in FIG. 1.

FIG. 2 shows an electrically equivalent circuit of a TTRAM cell shown in FIG. 1. As shown in FIG. 2, access transistor AT and charge storage transistor ST of the TTRAM cell are connected between a bit line BL and a source line SL. A charge accumulation node 13*b* of the floating body of charge storage transistor ST is used as a storage node SN storing information. A potential of a node (precharge node) PN between transistors AT and ST is adjusted so that the charges are stored through selective capacitive coupling between charge line CL to storage node SN and charge node PN.

When charge storage transistor ST stores the holes in storage node SN (charge accumulation node 13*b*), its threshold voltage becomes low. Conversely, when storage node SN does not store the holes, the threshold voltage of charge storage transistor ST becomes high. According to the high or low state of the threshold voltage, data "0" or "1" is stored. In the data read operation, a current flows from source line SL to bit line BL, and the current flowing through the bit line is sensed.

Figure 3:
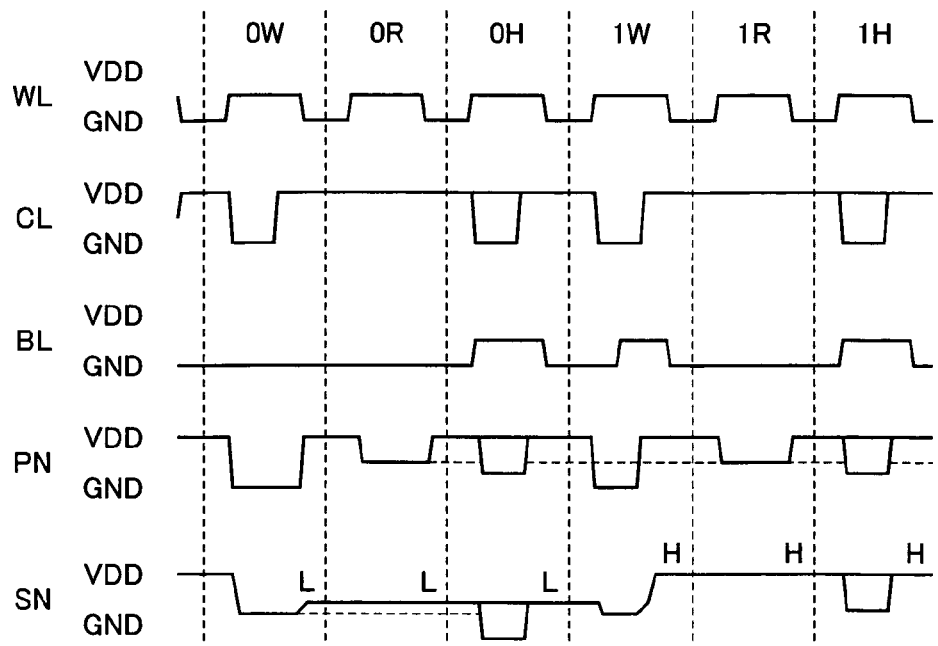
FIG. 3 is a signal wafer diagram representing data write/read operations of the TTRAM shown in FIGS. 1 and 2.

FIG. 3 is a signal timing diagram representing operations of writing and reading the data of the TTRAM shown in FIGS. 1 and 2. Referring to FIG. 3, the data writing operation and data reading operation of the TTRAM cell shown in FIGS. 1 and 2 will be described in sequence. In the operations, source line SL is constantly supplied with a power supply voltage VDD.

(1) Operation of Writing Data "0" (0 W)

In precharge and standby states, bit line BL is kept at a ground voltage level (GND). In this state, word line WL is raised in voltage from a ground voltage GND to a high level of an intermediate voltage (VDD/2). Concurrently, charge line CL is lowered from an H level (logical high level) of power supply voltage VDD to the level of ground voltage GND.

In this state, access transistor AT turns conductive to transmit the ground voltage on bit line BL to precharge node PN via access transistor AT, and precharge node PN, which is at the H level during standby, lowers from the level of power supply voltage VDD to the ground voltage level.

According to the voltage drop of charge line CL, the voltage level of the storage node of storage transistor ST is lowered from the H level to the L level (logical low level) through the capacitive coupling between the gate and the body region (assuming that data "1" is written into storage node SN). Accordingly, a state in which no hole is accumulated on storage node SN is formed (i.e., data "0" is stored).

Then, charge line CL is raised from the L level to the H level while keeping bit line BL at the L level according to the write data. In this operation, word line WL is at the high level of the intermediate voltage, and bit line BL is at the L level. Access transistor AT is in an on state, and precharge node PN holds the L level. Therefore, when the voltage on charge line CL rises and a channel is formed in channel formation region 13*a* in the body region of storage transistor ST, the channel functions as a shield layer. Thereby, even when the voltage on charge accumulation node 13*b* (storage node SN) rises slightly, the storage node is kept at this slightly raised voltage level. Thus, even when the holes supplied from source line SL flow into precharge node PN (impurity region 12) via the channel formed in the charge storage transistor, access transistor AT is on or in the on state, and the holes are discharged onto bit line BL at the ground voltage level. Therefore, storage node SN maintains the state where the hole is not stored, and data "0" is stored.

Thereafter, word line WL is lowered to the ground voltage level and access transistor AT is turned off. At this time, charge line CL is at the H level, and the holes flowing from source line SL raise the voltage level of precharge node PN to the level of power supply voltage VDD.

(2) Operation of Reading Data "0" (0R)

Bit line BL is at the L level. Word line WL is driven to the high level to turn on access transistor AT. In this state, charge line CL is kept at the H level. The threshold voltage of storage transistor ST is high because holes are not accumulated on storage node SN. Therefore, the current flowing from source line SL to bit line BL through storage transistor ST and access transistor AT is small in amount.

When access transistor AT turns conductive, the voltage level of precharge node PN slightly lowers due to the coupling with bit line BL. An amount of this lowering depends on the threshold voltage of access transistor AT and the word line voltage, and this lowering is suppressed by supply of holes from source line SL.

When the read operation completes, word line WL is driven to the ground voltage level, and access transistor AT is set to the off state. Thereby, the holes flow from source line SL into precharge node PN to restore the voltage level of precharge node PN to the H level.

(3) Operation of Holding Data "0" (0H)

In the data holding operation, bit line BL is driven from the L level to the high level of the intermediate voltage. When word line WL is driven to the high level of the intermediate voltage in parallel with the voltage rising of bit line BL, no voltage difference occurs between word line WL and bit line BL. Therefore, access transistor AT is off (because the voltage difference between word and bit lines WL and BL is equal to or smaller than the threshold of access transistor AT). At this time, precharge node PN is at the level not lower than the voltage on bit line BL.

As shown in FIG. 3, when charge line CL lowers to the L level at this time, the voltage levels of precharge and storage nodes PN and SN are lowered through gate coupling. However, by driving charge line CL to the H level again, the voltage levels of precharge and storage nodes PN and SN return to the original voltage levels.

This operation of holding the data "0" means that even the memory cell in the selected row and unselected column reliably holds the data "0". The unselected bit line is set to the high level of the intermediate voltage depending on the change in word line voltage.

(4) Operation of Writing Data "1" (1W)

In this data write operation, bit line BL is precharged to the ground voltage level. Subsequently, word line WL is driven to the high level and concurrently, charge line CL is driven to the L level. Thereby, the voltage level of precharge node PN lowers to the L level as a result of the outflow of the holes to bit line BL. Also, the voltage level of storage node SN (charge accumulation node 13b) lowers due to the gate coupling with the charge line.

Then, bit line BL is driven to the high level of the intermediate voltage level. Thereby, the potentials of word and bit lines WL and BL become equal to each other, and access transistor AT turns non-conductive. Accordingly, precharge node PN (impurity region 12) attains a floating state. In this state, the voltage level of charge line CL is raised. The voltage level of storage node SN or the voltage level of the body region of charge storage transistor ST is at the ground voltage level, and the threshold voltage thereof is high. Therefore, even when the voltage level of charge line CL rises, a channel is hardly formed in charge storage transistor ST, and a shield layer against the capacitive coupling is not present, so that a so-called "channel block" is not caused.

According to the rising of the voltage level of charge line CL, through the gate coupling, the voltage level of storage node SN is raised. Accordingly, the holes supplied from source line SL to storage node SN are not discharged to bit line BL, but are stored in storage node SN. Thus, the memory cell is set to a state of storing data "1". At this time, precharge node PN is in the floating state, and rises from the L level to the H level in parallel with the rising of the voltage level of storage node SN according to the rising of the voltage level of charge line CL.

(5) Operation of Reading Data "1" (1R)

In the data read operation, bit line BL is set to the L level, and word line WL is set to the high level. Accordingly, access transistor AT turns conductive. Charge line CL is at the H level, and storage node SN stores the holes so that the threshold voltage of storage transistor ST is low. Therefore, according to charge line CL, a channel is formed in channel formation region 13a shown in FIG. 1, and a large amount of current flows from source line SL to bit line BL through storage transistor ST and access transistor AT. The amount of the current flowing through bit line BL is suppressed and kept at a relatively small value because word line WL is at the voltage level of the intermediate voltage, and the flow of a large current is prevented. By detecting the current, the data "1" can be read.

(6) Operation of Holding Data "1" (1H)

In this holding operation, bit line BL is raised from the L level to the high level. Concurrently, word line WL is driven to the high level. In this state, access transistor AT is off or in an off state. Therefore, a current does not flow from source line SL to bit line BL, and the data "1" is held. Even when charge line CL is driven to the ground voltage level and the voltage levels of precharge and storage nodes PN and SN lower through the capacitive coupling, precharge and storage nodes PN and SN will return to the original voltage levels through the capacitive coupling when the voltage of charge line CL rises.

Therefore, the memory cell in the selected row and an unselected column can reliably hold its storage data by holding unselected bit line BL at a high level during the driving of the word line.

In the TTRAM cell, the charges are accumulated in the floating body region. A sufficiently long time is required until the accumulated charges disappear through leakage, and it can be considered that the refresh-free is substantially achieved (as compared with a normal DRAM cell). However, the refresh operation can be performed. By reading the storage data, and changing the potential of bit line BL according to the read out data, the rewriting of the storage data is performed to execute the refresh.

As is clear from the timing chart of FIG. 3, the data read operation does not cause destruction of the storage data of the TTRAM cell, and does not require a so-called restore period as is required in a DRAM cell. Thus, the storage data is not destroyed even when word line WL is driven to the unselected state immediately after the completion of the sensing operation. The present invention takes advantage of this feature of the TTRAM cell, and reduces the access time for each port in the dual-port structure.

First Embodiment

Figure 4:
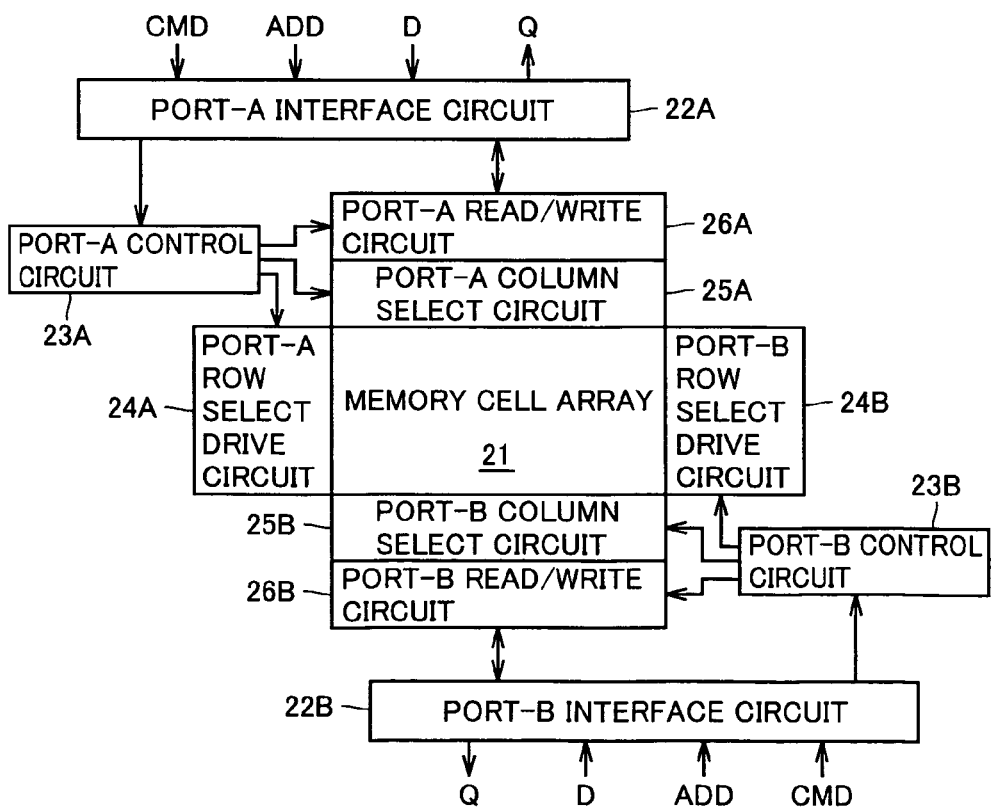
FIG. 4 schematically shows a whole configuration of a semiconductor memory device according to a first embodiment of the invention.

FIG. 4 schematically shows a whole configuration of a semiconductor memory device (which will be referred to as a "dual-port RAM" hereinafter) according to a first embodiment of the invention. In FIG. 4, dual-port RAM includes a memory cell array 21 having memory cells (not shown) arranged in rows and columns. In memory cell array 21, there are provided dual-port cells each allowing access from two ports A and B as will be described later. The dual-port cell is formed with the TTRAM cell being a base.

The dual-port RAM further includes port-A and port-B interface circuits 22A and 22B for accessing from the ports A and B, respectively. The "port" indicates a portion through which access of data is performed. Therefore, when reference is made to the whole memory, the "port" indicates the input/output portion for signal/data coupled to a data bus. When the wording "port" is used in connection with the memory cell, it indicates a portion through which write/read of data is performed, i.e., the bit line, access transistor and the word line. Interface circuits 22A and 22B are externally supplied with a command CMD, an address signal ADD and data D, and externally output data Q.

The dual-port RAM further includes a port-A control circuit 23A that performs control required for accessing via port A according to a control signal produced according to command CMD supplied from port-A interface circuit 22A, and a port-B control circuit 23A that performs control required for accessing via port B according to a control signal produced according to command CMD supplied from port-A control circuit 23B.

Port-A and port-B control circuits 23A and 23B control the operations required for accessing via ports A and B, respectively. An arbitration circuit is employed for controlling the access in the case when the writing is to be performed on the same memory cell from different ports, or when the reading and writing are to be performed on the same memory cell. However, FIG. 4 does not show such access arbitration circuit. This access arbitration circuit is merely required to compare addresses for access via respective ports A and B with each other, and to perform the arbitration according to predetermined rules when the compared addresses match with each other and the access includes writing. For example, the access from the port that issued an earlier access request is allowed, and the access of the other port will be allowed after the earlier access from the access-allowed port is completed.

The dual-port RAM further includes a port-A row select drive circuit 24A that drives a memory cell row in memory cell array 21 to the selected state under the control of port-A control circuit 23A, and a port-B row select drive circuit 24B that drives a selected row in memory cell array 21 to the selected state under the control of port-B control circuit 23B. Port-A row select drive circuit 24A includes an address decode circuit and a word line drive circuit. The word line drive circuit includes word line drivers, arranged corresponding to the memory cell rows, for driving the corresponding rows to the selected state according to an address decoded signal. Likewise, port-B row select drive circuit 24B includes a decode circuit for decoding the row address signal, and a word line drive circuit for driving a selected row in memory cell array 21 to the selected state according to the decoded address signal. The word line drive circuit includes word line drivers arranged corresponding to the respective memory cell rows in memory cell array 21.

The dual-port RAM further includes a port-A column select circuit 25A for selecting a column in memory cell array 21 under the control of port-A control circuit 23A, and a port-A read/write circuit 26A for performing read/write of the data on the memory cell column selected by port-A column select circuit 25A under the control of port-A control circuit 23A.

The port-A column select circuit 25A includes a column address decode circuit for decoding the column address signal, and a column select gate for selecting a corresponding column in memory cell array 21 according to a column select signal applied from the column address decode circuit. Port-A read/write circuit 26A includes a sense amplifier circuit and a write drive circuit, and can perform sensing (data reading) of a current supplied from the selected memory cell and writing (setting of the bit line voltage) of data into the selected memory cell when the access is performed via port A.

Likewise, a port-B column select circuit 25B and a port-B read/write circuit 26b are arranged for port B. The operation timing of these circuits 25B and 26B is defined under the control of port-B control circuit 23B. Port-B column select circuit 25B and port-B read/write circuit 26B have substantially the same configurations as port-A column select circuit 25A and port-A read/write circuit 26A. Read/write circuits 26A and 26B may employ the components and structures disclosed in the article 3 previously described. In memory cell array 21, cross-coupled sense amplifiers may be arranged corresponding to the respective bit line pairs (see article 4).

In the configuration shown in FIG. 4, the row and the column select circuits for port A and those for port B are arranged oppositely with respect to memory cell array 21. However, the row select drive circuits for ports A and B may be arranged on the same side with respect to memory cell array 21, and the column select circuits for ports A and B may be arranged on the same side with respect to memory cell array 21. FIG. 4 does not show the circuit for driving charge line CL. The charge line drive circuit performs one-shot driving of the charge line corresponding to the addressed row to the selected state (L level) when the access is performed via port A or B.

Figure 5:
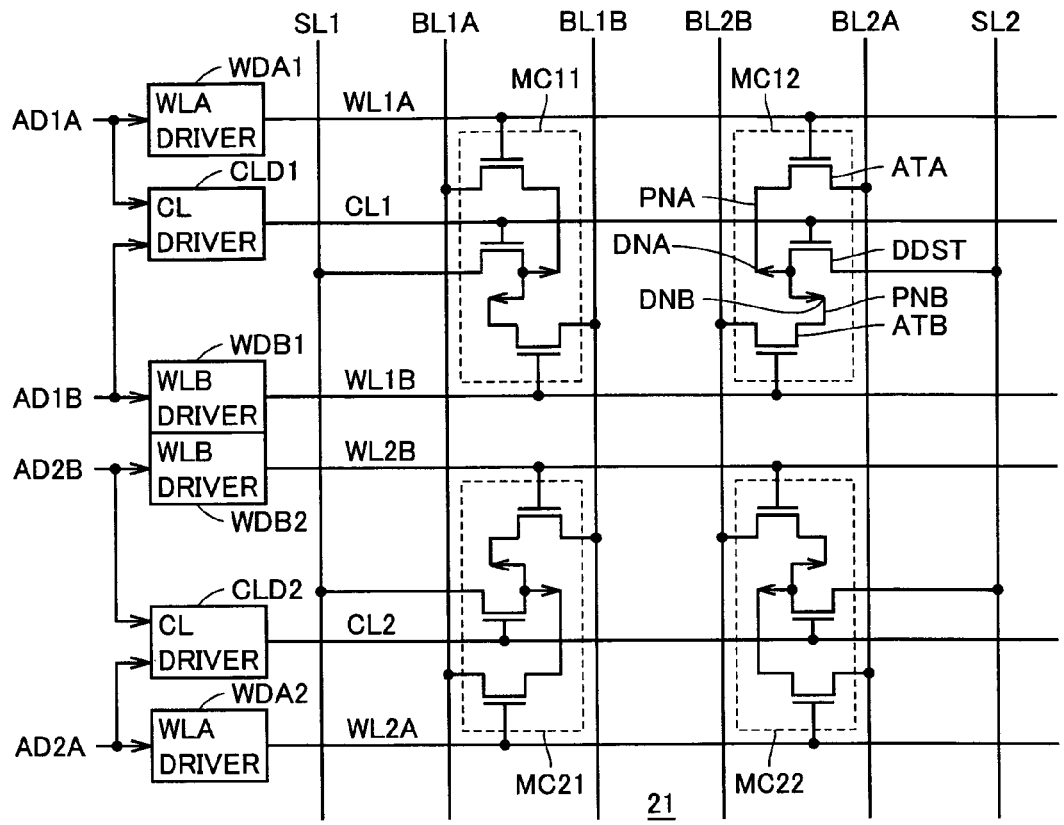
FIG. 5 schematically shows a configuration of a memory cell array, charge lines and word line drivers.

FIG. 5 schematically shows a configuration of memory cell array 21 shown in FIG. 4. FIG. 5 representatively shows memory cells MC11, MC12, MC21 and MC22 arranged in two rows and two columns. Port-A and port-B word lines WL1A and WL1B as well as a charge line CL1 are arranged for memory cells MC11 and MC12 aligned in the row direction. Port-A and port-B word lines WL2B and WL2A as well as a charge line CL2 are arranged for memory cells MC21 and MC22 aligned in the row direction.

Port-A and port-B bit lines BL1A and BL1B are arranged for memory cells MC11 and MC21 aligned in the column direction. Port-A and port-B bit lines BL2B and BL2A are arranged for memory cells MC12 and MC22 aligned in the column direction. Source lines SL1 and SL2 are arranged for the respective memory cell columns. Source lines SL1 and SL2 are commonly coupled to the power supply node, and normally supply the power supply voltage. FIG. 5 does not show a global source line coupled to these source lines SL1 and SL2.

Since memory cells MC11, MC12, MC21 and MC22 have the same configuration, reference characters indicating components thereof are assigned only to those of memory cell MC12 in FIG. 5. Memory cell MC12 includes port-A and port-B access transistors ATA and ATB as well as a double-drain storage transistor DDST shared between these access transistors ATA and ATB.

Port-A access transistor ATA is made conductive to couple a precharge node PNA to port-A bit line BL2A when port-A word line WL1A is selected. Port-B access transistor ATB turns conductive to couple a precharge node PNB to port-B bit line BL2B when port-B word line WL1B is selected.

Double-drain storage transistor DDST includes two drain nodes DNA and DNB, which are coupled to precharge nodes PNA and PNB, respectively. Double-drain storage transistor DDST accumulates the charges (holes) in the body region according to change in voltage on charge line CL1. The source of double-drain storage transistor DDST is connected to source line SL2, and normally receives the power supply voltage.

Memory cells MC (generically indicating MC11, MC12, MC21 and/or MC22) are arranged mirror-symmetrically in the row and column directions. In the memory cell, access transistors ATA and ATB as well as double-drain storage transistor DDST are each formed of an SOI transistor. Therefore, when the access is made from one port, the operation is performed similarly to the access operation of a single-port TTRAM as already described with reference to FIGS. 2 and 3 (see articles 3 and 4). Upon confliction of the access from the two ports, the access arbitration circuit (not shown) performs the arbitration as already described, and the access from one port is performed.

Figure 6A:
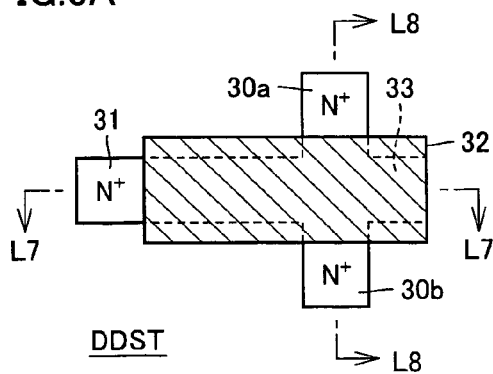
FIG. 6A shows a planar layout of a storage transistor.

FIG. 6A schematically shows a planar layout of double-drain storage transistor DDST shown in FIG. 5. Double-drain storage transistor DDST is formed of a double-drain SOI transistor. This double-drain SOI transistor (double-drain storage transistor) DDST includes N-type impurity regions 30a and 30b opposed to each other relative to gate electrode 32 as well as an N-type impurity region 31 arranged on a short side of gate electrode 32. These N-type impurity regions 30a, 30b and 31 are formed in a self-aligned manner with respect to gate electrode 32. A P-type body region 33 is formed under gate electrode 32. P-type body region 33 are arranged to concatenate N-type impurity regions 30a, 30b and 31.

Figure 6B:
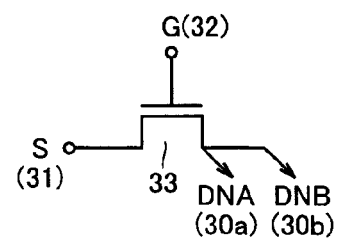
FIG. 6B shows an electrically equivalent circuit of the storage transistor.

FIG. 6B shows an electrically equivalent circuit of the double-drain SOI transistor shown in FIG. 6A. In FIG. 6B, the double-drain SOI transistor (double-drain storage transistor DDST) includes a gate electrode G, a source node S and two drain nodes DNA and DNB.

Gate electrode G corresponds to gate electrode 32 shown in FIG. 6A, and source node S corresponds to N-type impurity region 31 shown information 6A. Drain nodes DNA and DNB correspond, for example, to impurity regions 30a and 30b shown in FIG. 5A, respectively. The correspondence between drain nodes DNA and DNB and impurity regions 30b and 30a may be reversed.

Under the gate electrode, a body region 33 is formed, and the charge accumulation node is formed. As shown in FIG. 6A, drain nodes 30A and 30B of double-drain storage transistor DDST are opposed to each other with respect to gate electrode 32. N-type impurity region 31 is connected to source line SL (SL1 or SL2). Impurity regions 30A and 30B are coupled to corresponding to access transistors ATA and ATB via precharge nodes PNA and PNB shown in FIG. 5, respectively. Therefore, distances from the source node (impurity region 31) of double-drain storage transistor DDST to first conduction nodes (i.e., nodes connected to the precharge node) of access transistors ATA and ATB can be equal to each other, and thus the interconnection resistances and capacitances can be equal to each other. Accordingly, the write and read of data can be accurately performed when ports A and B are accessed.

Figure 7:
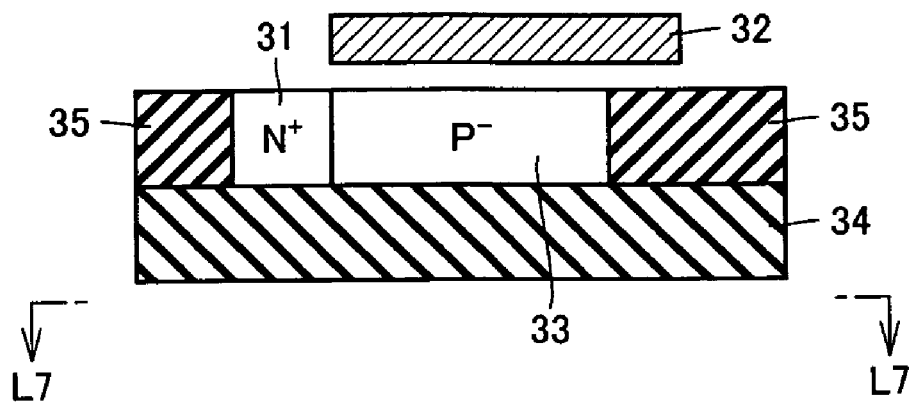
FIG. 7 schematically shows a sectional structure taken along line L7-L7 in FIG. 6A.

FIG. 7 schematically shows a sectional structure taken along line L7-L7 in FIG. 6A. In FIG. 7, N-type impurity region 31 and P-type body region 33 are formed on a buried insulating film 34. An cell isolation layer 35 is arranged adjacently to N-type impurity region 31, and a cell isolation region 35 is arranged adjacent to body region 33. Cell isolation region 35 has, as an example, a shallow trench isolation structure, and completely isolates the cell from an adjacent cell (using the full trench isolation structure).

Gate electrode 32 is formed on body region 33 with a gate insulating film (not shown) arranged in between. When gate electrode 32 is kept at the H level, a channel is selectively formed at the surface (channel formation region) of body region 33, depending on whether the charge accumulation region (not shown) of body region 33 has accumulates the holes or not.

Figure 8:
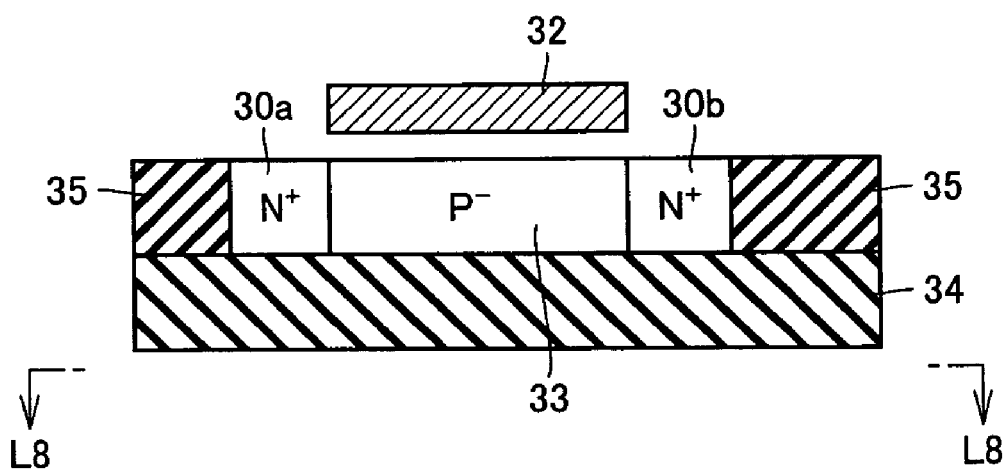
FIG. 8 schematically shows a sectional structure taken along line L8-L8 in FIG. 6A.

FIG. 8 schematically shows a sectional structure taken along line L8-L8 in FIG. 6A. In the structure shown in FIG. 8, N-type impurity regions 30a and 30b are formed on the opposite sides of body region 33, respectively. Cell isolation regions 35 are arranged on the outer sides of N-type impurity regions 30a and 30b. Gate electrode 32 is formed on body region 33 with the gate insulating film (not shown) arranged in between. Therefore, when a voltage is applied on gate electrode 32 and a channel is formed at the surface of body region 33, N-type impurity regions 30a and 30b are electrically coupled together to attain the same potential. In standby, the current supplied from source line SL maintains these impurity regions 30a and 30b at the power supply voltage level.

As shown in FIGS. 6A to 8, double-drain storage transistor DDST is formed of the SOI transistor, similarly to the storage transistor of the TTRAM cell. Therefore, body region 33 can accumulate charges (holes), and threshold voltage of this double-drain storage transistor is set according to data to be store, so that the data can be stored.

Figure 9:
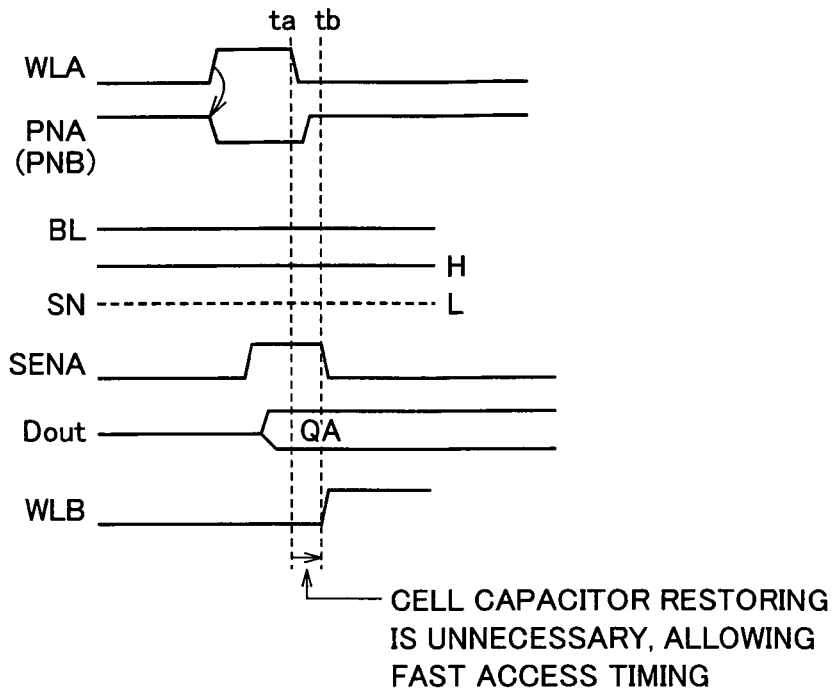
FIG. 9 represents main signal wave forms appearing in an alternate-port access operation in the first embodiment of the invention.

FIG. 9 is a signal waveform diagram representing operations performed when one memory cell is accessed from ports A and B. In the data read operation, bit line BL keeps the ground voltage level. In this state, port-A word line WLA is driven to the selected state. Accordingly, the voltage level of precharge node PN lowers. The voltage on storage node SN is at the H or L level, and does not change.

The current flowing through bit line BL is sensed by the read/write circuit shown in FIG. 4. In this operation, when a sense amplifier activating signal SENA becomes active and internal read data Dout is established as internal data QA, word line WLA can be driven to the unselected state. Thus, the memory cell does not utilize a capacitor, so that it is not necessary to perform a restore operation of rewriting the charges that flowed from the capacitor in the capacitor. Therefore, word line WLA can be driven to the unselected state immediately after the data reading.

Precharge node PNA returns to the original voltage level. In the data reading, precharge nodes PNA and PNB are connected to bit line BL at the ground voltage level, so that the voltage levels of precharge nodes PNA and PNB lowers. Therefore, port-B word line WLB can be driven to the selected state at a time tb before precharge node PNA returns to the original voltage level. As such, even when the access to the same memory cell is to be made in parallel from ports A and B and access arbitration is performed as disclosed in the article 1 or 2, it is possible to reduce a period of time during which port B is held in an access waiting state, and fast access can be achieved.

Also, when the access is alternately made from ports A and B in an interleaved manner, the access time of each port can be reduced, and the memory system allowing fast access can be achieved.

Figure 10:
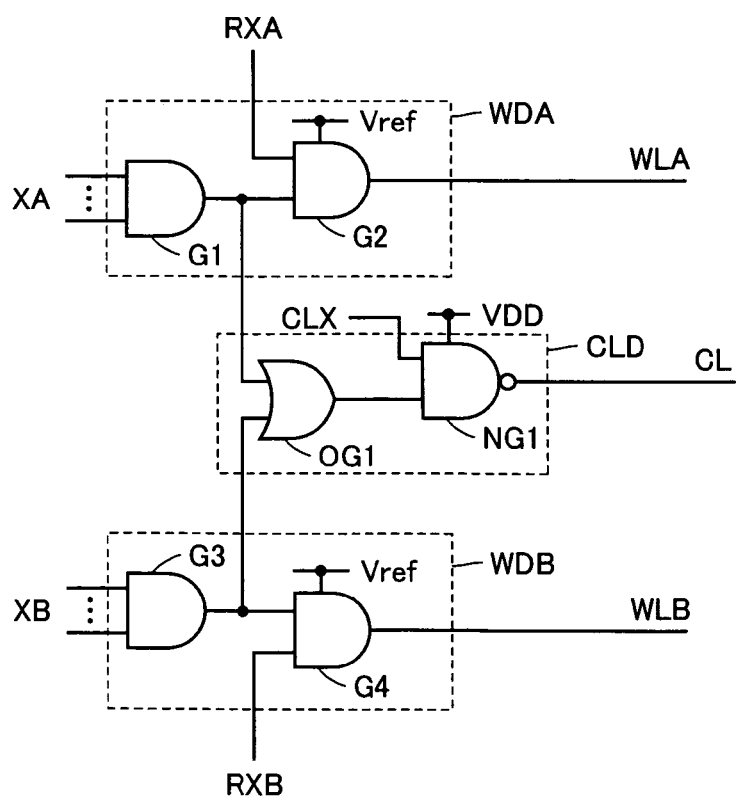
FIG. 10 shows by way of example configurations of CL, WLA and WLB drivers shown in FIG. 5.

FIG. 10 shows by way of example configurations of WLA, WLB and CL drivers shown in FIG. 5. FIG. 10 representatively shows word line drivers WDA and WDB arranged corresponding to port-A and port-B word lines WLA and WLB, respectively, as well as a charge line driver CLD arranged corresponding to charge line CL.

Word line driver WDA includes an AND decoder G1 for decoding a port-A row address signal XA, and an AND driver G2 for driving corresponding word line WLA to an intermediate voltage level of a reference voltage Vref according to an output signal of AND decoder G1 and a port-A word line activation timing signal RXA.

Word line driver WDB includes an AND decoder G3 receiving a port-B row address signal XB, and an AND driver G4 for driving corresponding word line WLB to the intermediate level of voltage Vref according to an output signal of AND decoder G3 and port-B word line activation timing signal RXB.

Charge line driver CLD includes an OR decoder OG1 receiving output signals of the AND decoders G1 and G3, and an NAND driver NG1 receiving an output signal of OR decoder OG1 and a charge line drive timing signal CLX.

AND decoders G1 and G3 outputs the signals at the H level when corresponding address signals XA and XB designate corresponding word lines WLA and WLB, respectively. Word line activation timing signals RXA and RXB becomes active to attain the H level in a row selection, and word lines WLA and WLB in the selected row are driven to the level of intermediate voltage Vref Word lines WLA and WLB in the unselected state are at the ground voltage level.

In charge line driver CLD, OR decoder OG1 outputs a signal at the H level when one of word lines WLA and WLB is selected. A charge line drive timing signal CLX is driven to the H level in changing the charge line voltage level. Therefore, charge line CL in the selected row is driven to the L level when the output signal of OR decoder OG1 is at the H level and charge line drive timing signal CLX is driven to the H level. In an unselected row, the output signal of OR decoder OG1 is at the L level, and charge line CL is kept at the H level of power supply voltage VDD.

FIG. 10 shows merely examples of the configurations of the drivers WDA, WDB and CLD, and other configurations may be employed, provided that the word lines corresponding to the addressed row are driven to the selected state (intermediate voltage level), and charge line CL is driven to the selected state when the corresponding row is selected at the time of access from ports A and B.

Figure 11:
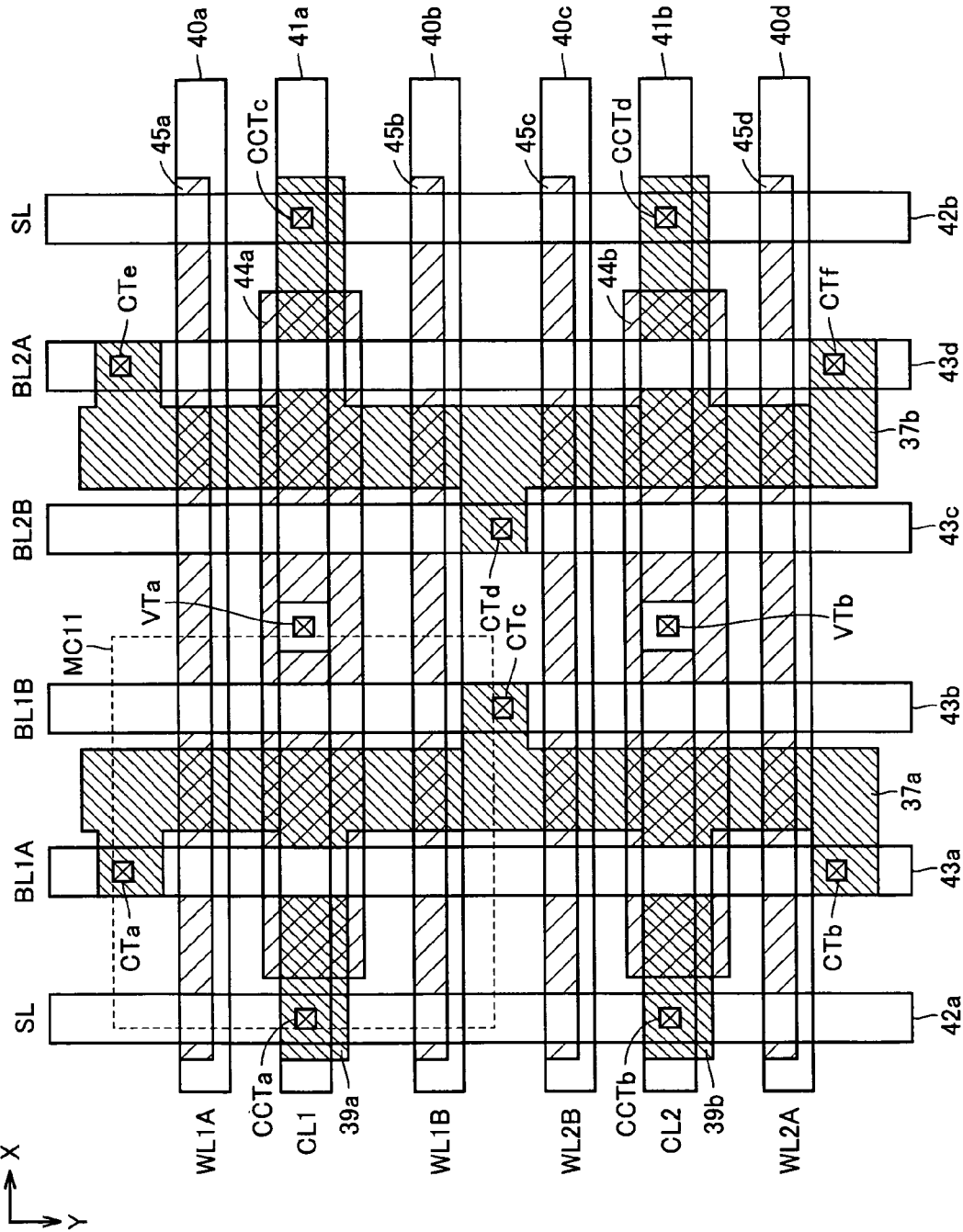
FIG. 11 schematically shows a planar layout of the memory cell array of the semiconductor memory device according to the first embodiment of the invention.

FIG. 11 schematically shows a planar layout of the memory cell array shown in FIG. 5. In FIG. 11, second metal interconnections (interconnection lines) 40a, 40b, 40c and 40d are arranged extending continuously in the X direction and corresponding to word lines WL1A, WL1B, WL2B and WL2A, respectively. Polycrystalline silicon gate electrode layers 45a, 45b, 45c and 45d are arranged extending in the X direction and alignedly to second metal interconnections 40a-40d, respectively. Electrical contacts are made in a not shown region between second metal interconnections 40a-40d and corresponding polycrystalline silicon gate interconnections 45a-45d, respectively. Thereby, a so-called word line shunt structure is implemented. Each gate interconnection forms a gate electrode of the access transistors.

Second metal interconnections 41a and 41b for forming charge lines CL1 and CL2 are arranged extending continuously in the row direction between second metal interconnections 40a and 40b and between second metal interconnections 40c and 40d, respectively. Second metal interconnections 41a and 41b correspond to charge lines CL1 and CL2, respectively.

First metal interconnections 42a and 42b are arranged extending in the Y direction. Each of first metal interconnections 42a and 42b is formed in an interconnection layer under the second metal interconnection, and forms source line SL. First metal interconnections 43a, 43b, 43c and 43d are arranged between first metal interconnections 42a and 42b, and are spaced from each other by a predetermined distance. These first metal interconnections 43a-43d form bit lines BL1A, BL1B, BL2B and BL2A, respectively.

Between first metal interconnections 43a and 43b, an active region 37a is arranged extending continuously in the Y direction. Likewise, an active region 37b is arranged extending continuously in the Y direction between first metal interconnections 43c and 43d.

Active region 37a is electrically connected to first metal interconnection 43a forming bit line BL1A via a bit line contacts CTa and CTb. In a region under bit line contacts CTa and CTb, an impurity region of the access transistor of the memory cell is formed protruding from active region 37a.

Under second metal interconnections 41a and 41b forming charge lines CL1 and CL2, respectively, active region 37a has projections 39a and 39b extending continuously in the X direction to positions under first metal interconnection 42a. Projections 39a and 39b form impurity regions, and are electrically connected to first metal interconnection 42a via source line contacts CCTa and CCTb, respectively.

Polycrystalline silicon gate interconnections 44a and 44b are formed extending in the X direction and corresponding to second metal interconnections 41a and 41b forming charge lines CL1 and CL2, respectively. Each of gate interconnections 44a and 44b extend from a region between first metal interconnections 42a and 43a to a region between first metal interconnections 43d and 42b.

In regions between first metal interconnections 43b and 43c, polycrystalline silicon gate interconnections 44a and 44b are electrically connected through vias VTa and VTb to upper second metal interconnections 41a and 41b, respectively. In the regions where vias VTa and VTb are formed, first metal interconnections are formed between polycrystalline silicon interconnections 44a and 44b and corresponding second metal interconnections 41a and 41b, respectively.

Bit line contacts CTa and CTh as well as source line contact CCTa and via VTa define boundary regions of memory cell MC11 in the X and Y directions.

Bit line contacts CTe and CTf electrically connect impurity regions forming the projections 37b of active region to second metal interconnection 43d. Active region 37b has projections formed extending in the X direction in the regions corresponding to second metal interconnections 41a and 41b, and source line contacts CCTc and CCTb electrically connect these projections to second metal interconnection 42b forming source line SL.

The planar layout of the 4-bit memory cell shown in FIG. 11 is repeated in the X direction and in the Y direction. Therefore, the bit line contact is shared between the two memory cells, and the source line contact is also shared between the memory cells adjacent to each other in the X direction.

As shown in FIG. 11, the active region is provided in a lateral-T shaped form in one memory cell region so that the double-drain storage transistors can be arranged symmetrically with respect to the port-A and port-B access transistors. Active regions 37a and 37b are not separated for each memory cell, but arranged extending continuously and linearly in the Y direction, so that the active regions can be laid out easily.

The planar layout of the memory cells is symmetrical, and each portion merely extends linearly in the X- or Y-direction so that the patterning lithography of the planar layout can be made easy.

According to the first embodiment of the invention, as described above, the dual-port RAM cell is formed based on the TTRAM cell. Therefore, the memory cell is formed of the capacitorless memory cell, so that the scaling of the memory cells can be easily made to follow the miniaturization in the process. Further, the reading from the memory cell is nondestructive reading, and it is possible to alleviate significantly the access restrictions imposed on the access ports, such as the restriction that waiting is required until completion of the data restoring. Therefore, a large-capacity dual-port RAM operating fast can be achieved.

Second Embodiment

Figure 12:
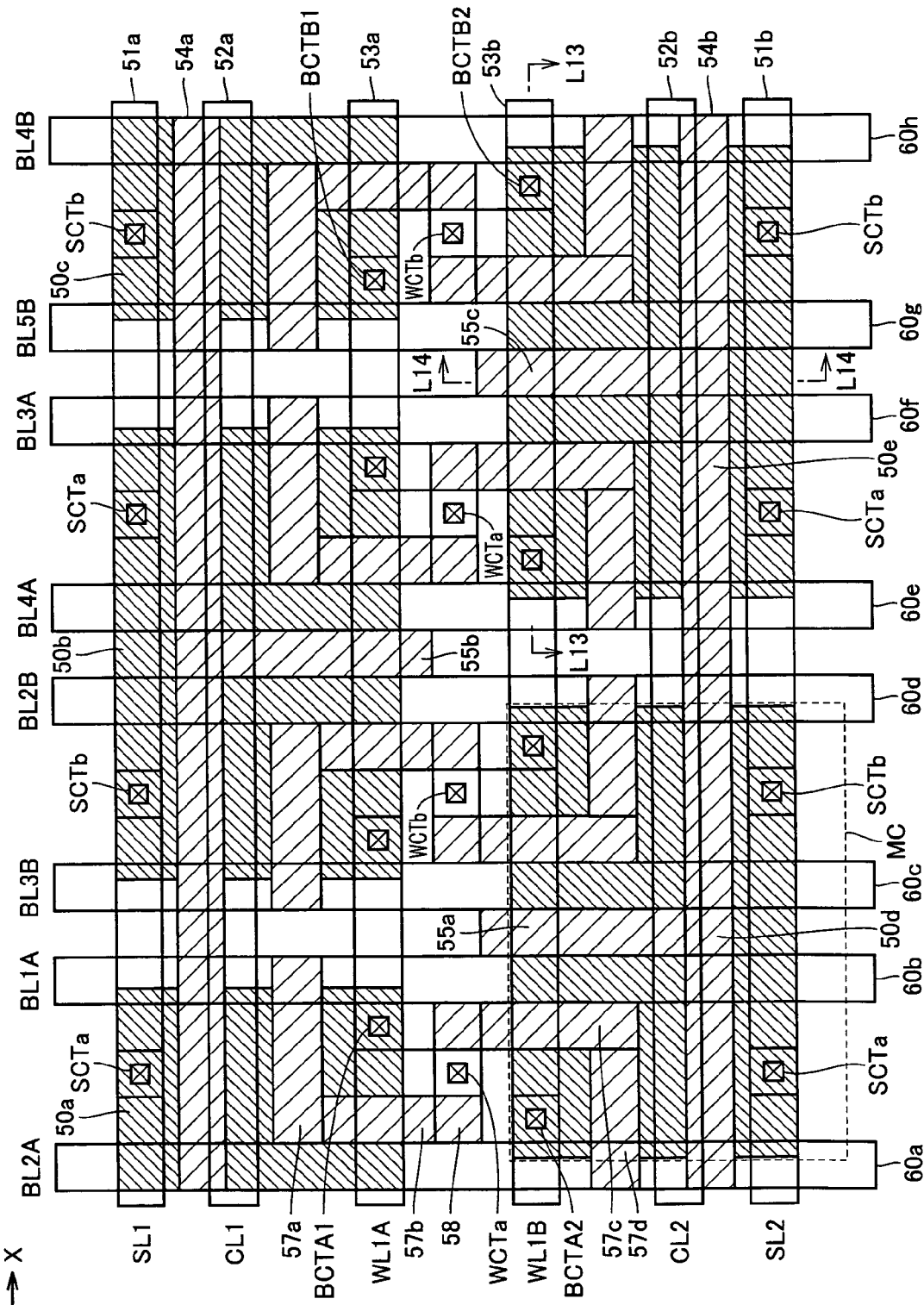
FIG. 12 schematically shows a planar layout of a memory cell array according to a second embodiment of the invention.

FIG. 12 schematically shows a planar layout of a memory cell array of a semiconductor memory device according to a second embodiment of the invention. FIG. 12 representatively shows memory cells arranged in two rows and three columns.

In FIG. 12, rectangular active regions 50a, 50b and 50c are aligned in the X direction with spaces in between. Active regions 50d and 50e are aligned in the X direction with a space in between. Active regions 50a-50c are displaced in the X direction from active regions 50d and 50e by half a column.

In the memory cell row, second metal interconnections 51a and 51b are arranged on the opposite ends in the Y direction, respectively. These second metal interconnections 51a and 51b form source lines SL1 and SL2, respectively. Source lines SL1 and SL2 have regions coupled to a global source line although not shown, and receive the power supply voltage. Second metal interconnection 51a is electrically connected through source via/contacts SCTa and SCTb to corresponding active regions 50a-50c. Source via/contacts SCTa and SCTb are arranged alternately to each other. Likewise, second metal interconnection 51b is electrically connected through source via/contacts SCTa and SCTb to corresponding active regions 50d and 50e.

In the row direction, a second metal interconnection 52a forming charge line CL is arranged adjacent to second metal interconnection 51a and extending in the X direction. Likewise, a second metal interconnection 52b forming charge line CL2 is arranged adjacent to second metal interconnection 51b and extending in the X direction.

Second metal interconnections 52a and 52b forming the charge lines have portions (not shown) that are electrically connected to polycrystalline silicon gate interconnections 54a and 54b, respectively. Polycrystalline silicon gate interconnection 54a has a leg 55b located in a portion corresponding to a center in the X direction of the corresponding active region, polycrystalline silicon gate interconnection 54b has legs 55a and 55c located in portions corresponding to centers in the X direction of corresponding active regions 50d and 50e, respectively. Legs 55a, 55b and 55c are arranged alternately in the X direction to each other according to the displacement in the Y direction of the active regions.

Second metal interconnections 53a and 53b are arranged continuously extending in the X direction between second metal interconnections 52a and 52b. Second metal interconnections 53a and 53b form parts of word lines WL1A and WL1B, respectively. Second metal interconnection 53a are electrically coupled to polycrystalline silicon gate interconnection portions 58 via word line via/contacts WCTa and WCTb at the portions between the active regions in the Y direction.

The polycrystalline silicon gate interconnection portion 58 is coupled to a gate interconnection portion 57b extending in the Y direction and to a gate interconnection portion 57a extending in the X direction over the corresponding active region. These gate interconnection portions 57a, 57b and 58 form a gate electrode of the port-A access transistor.

Via word line via/contact WCTa, second metal interconnection 53a forming word line WL1A is further connected electrically to gate interconnection portions 57c and 57d extending within active region 50d. Gate interconnection portion 57c extends in the Y direction over a part of the active region. Gate interconnection portion 57d is coupled to gate interconnection portion 57c, and is arranged extending in the X direction across active region 50d. These gate interconnection portions 57c and 57d form a gate electrode of the port-A access transistor formed in active region 50d.

Likewise, second metal interconnection 53b forming word line WL1B is coupled to the gate polycrystalline silicon interconnection portions formed in a lower layer via word line via/contact WCTb. The gate interconnection portions coupled to word line via/contact WCTb are arranged mirror-symmetrically to gate interconnection portions 57a-57d and 58 in the X direction. Legs 55a-55c coupled to the charge lines are each arranged between the gate electrode portions in the corresponding active region. In one active region, therefore, a portion (leg) of the gate electrode of the storage transistor is arranged between the L-shaped gate electrodes arranged mirror-symmetrically. Owing to such crossing arrangement of the word lines, the structure that allows parallel selection of the access transistors in the memory cells in the adjacent rows can be achieved without complicating the interconnection layout.

First metal interconnections 60a-60h are arranged extending continuously in the Y direction and being spaced from each other in the X direction. These first metal interconnections 60a-60h form bit lines BL2A, BL1A, BL3B, BL2B, BL4A, BL3A, BL5B and BL4B, respectively. In the bit line arrangement shown in FIG. 12, with two bit lines being one unit for one port, the bit line pairs for the ports A and the bit line pairs for the ports B are arranged alternately to each other.

First metal interconnection 60b forming bit line BL1A is electrically connected to active region 50a via a bit line via/contact BCTA1. First metal interconnection 60a forming bit line BL2A is electrically connected to active region 50d via a bit line via/contact BCTA2. First metal interconnection 60g forming bit line BL5B is electrically connected to active region 50c via a bit line via/contact BCTB1. First metal interconnection 60h forming bit line BL4B is electrically connected to active region 50e via a bit line via/contact BCTB2.

In one active region, therefore, bit line via/contact BCTA for the port A and bit line via/contact BCTB for the port B are arranged in the symmetrical positions with respect to leg 55 of the storage transistor located at the center in the X direction.

Active regions 50b, 50d and 50e are likewise provided with bit line via/contacts each connected to the bit line, but FIG. 12 does not show the reference characters of the bit line via/contacts for bit lines BL3B, BL2B, BL4A and BL3A for the sake of simplicity.

In the interconnection layout of the memory cells shown in FIG. 12, one memory cell MC is formed of one storage transistor and two access transistors, similarly to the first embodiment. When one word line is selected, the two access transistors for port A or port B are turned on in parallel, and the read and write of data are executed in parallel via the paired bit lines.

In the layout of the memory cells shown in FIG. 12, rectangular active regions 50 (50a-50e) are arranged in rows and columns with spaces in between. These active regions are formed on a buried insulating film, as will be described later in detail. Therefore, all the storage transistor and the access transistors forming memory cell MC have the SOI structure.

Figure 13:
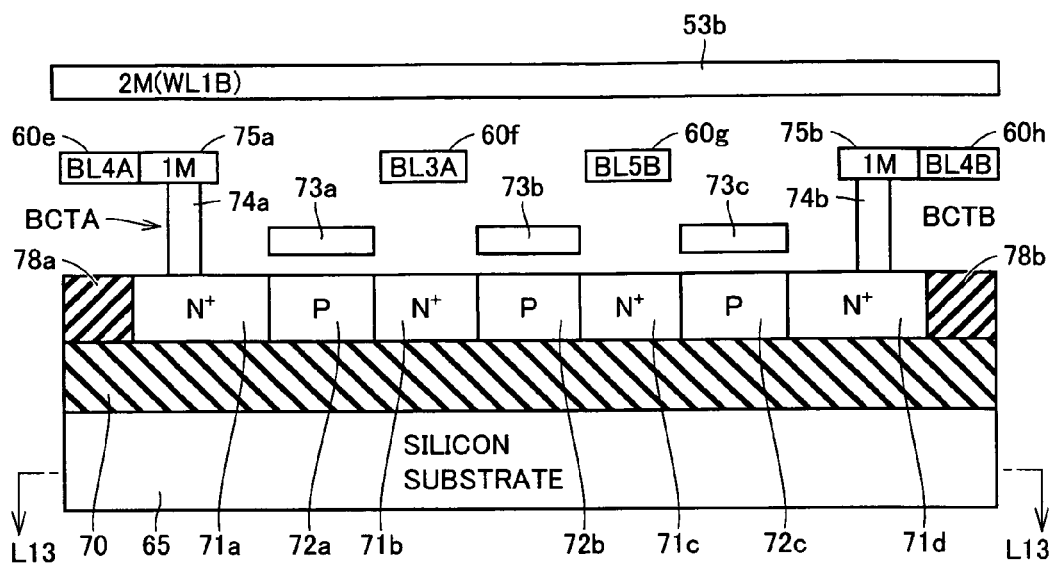
FIG. 13 schematically shows a sectional structure taken along line L13-L13 in FIG. 12.

FIG. 13 schematically shows a sectional structure taken along line L13-L13 in FIG. 12. In FIG. 13, an active region 50E is formed on a buried insulating film 70, which in turn is formed on a silicon substrate 65.

In the active region, N-type impurity regions 71a-71d are formed with spaces in between. P-type impurity regions 72a, 72*b* and 72*c* serving as a body regions are arranged alternately to these N-type impurity regions.

Gate interconnections 73*a*, 73*b* and 73*c* are arranged on P-type impurity regions 72*a*, 72*b* and 72*c* with a gate insulating film (not shown) interposed in between. Gate interconnection 73*b* at the center is the gate electrode coupled to charge line CL2, and forms the gate electrode of the storage transistor. Gate interconnections 73*a* and 73*b* form the gate electrodes of the port-A and port-B access transistors, respectively.

N-type impurity region 71*a* is electrically connected to a first metal interconnection 75*a* via bit line via/contact BCTA. Bit line via/contact BCTA includes a contact 74*a* electrically connecting intermediate first metal interconnection 75*a* to N-type impurity region 71*a*. First metal interconnection 60*e* corresponds to first metal interconnection 60*e* shown in FIG. 12, and forms bit line BL4A.

N-type impurity region 71*d* is coupled to first metal interconnection 60*h* via bit line via/contact BCTB. This bit line via/contact BCTB includes a contact 74*b* electrically connecting an intermediate, first metal interconnection layer 75*b* to N-type impurity region 71*d*. First metal interconnection 60*h* corresponds to first metal interconnection 60*h* forming bit line BL4B shown in FIG. 12.

Each of N-type impurity regions 71*b* and 71*c* is a precharge node. Therefore, one storage transistor and two access transistors are formed in the active region. This active region is isolated from adjacent active regions by cell isolation regions 78*a* and 78*b* arranged on the opposite sides thereof. Cell isolation regions 78*a* and 78*b* have, e.g., the shallow trench isolation structures, and have a depth reaching buried insulating film 70. Thereby, the full trench isolation is implemented.

First metal interconnections 60*f* and 60*g* are arranged above N-type impurity regions 71*b* and 71*c*, respectively. These first metal interconnections 60*f* and 60*g* form bit lines BL3A and BL5B, respectively, and have regions (not shown) electrically connected to N-type impurity regions 71*b* and 71*c* arranged below, respectively. In the uppermost layer, second metal interconnection 53*b* is arranged. Second metal interconnection 53*b* forms word line WL1B.

Figure 14:
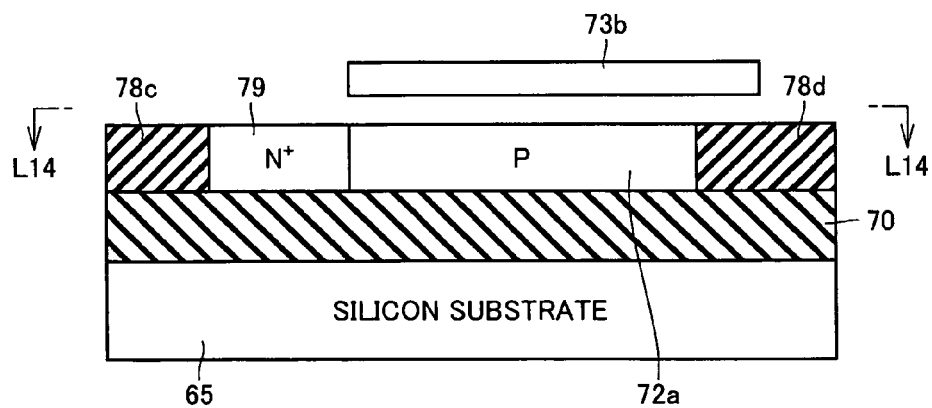
FIG. 14 schematically shows a sectional structure taken along line L14-L14 in FIG. 12.

FIG. 14 schematically shows a sectional structure taken along line L14-L14 shown in FIG. 12. In the structure shown in FIG. 14, N- and P-type impurity regions 79 and 72*a* are formed on buried insulating film 70. Gate interconnection 73*b* is arranged over P-type impurity region 72*a* and a part of a cell isolation region 78*d*.

N-type impurity region 79 is a source node shared between two access transistors, and is electrically connected to source line SL (SL2) via source contacts SCTa and SCTb shown in FIG. 12.

A cell isolation region 78*c* is formed outside N-type impurity region 79. Cell isolation regions 78*c* and 78*d* have a shallow trench isolation structure, and have depths reaching buried insulating film 70. Cell isolation regions 78*a*-78*d* shown in FIGS. 13 and 14 continuously extend to surround active region 50 (50*e*).

In the sectional structure shown in FIG. 13, N-type impurity regions 71*b* and 71*c* form the drain regions of the storage transistor. In this second embodiment, the double-drain SOI transistor can be also used as the storage transistor.

The gate electrode of the access transistor of each port is formed into the L-shaped form, and can provide an increased channel region, so that it can normally drive a relatively large current. Likewise, the storage transistor has a T-shaped body region, and can have an increased charge accumulation region, so that the potential of the body region can be significantly and reliably changed according to the storage data.

Figure 15:
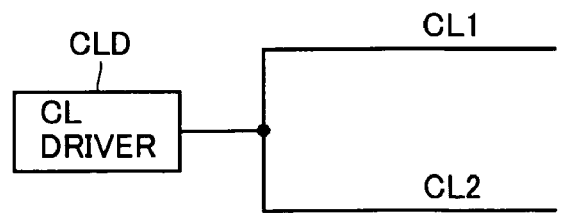
FIG. 15 schematically shows a configuration of the CL driver driving a charge line in a semiconductor memory device according to the second embodiment of the invention.

FIG. 15 shows a configuration of charge line driver CLD. In FIG. 15, when the row is selected, corresponding charge line driver CLD drives charge lines CL1 and CL2 arranged in the two rows for selecting two bits of memory cells. Charge line driver CLD has substantially the same internal configuration as that shown in FIG. 10, and drives two charge lines CL1 and CL2 to the selected state when the corresponding row is selected according to port-A and port-B row addresses.

In the configuration shown in FIG. 15, the output of charge line driver CLD is divided so as to drive charge lines CL1 and CL2. However, independent charge line drivers may be employed for charge lines CL1 and CL2 for driving the corresponding charge lines to the selected state according to the same address signal (or the same address decoded signal), respectively.

Figure 16:
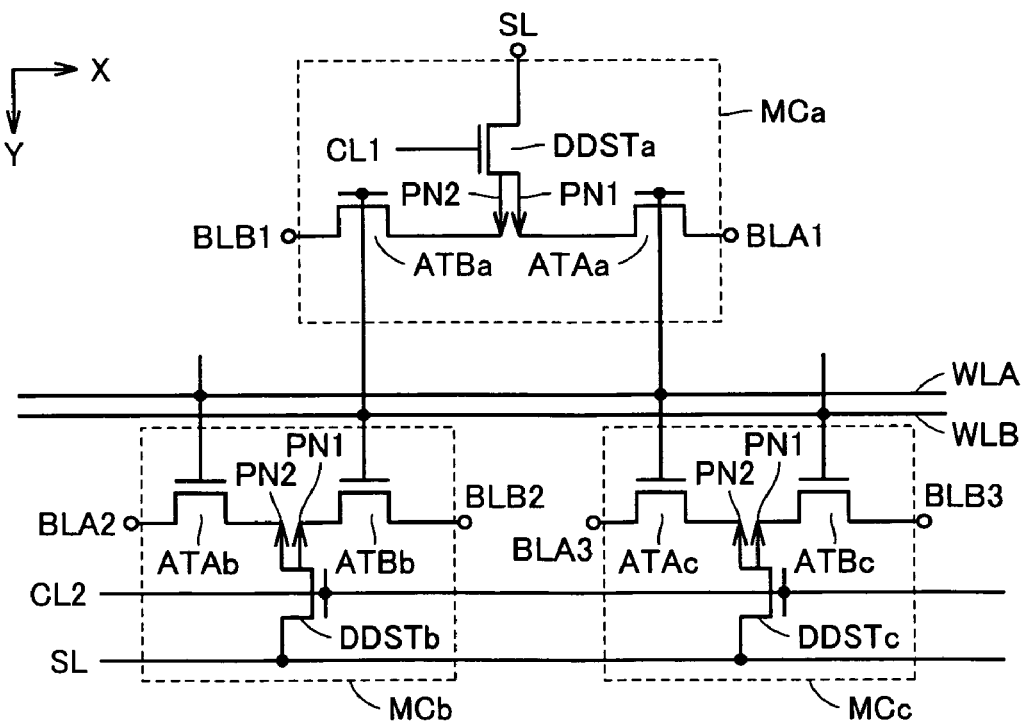
FIG. 16 shows an electrically equivalent circuit of the memory cell array shown in FIG. 12.

FIG. 16 shows an electrically equivalent circuit of the memory cells arranged as shown in FIG. 12. FIG. 16 representatively shows memory cells MCa, MCb and MCc arranged in the three neighboring active regions.

Memory cell MCa includes a double-drain storage transistor DDSTa, a port-A access transistor ATAa and a port-B access transistor ATBa. Gates of access transistors ATAa and ATBa are coupled to port-A and port-B word lines WLA and WLB, respectively. Access transistor ATAa, when conductive, couples a first precharge node (first drain electrode) PN1 of double-drain storage-transistor DDSTa to bit line BLA1. Access transistor ATBa, when conductive, couples a first precharge node (second drain electrode) PN2 of double-drain storage transistor DDSTa to bit line BLB1. A gate of double-drain storage transistor DDSTa is electrically connected to charge line CL1, and a source electrode thereof is coupled to source line SL.

Likewise, memory cell MCb includes a double-drain storage transistor DDSTb, a port-A access transistor ATAb and a port-B access transistor ATBb. Gates of access transistors ATAb and ATBb are coupled to word lines WLA and WLB, respectively. Double-drain storage transistor DDSTh has a gate coupled to charge line CL2, and a source node coupled to source line SL. Port-A access transistor ATAb, when conductive, it couples a second precharge node (second drain electrode) of storage transistor DDSTh to a bit line BLA2. Access transistor ATBb, when conductive, couples a first precharge node (first drain electrode) PN1 of double-drain storage transistor DDSTh to a bit line BLB2.

Memory cell MCc includes a double-drain storage transistor DDSTc as well as port-A and port-B access transistors ATAc and ATBc. Storage transistor DDSTc has a gate coupled to charge line CL2 and a source coupled to source line SL. Port-A access transistor ATAc, when conductive, couples second precharge node PN2 of double-drain storage transistor DDSTc to a bit line BLA3. Port-B access transistor ATBc, when conductive, couples first precharge node PN1 of storage transistor DDSTc to a bit line BLB3.

In the arrangement of the memory cells, as shown in FIG. 16, the access transistors for the port-B are aligned in the Y direction, and the access transistors for the port-A are likewise arranged. The positions of the port-A and port-B access transistors in memory cell MC are exchanged for each row.

As shown in FIG. 16, when one of word lines WLA and WLB is selected, the data of two bits of memory cells are read in parallel onto the paired bit lines, respectively.

In the data write operation, charge lines CL2 and CL 1 are drive in parallel to the selected state when word line WLA or WLB is driven to the selected state. In the data reading, charge lines CL1 and CL2 are kept at the H level.

In the semiconductor memory device according to the second embodiment, when a conflict occurs between the write access from port-A and that from port-B, the writing from one of the ports stops according to a certain priority order or rule. Therefore, in the arrangement in which charge lines CL are arranged corresponding to the respective rows, when memory cells on two rows are selected by one word line, charge lines CL1 and CL2 are driven by the same charge line driver as already described with reference to FIG. 15.

According to a physical layout in the second embodiment, the memory cells in two rows are selected in parallel. However, according to logical address, the memory cells in one page, i.e., the memory cells corresponding to one row address are selected by an access from the port A or port B, and the storage transistors of the selected memory cells are coupled to port-B or port-A bit lines BLB or BLA. Finally, the number of bits of the memory cell data that is externally read out or written in is appropriately determined according to a bus width of an external data bus.

In addition, the following configuration may be employed. When data are transferred at a double data rate in synchronization with rising and falling of a clock signal, the bit lines in paired bit lines are successively selected while holding the word line in the selected state, and data at the even address and data at odd address are sequentially written into or read from one and the other of the paired bit lines.

Further, bit values of the individual memory cells may be read onto paired bit lines BLB1 and BLB2, respectively. Complementary data pair is not read onto bit lines BLB1 and BLB2. In this case, the data complementary to the data of memory cell MCa must be stored in memory cells MCb and MCc, and eventually the data of the same logic must be stored in memory cells MCb and MCc.

For reading the complementary data, the memory device is configured to write the complementary data into the adjacent memory cells in the same row (in the physical layout). In this case, in the configuration shown in FIG. 12, the complementary data are read out onto e.g., onto bit lines BL1A and BL4A. In addition, the complementary data is read onto bit lines BL3B and BL5B.

According to the second embodiment of the invention, as described above, the memory cells are divided for arrangement in correspondence with the active regions. Therefore, such an arrangement can be achieved that one word line selects the memory cells in two rows in parallel. Thus, it becomes possible to increase the number of bits selected by one word line and thus to increase the page size, and the access efficiency can be improved.

The double-drain SOI transistor is used as the storage transistor, and the propagating paths of the currents from the port A and port B to the storage transistor can be equal to each other in connection with the bit line pair, and the reliable write/read of the data can be achieved.

The gate electrode of the storage transistor is formed into a T-shaped structure, and the storage transistor can be configured into the double-drain structure, for arranging the access transistors of different ports symmetrically in the active region.

The memory cell has a capacitorless cell structure, and the scaling of the memory cell can be easily done to follow the miniaturization in the manufacturing process. The memory cell data is read nondestructively, and it is possible to alleviate significantly the restrictions on the port access, i.e., the access inhibition during the restore period.

Third Embodiment

Figure 17:
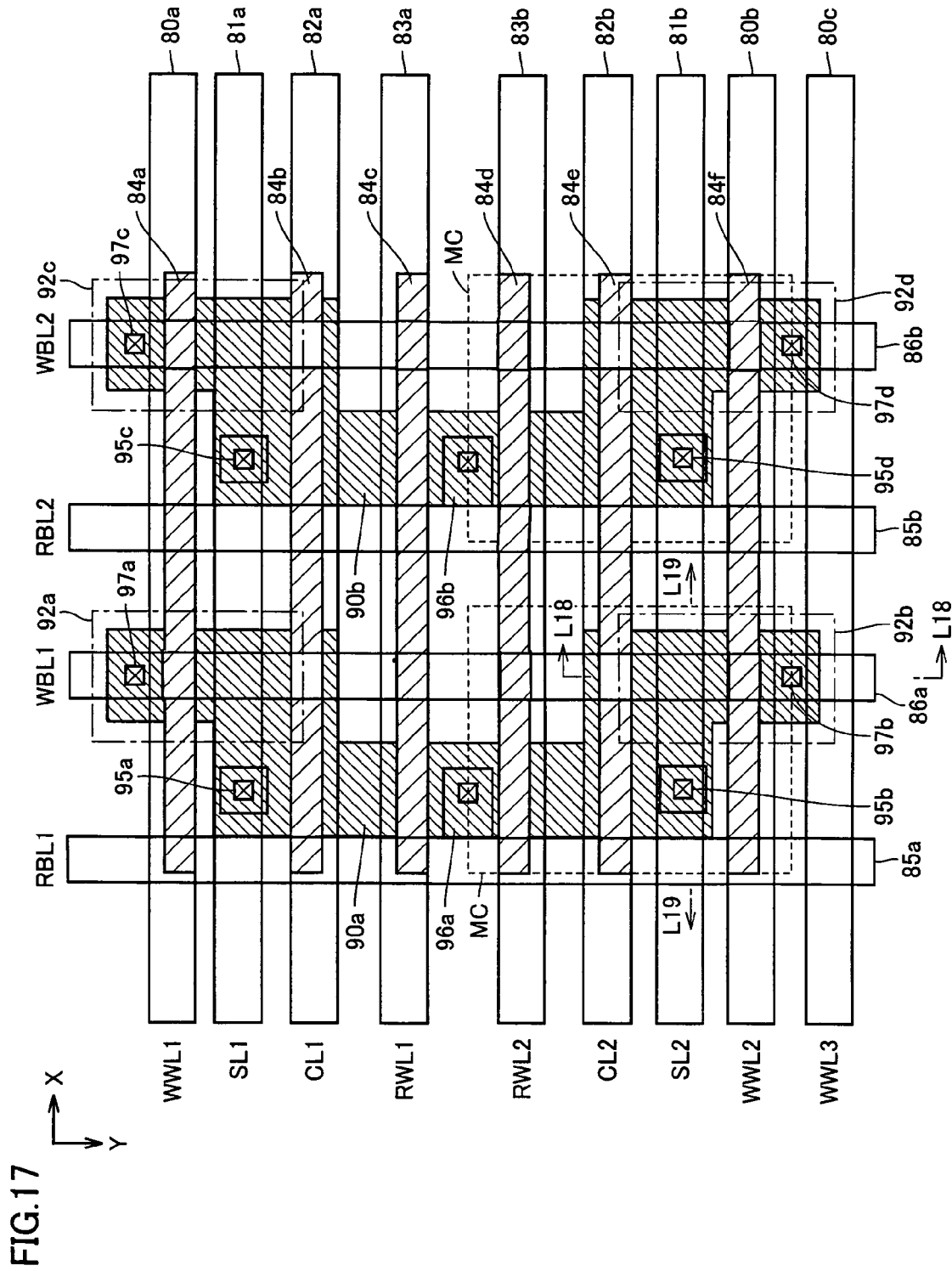
FIG. 17 schematically shows a planar layout of a memory cell array of a semiconductor memory device according to a third embodiment of the invention.

FIG. 17 schematically shows a planar layout of a memory cell array of a semiconductor memory device according to a third embodiment of the invention. In FIG. 17, second metal interconnections 80*a*, 81*a*, 82*a* and 83*a* are arranged continuously extending in the X direction with spaces in between. Second metal interconnection 80*a* forms a write word line WWL1, and second metal interconnection 81*a* forms source line SL1. Second metal interconnections 82*a* forms charge line CL1, and second metal interconnection 83*a* forms a read word line RWL1.

Second metal interconnections 83*b*, 82*b*, 81*b*, 80*b* and 80*c* are arranged continuously extending in the X direction with spaces in between. Second metal interconnection 83*b* forms a read word line RWL2, second metal interconnection 82*b* forms charge line CL2 and second metal interconnection 81*b* forms charge line SL2. Second metal interconnection forms a write word line WWL2, and second metal interconnection 80*c* forms a write word line WWL3.

A polycrystalline silicon gate interconnection 84*a* is arranged in the X direction in alignment with second metal interconnection 80*a*. A polycrystalline silicon gate interconnection 84*b* is aligned to second metal interconnections 82*a* and 83*b*. Polycrystalline silicon gate interconnections 84*c* and 84*b* are arranged in alignment with second metal interconnections 83*a* and 83*b*, respectively. Polycrystalline silicon gate interconnections 84*e* and 84*f* are arranged in alignment with second metal interconnections 82*b* and 80*b*, respectively. Although a polycrystalline silicon gate interconnection is arranged in alignment with second metal interconnection 80*c*, it is not shown in FIG. 17 for the sake of simplicity.

In FIG. 17, polycrystalline silicon gate interconnections 84*a*-84*f* are shown being divided in the X direction. However, polycrystalline silicon gate interconnections 84*a*-84*f* extend continuously in the X direction similarly to second metal interconnections 80*a*-83*a* and 83*b*-80*b*, and are electrically contacted with the corresponding second metal interconnections at portions that are not shown in FIG. 17, respectively.

First metal interconnections 85*a*, 86*a*, 85*b* and 86*b* are arranged extend in continuously in the Y direction with spaces in between. First metal interconnection 85*a* forms a read bit-line RBL1, and first metal interconnection 86*a* forms a write bit line WBL1. First metal interconnections 85*b* and 86*b* form read and write bit lines RBL2 and WBL2, respectively.

Active regions 90*a* and 90*b* are arranged extending in the Y direction over an area between second metal interconnections 81*a* and 81*b*. P-type impurity regions 92*a*, 92*b*, 92*c* and 92*d* are arranged, adjacent to active regions 90*a* and 90*b*, extending across second metal interconnections 80*a* and 80*b* forming write word lines WWL1 and WWL2 from second metal interconnections 82*a* or 82*b* forming the charge line.

Second metal interconnection 81*a* is electrically coupled to N-type active regions 90*a* and 90*b* through source via/contacts 95*a* and 95*c*, respectively. Active regions 90*a* and 90*b* are electrically connected to first metal interconnections 85*a* and 85*b* forming read bit lines RBL1 and RBL2 through bit line contacts 96*a* and 96*b*, respectively. Each of bit line contacts 96*a* and 96*b* forms the electrical connection to first metal interconnection 85*a* or 85*b* using the first metal interconnection as the intermediate layer.

Second metal interconnection 81b is electrically connected to active regions 90a and 90b through source via/contacts 95b and 95d, respectively.

P-type impurity regions 92a and 92b are electrically connected to first metal interconnection 86a via bit line contacts 97a and 97b, respectively. P-type impurity regions 92c and 92d are electrically connected to first metal interconnection 86b through bit line contacts 97c and 97d, respectively.

A region of one memory cell MC is defined by a region that extends in the Y direction between contact 96 (96a-96d) for the read bit line and contact 97 (97a-97c) for the write bit line, and extends in the X direction between read bit line RBL and write bit line WBL.

In the memory cell MC shown in FIG. 17, there are arranged read and write bit lines RBL and WBL as well as read and write word lines RWL and WWL. Therefore, the read port and the write port are individually and separately formed, and the data reading is performed via the read port (read bit line RBL and read word line RWL). Also, the data writing is performed via the write port (write bit line WBL and write word line WWL).

The write bit line is electrically coupled to P-type impurity region 92 (92a-92d). P-type impurity region 92 (92a-92d) is concatenated to the P-type body region formed under charge line CL (CL1 or CL2) of adjacent active region 90 (90a or 90b). Therefore, charges are supplied into the body region of the storage transistor, using the P-type SOI transistor as the transistor for writing. Accordingly, the structure for writing the charges into the body region of the storage transistor can be implemented, using the active region arrangement of the memory cells and therefore the interconnection layout similar to those in the first embodiment.

The write bit line contact 97 (97a-97d) is shared between the memory cells adjacent to each other in the Y direction. Therefore, the layout of the active regions shown in FIG. 17 is repeated in the Y direction, and the interconnection layout in FIG. 17 is repeated in the X direction.

Figure 18:
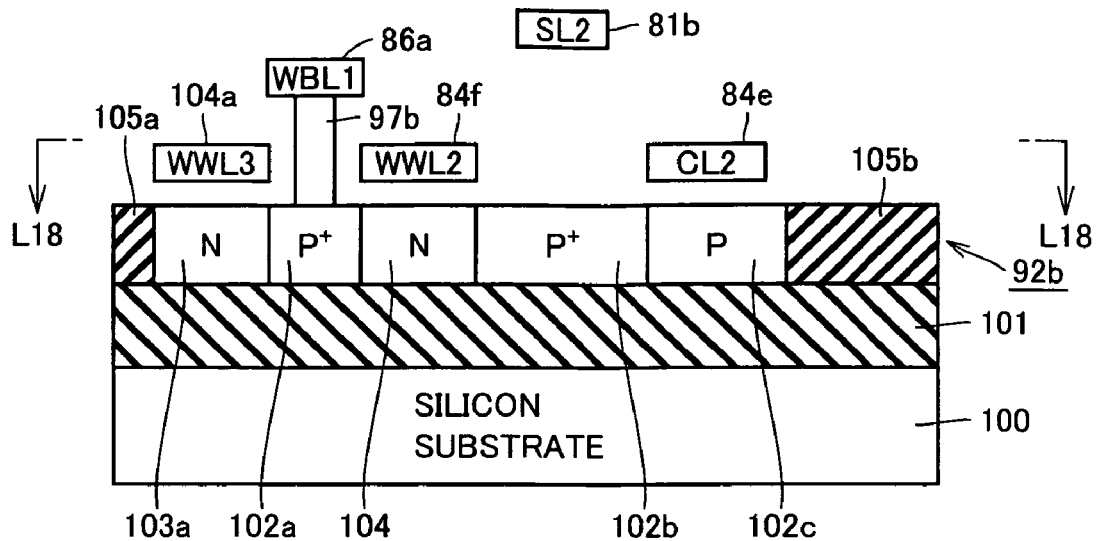
FIG. 18 schematically shows a sectional structure taken along line L18-L18 in FIG. 17.

FIG. 18 schematically shows a sectional structure taken along line L18-L18 in FIG. 17. In FIG. 18, P-type impurity region 92b is formed on a buried insulating film 101. Buried insulating film 101 is formed on the surface of a silicon substrate 100.

P-type impurity region 92b includes N-type regions 103a and 104, a heavily doped P-type region 102a formed between N-type regions 103a and 104, a heavily doped P-type region 102b formed opposing to P-type region 102a and adjacent to N-type region 104, and a P-type region 102c adjacent to heavily doped P-type region 102b.

A polycrystalline silicon gate interconnection 104a (not shown in FIG. 18) and polycrystalline silicon gate interconnections 84f and 84e shown in FIG. 17 are formed on N-type region 103a, N-type region 104 and P-type impurity region 102c, respectively. Polycrystalline silicon gate interconnections 84f and 84e form write word line WWL2 and charge line CL2, respectively.

Polycrystalline silicon gate interconnection 104a is electrically coupled to second metal interconnection 80c shown in FIG. 17, and forms write word line WWL3. Heavily doped P-type region 102a is electrically connected to first metal interconnection 86a through a bit line contact 97b. First metal interconnection 86a forms write bit line WBL1.

Second metal interconnection 81b is arranged above P-type impurity region 102b, and forms source line SL2.

Cell isolation regions 105a and 105b are formed around active region 92b (the full trench isolation structure is implemented by the shallow trench isolation).

Figure 19:
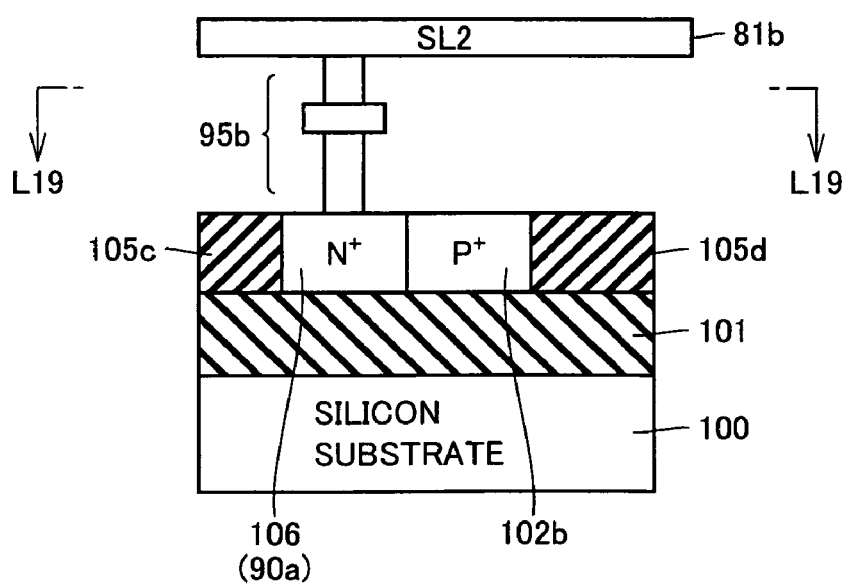
FIG. 19 schematically shows a sectional structure taken along line L19-L19 in FIG. 17.

FIG. 19 schematically shows a sectional structure taken along line L19-L19 in FIG. 17. In FIG. 19, N-type impurity region 106 that is a part of active region 90a is arranged adjacent to heavily doped P-type region 102b shown in FIG. 18, and is electrically connected to second metal interconnection 81b through source via/contact 95b. Cell isolation regions 105c and 105d are formed outside impurity regions 106 and 102b.

N-type impurity region 106 receives power supply voltage VDD through source line SL2 (second metal interconnection 81b). Heavily doped P-type region 102b is set into a reverse biased state, and a region between impurity region 106 and P-type region 102b is kept in a nonconductive state.

Figure 20:
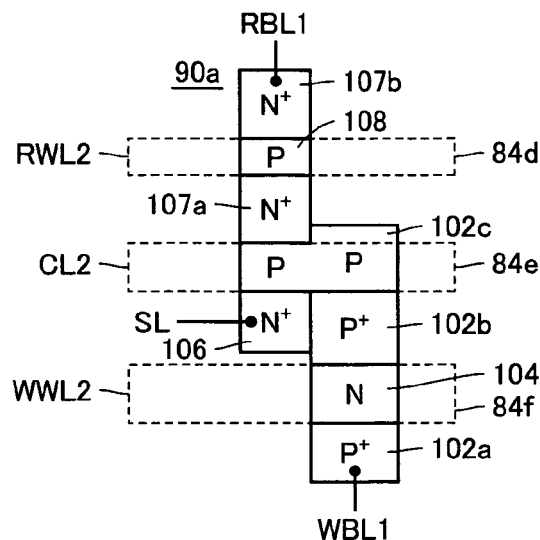
FIG. 20 shows an arrangement of impurity regions of the memory cell array together with gate electrodes in the third embodiment of the invention.

FIG. 20 schematically shows an arrangement of the impurity regions in one memory cell. In FIG. 20, N-type impurity region 106 is arranged adjacent to P-type region 102b as shown in FIG. 19, and is supplied with the power supply voltage through source line SL. N-type impurity region 106 forms a part of active region 90a. In active region 90a, N-type impurity regions 107a and 107b are arranged. N-type impurity region 107b is coupled to read bit line RBL1. A P-type impurity region 108 is arranged between impurity regions 107a and 107b.

Polycrystalline silicon gate interconnection 84d forming read word line RWL2 is arranged in a layer above P-type impurity region 108. Therefore, P-type impurity region 108 forms a body region of the SOI transistor for reading. A P-type impurity region 102c as shown in FIG. 18 is formed extending to a region between N-type impurity regions 107a and 106. Polycrystalline silicon gate interconnection 84e forming charge line CL2 is arranged above P-type impurity region 102c.

N-type region 104 is arranged between P-type impurity regions 102b and 102a (see FIG. 18). Polycrystalline silicon gate interconnection 84f forming write word line WWL2 is arranged above N-type region 104. N-type region 104 forms a body region of the access transistor for writing.

Figure 21:
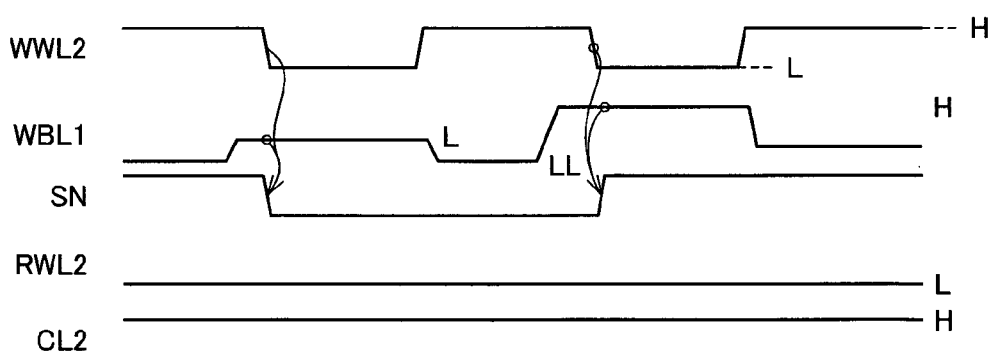
FIG. 21 is a signal waveform diagram representing a data read operation of the semiconductor memory device according to the third embodiment of the invention.

FIG. 21 shows signal waveforms appearing in the data write operation of the memory cell shown in FIG. 20. Referring to FIG. 21, description will now be given on the data write operation of the memory cell shown in FIG. 20.

In the standby state, write word line WWL2 is at the power supply voltage level, and write bit line WBL1 is at the ground voltage level. It is now assumed that the potential of storage node SN (P-type region 102c) is at the H level.

Read word line RWL2 is at the L level, and charge line CL2 is at the H level. Therefore, a channel is not formed in P-type region 108, and N-type impurity regions 107a and 107b are isolated from each other.

Charge line CL2 is at the power supply voltage level, and P-type region 102c is kept at the potential corresponding to the storage data. A channel is not formed between source line SL and N-type-impurity region 107a connected to read bit line RBL1, and source line SL and read bit line RBL1 are kept isolated from each other.

During standby, write bit line WBL1 is at the L level or the LL level lower than the L level, and thus is at a lower voltage level than write word line WWL2. Therefore, a channel is not formed in N-type region 104, and P-type regions 102a and 102b are isolated from each other.

For writing the L data, write bit line WBL1 is first set to the L level, and subsequently write word line WWL2 is driven to the L level lower than that of write bit line WBL1. The L level of write word line WWL2 may be equal to or lower than that of write bit line WBL1. Therefore, the L level of write word line WWL may be the ground voltage level or a negative voltage level. The L level of the write bit line is preferably the ground voltage level, and the LL level is a negative voltage level.

In this state, an inversion layer (channel) is formed in N-type region 104 shown in FIG. 20. Therefore, the L level voltage on write bit line WBL1 is transmitted through P-type impurity region 102b to P-type region 102c, and the voltage level of P-type impurity region 102c (storage node SN) is set to the L level so that the L level data is written. After the data writing is completed, write word line WWL2 is driven to the H level, and write bit line WBL1 is set to the LL level of the standby state.

For writing the H data, write bit line WBL1 is driven to the H level from the LL level of the standby state. In this state, the channel is not yet formed in the body region of the write access transistor. Subsequently, write word line WWL2 is driven to the L level. Accordingly, an inversion layer is formed in N-type region 104, and the H level voltage on write bit line WBL1 is transmitted onto P-type region 102c so that the potential of P-type region 102c (storage node SN) rises.

After the writing is completed, write word line WWL2 is driven again to the H level, e.g., of the power supply voltage. Also, write bit line WBL1 is set to the LL level lower than the L level of write word line WWL so that the write access transistor is set into a nonconductive state.

Therefore, the voltage level of the storage node can be set by directly supplying the charges from the write bit line to the body region of the storage transistor through the write access transistor. By this direct writing, the body region voltage of the storage node transistor can be reliably set, and fast data writing can be performed after driving the write word line to the selected state so that the fast writing is achieved.

Figure 22:
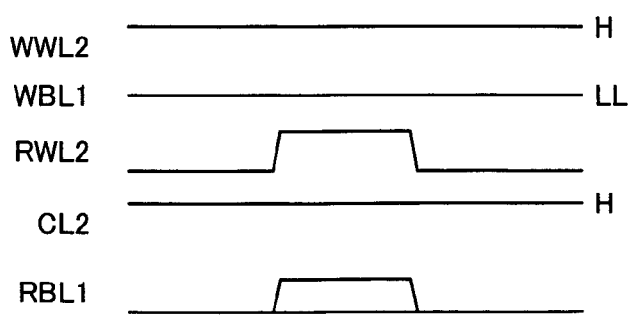
FIG. 22 is a signal waveform diagram representing a data write operation of the semiconductor memory device according to the third embodiment of the invention.

FIG. 22 schematically shows signal waveforms appearing in the operation of reading data from the memory cell shown in FIG. 20. In this case, write word line WWL2 and write bit line WBL1 are kept at the H and LL levels, respectively. In this state, the write access transistor is off, the channel is not formed in N-type region 104 and the body region of the storage transistor is reliably isolated from the write bit line.

In the read operation, when read word line RWL2 is driven to the H level, a channel is formed in P-type impurity region 108, and N-type impurity regions 107a and 107b are electrically connected with each other. In the data read operation, charge line CL2 is held at the H level. Thereby, a channel is likewise formed selectively in P-type region 102c according to the potential of the body region (P-type region 102c). Thereby, the current corresponding to the storage data flows between read bit line RBL1 and source line SL, and the data reading can be performed by sensing this current on the read bit line.

Figure 23:
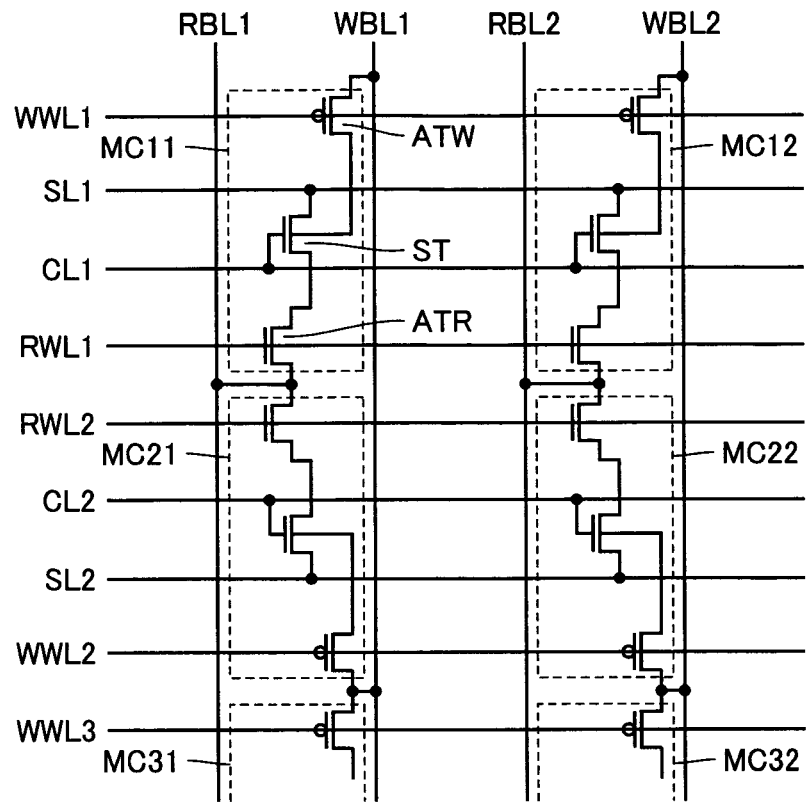
FIG. 23 schematically shows an electrically equivalent circuit of the memory cell array shown in FIG. 17.

FIG. 23 schematically shows an electrically equivalent circuit of the arrangement of the memory cells in the memory cell array shown in FIG. 17. In FIG. 23, memory cells MC11, MC12, MC21 and MC22 are arranged in two rows and two columns. Read bit lines RBL1 and RBL2 are arranged corresponding to the memory cell columns, respectively. Likewise, write bit lines WBL1 and WBL2 are arranged corresponding to the memory cell columns, respectively.

A set of write word line WWL1, source line SL1, charge line CL1 and read word line RWL1 is arranged corresponding to one memory cell row. Likewise, read word line RWL2, charge line CL2, source line SL2 and write word line WWL2 are arranged corresponding to another memory cell row.

As shown in FIG. 23, memory cells MC are arranged mirror-symmetrically for each row in the column direction. The two memory cells share the read bit line, and the two memory cells also share the write bit line contact.

Since memory cells MC11, MC12, MC21 and MC22 have the same configuration, only components of the memory cell MC11 are allotted reference characters in FIG. 23. Memory cell MC11 includes a write access transistor ATW, storage transistor ST and a read access transistor ATR. Write access transistor ATW is turned on in response to the signal potential of write word line WWL1, to couple the body region of storage transistor ST to write bit line WBL1.

Storage transistor ST selectively forms the channel to source line SL1 according to the storage data and the voltage on charge line CL1, and to couple source line SL to one conduction node (source) of read access transistor ATR. Read access transistor ATR is turned on in response to the signal potential of read word line RWL1, and couples storage transistor ST to read bit line RBL1.

FIG. 23 also shows write access transistors of memory cells MC31 and MC32 for illustrating an arrangement order of the signal interconnections such as the word lines in the column direction.

Write access transistor ATW is formed of a P-channel SOI transistor. Write word line WWL is changed between the H level (power supply voltage) and the L level (ground voltage or negative voltage).

Write bit line WBL is set to the LL level during standby, is set to the L level in the L level data writing and to the H level in the H level data writing. Write bit line WBL is set to the LL level, or the voltage level lower than the L level during standby or in the unselected state so that the following effect can be achieved. Even when write word line WWL is driven to the L level of the selected state, write access transistor ATW in the selected row and unselected column can reliably be kept in the off state. In the memory cell in the unselected row and the selected column, the write bit line is at the L level and write word line WWL is at the H level so that write access transistor ATW is kept in the off state. Thus, erroneous writing can be prevented in the memory cell in a half-selected state in which one of the write word line and the write bit line is in the selected state.

The L level of write word line WWL may be equal to the voltage level of write bit line WBL in the standby state. In this case, the absolute value of the threshold voltage of write access transistor ATW is reduced, so that binary data can be reliably transmitted to storage node SN. During standby, the write word line is driven to the H level. Therefore, even when the absolute value of the threshold voltage of write access transistor ATW is small, write access transistor ATW can reliably is kept in the off state, and current leakage through write access transistor ATW can be sufficiently suppressed so that the deterioration of the charge holding characteristics can be suppressed.

Figure 24:
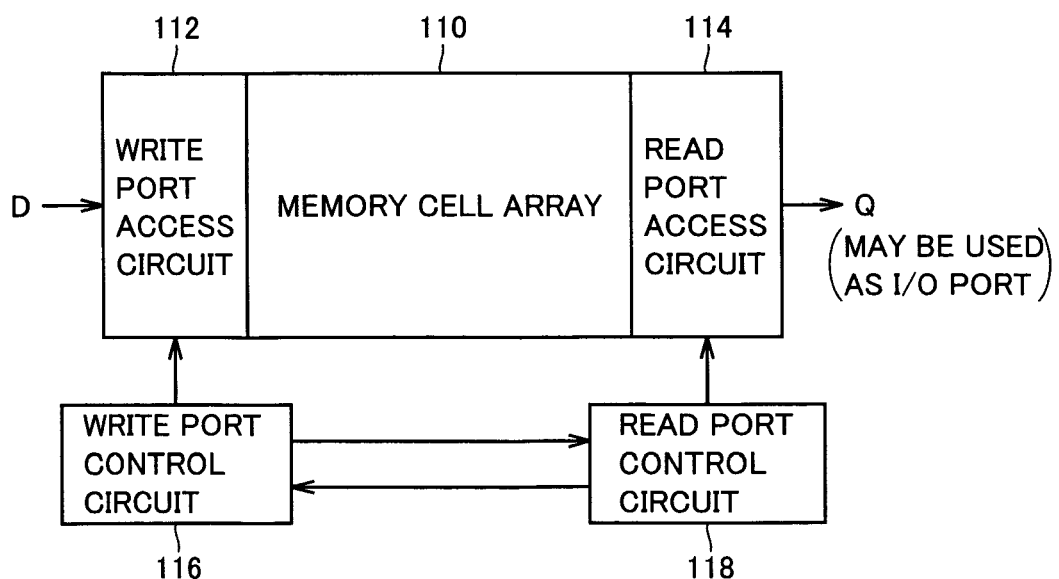
FIG. 24 schematically shows a whole structure of the semiconductor memory device according to the third embodiment of the invention.

FIG. 24 schematically shows a whole configuration of a semiconductor memory device according to a third embodiment of the invention. In FIG. 24, write and read port access circuits 112 and 114 are arranged on the opposite sides of a memory cell array 110, respectively. Write port access circuit 112 includes a write word line select and drive circuit, and a write bit line select and drive circuit. Read port access transistor 114 includes a read bit line select and read circuit, a read word line select and drive circuit, and a charge line select and drive circuit.

A write port control circuit 116 is arranged for write port access circuit 112. A read port control circuit 118 is arranged for a read port access circuit 114. Write and read port control circuits 116 and 118 each signal the other circuit of the accessing address thereof, and arbitrate any access conflict according to a predetermined rule or a priority order when access confliction to the same address is caused.

The access is made through the write and read ports in an interleaved fashion, so that fast writing and reading of data can be performed. In this third embodiment also, restoring of the charges accumulated in the capacitor is not required, and the access cycle can be short.

The third embodiment of the invention has been described such that only the data reading is performed on read bit lines RBL and RBL1. However, the writing and reading of the data can be performed through read bit line RBL, similarly to the first and second embodiments already described. In this case, read port access circuit 114 shown in FIG. 24 is formed of a read/write port access circuit, and further a write drive circuit is also arranged in read port access circuit 114.

According to the third embodiment of the invention, as described above, the charges corresponding to the data are directly written into the body region of the storage transistor. Therefore, the desired potential change can be reliably caused in the body region. Further, the capacitorless memory cell structure is employed similarly to the first and second embodiments, and the scalability of the memory can follow the miniaturization in the process.

Fourth Embodiment

Figure 25:
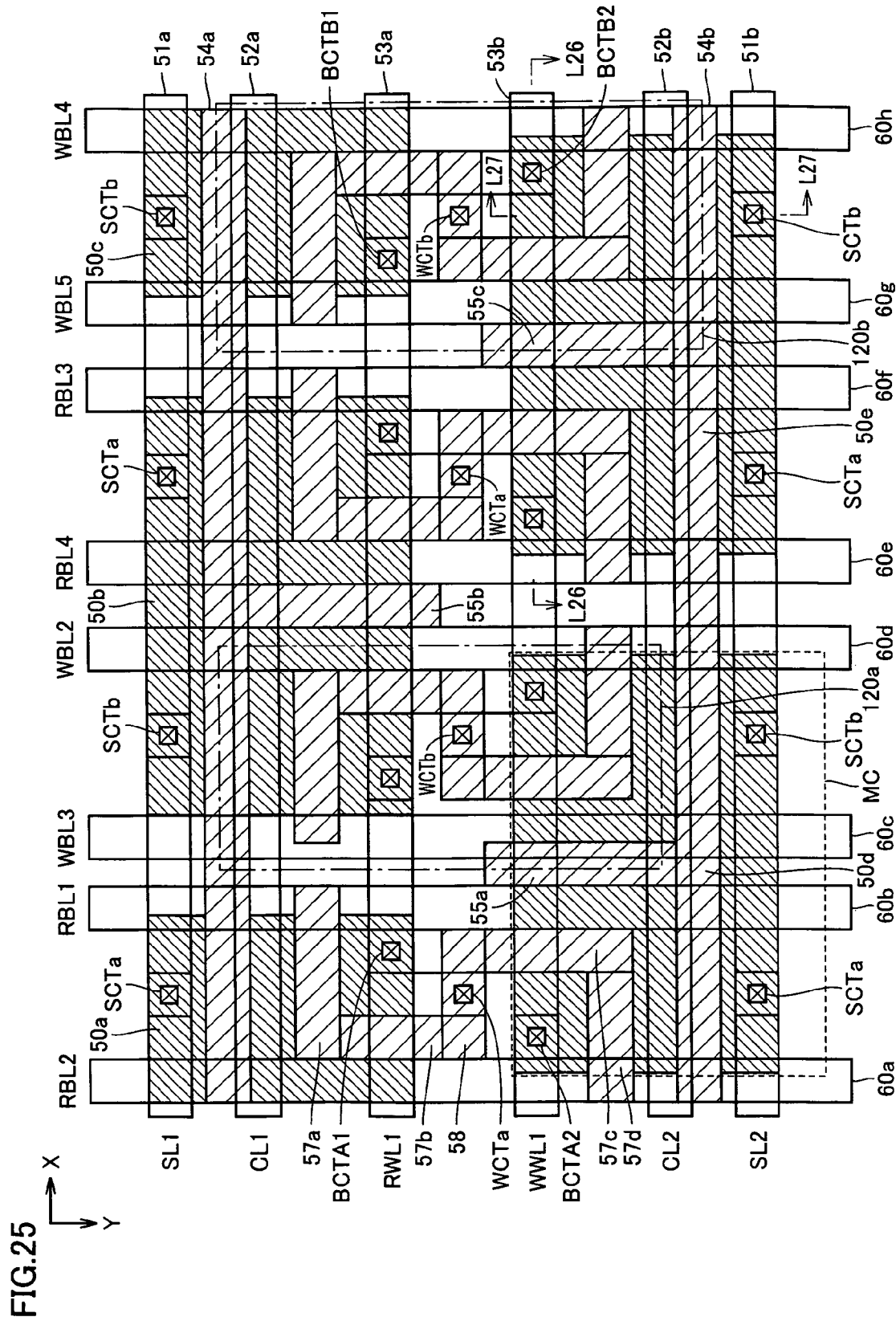
FIG. 25 schematically shows a planar layout of a memory cell array of a semiconductor memory device according to a fourth embodiment of the invention.

FIG. 25 schematically shows a planar layout of a memory cell array of a semiconductor memory device according to a fourth embodiment of the invention. A planar layout of the memory cell array shown in FIG. 25 differs in the following arrangement from the layout of the memory cell array according to the second embodiment shown in FIG. 12. First metal interconnections 60a-60h are alternately assigned to read bit lines RBL and write bit lines WBL. Specifically, port-A bit lines BL2A, BL1A, BL4A and BL3A are used as read bit lines RBL2, RBL1, RBL4 and RBL3, respectively. Port-B bit lines BL3B, BL2B, BL5B and BL4B are used as write bit lines WBL3, WBL2 and WBL4.

P-type impurity regions 120a and 120b provide the transistor formation regions for accessing the port B in active regions 50a-50e.

Other arrangement in the planar layout of FIG. 25 is the same as that of the memory cell array shown in FIG. 12. The corresponding portions are allotted the same reference numerals, and description thereof is not repeated.

In the planar layout of the memory cell array shown in FIG. 25, the storage transistor body region is coupled to the P-channel MOS transistor for write access, and the write data transmitted through write bit line WBL is directly written into the body region of the storage transistor.

FIG. 26 schematically shows a sectional structure taken along line L26-L26 in FIG. 25. The sectional structure shown in FIG. 26 differs from that shown in FIG. 13 in the following structure. In the active region formed at the surface of buried insulating film 70, first metal interconnection 60h forming the write bit line is coupled to a P-type region 130a through write bit line via/contacts 75b and 74b. An N-type body region 132a is arranged below polycrystalline silicon gate interconnection 73c forming write word line WWL1. A heavily doped P-type region 130b is arranged adjacently to N-type body region 132a. First metal interconnections 60g used as the write bit lines are arranged in a layer above heavily doped P-type region 130b. First metal interconnection 60f above N-type region 72a is used as read bit line RBL3.

First metal interconnections 60e and 60h are used as read and write bit lines RBL4 and WBL4, respectively.

Other structures shown in FIG. 26 are the same as those shown in FIG. 13. The corresponding portions are allotted the same reference numerals, and description thereof is not repeated.

The write access transistor coupled to the write bit line is formed of the P-channel SOI transistor as shown in FIG. 26. A P-type region 130b of this P-channel SOI transistor is coupled to P-type body region 72b below gate electrode interconnection 73b forming charge line CL2. Therefore, the charges can be directly transferred from the write bit line to the body region (P-type region) 72b of this storage transistor.

FIG. 27 schematically shows a sectional structure taken along line L27-L27 in the planar layout of the memory cell array shown in FIG. 25. In FIG. 27, regions corresponding to the components in the sectional structure shown in FIG. 26 are allotted the same reference numerals.

In the sectional structure shown in FIG. 27, cell isolation regions 78c and 78d isolate the active region from active regions of other cells. In the active region, P-type region 130a, N-type region 132a and P-type region 130b are sequentially arranged on the surface of buried insulating film 70.

A gate electrode interconnection 137a forming write word line WLB is formed on N-type body region 132a with a gate insulating film (not shown) in between. On P-type region 72b, a polycrystalline silicon gate interconnection 137b forming charge line CL2 is arranged with a gate insulating film (not shown) interposed in between. An N-type impurity region 135 is arranged adjacent to P-type body region 72b, and is coupled to second metal interconnection 51b forming source line SL through source via/contact SCTb.

Second metal interconnections 52b and 53b, which form charge line CL2 and write word line WWL1, respectively, are arranged in the same interconnection layer as second metal interconnection 51b.

As shown in FIG. 27, source line SL (SL2) normally supplies the power supply voltage to N-type impurity region 135.

By driving this write word line to the selected state (L or LL level), a channel is formed in N-type impurity region 132a, and P-type regions 130a and 130b are electrically connected with each other. Thus, the charges (electrons or holes) can be passed into P-type body region 72b under gate electrode interconnection 137b forming the charge line, similarly to the third embodiment, and the voltage level of the body region of this storage transistor can be set.

Body region 72b is coupled to the drain node (precharge node) of the read transistor (i.e., transistor for reading) in the memory cell array. Therefore, when a voltage at the H level is supplied onto charge line CL2 (second metal interconnection 52b and gate interconnection 137b), a channel is formed in P-type body region 72b, and the precharge node of the read access transistor can be precharged to the power supply voltage level from source line SL.

Figure 28:
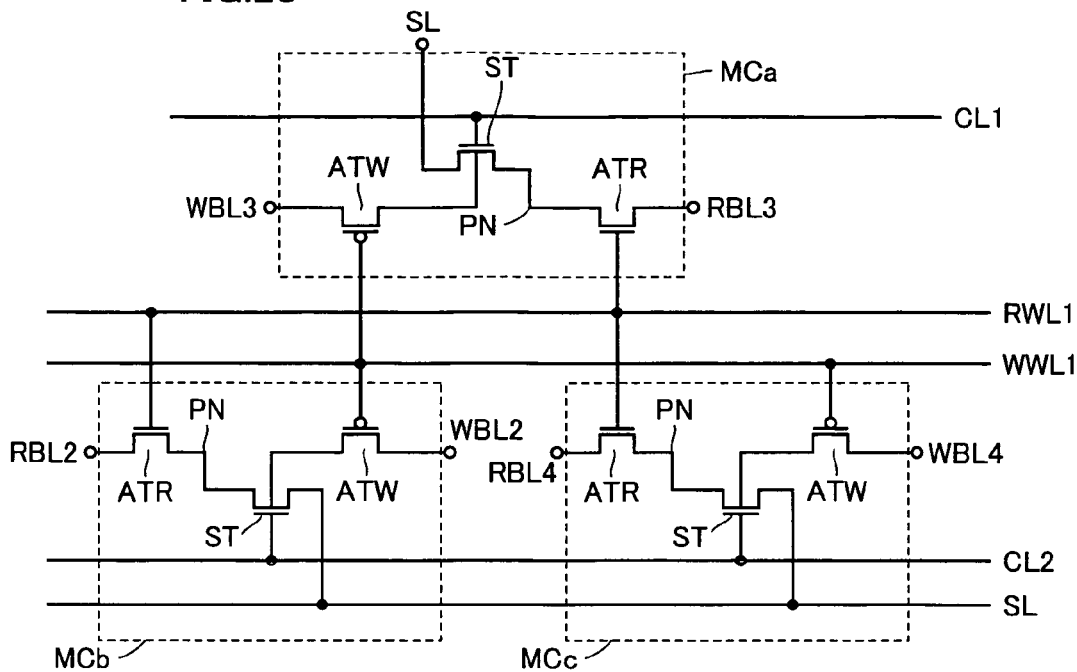
FIG. 28 shows an electrically equivalent circuit of the memory cell array shown in FIG. 25.

FIG. 28 is an electrically equivalent circuit of the layout of the memory cells shown in FIG. 25. FIG. 28 shows three memory cells MCa-MCc. Memory cell MCa is coupled to write and read bit lines WBL3 and RBL3. Memory cell MCb is coupled to read and write bit lines RBL2 and WBL2. Memory cell MCc is coupled to read and write bit lines RBL4 and WBL4. These memory cells MCa-MCc are commonly coupled to read and write word lines RWL1 and WWL1.

Since memory cells MCa-MCc have the same structure, the corresponding portions in FIG. 28 are allotted the same reference numerals.

Each of memory cells MCa-MCc includes storage transistor ST storing the data according to the voltage level of the body region, write access transistor ATW and read access transistor ATR.

Storage transistor ST, when in conductive state, couples source line SL to precharge node PN. Write access transistor ATW, when in conductive state, couples corresponding write bit line WBL (WBL3, WBL2 or WBL4) to the body region of storage transistor ST. Read access transistor ATR, when in conductive state, couples precharge node PN to corresponding read bit line RBL (RBL3, RBL2 or RBL4).

In the array arrangement shown in FIG. 28, write access transistors ATW are arranged in alignment in the column direction, or the extending direction of the bit lines, and read access transistors ATR are arranged in alignment in the column direction. In each row, read and write access transistors ATR and ATW are arranged alternately to each other.

When one write word line WWL1 or one read word line RWL1 is selected, write or read access transistors ATW or ATR of the two adjacent memory cells in the same column are driven to the conductive state in parallel with each other. Thus, the memory cells in two rows can be selected in parallel by one write word line or one read word line.

The data writing of memory cell MCa shown in FIG. 28 is performed by substantially the same operation as the writing in the third embodiment already described. Specifically, the voltage level of the write bit line in an unselected column is set lower than that of the write word line in the selected row, and it is prevented the erroneous writing of data into the memory cell in the selected row and unselected column. In addition, the voltage level of the write word line in the unselected row is set equal to or higher than the voltage level of the write bit line in the selected column in the operation of writing the H data, it can be prevented erroneous writing of data into the memory cell in the unselected row and selected column.

This fourth embodiment also uses the capacitorless memory cell, and the memory cells can be easily scaled following the miniaturization in the process, similarly to the third embodiment. The reading of memory cell data is nondestructive reading, and it is possible to alleviate significantly the access restrictions on the access port.

In the fourth embodiment also, the port coupled to read bit line RBL can perform both the data writing and data reading. For controlling the port access, it is possible to use the configuration of the third embodiment already described with reference to FIG. 24.

Fifth Embodiment

Figure 29:
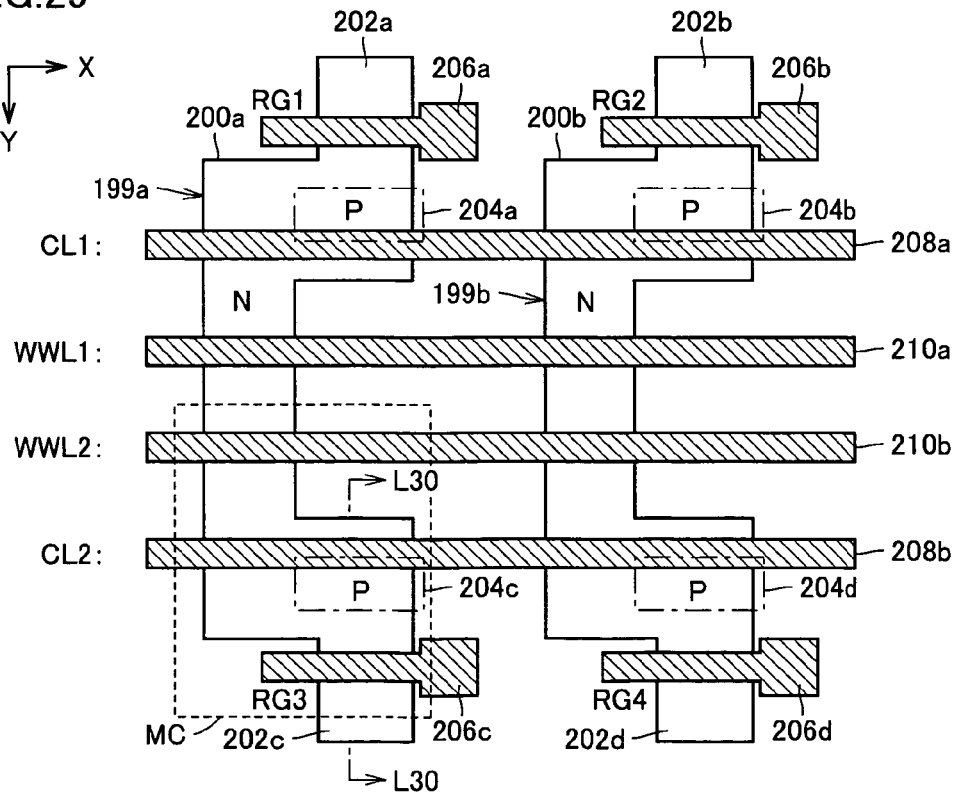
FIG. 29 schematically shows a planar layout of active regions and polycrystalline silicon gate electrode interconnections in a memory cell array of a semiconductor memory device according to a fifth embodiment of the invention.

FIG. 29 schematically shows a planar layout of the memory cell array of the semiconductor memory device according to a fifth embodiment of the invention. FIG. 29 shows a planar layout of active regions of memory cells arranged in two rows and two columns in the memory cell array as well as polycrystalline silicon gate electrode interconnections. In FIG. 29, active regions 199a and 199b forming the memory cell transistors are arranged. Active region 199a includes a convex region 200a as well as concave regions 202a and 202c that are concatenated to the upper and lower regions of convex region 200a, respectively. Likewise, active region 199b includes a convex region 200b as well as convex regions 202b and 202d. Each of active regions 199a and 199b of a handle-like form is arranged continuously extending in the Y direction with the concave regions and the convex region being alternately arranged for each two memory cell pitch.

In active region 199a, P-type impurity regions 204a and 204c are formed in portions of convex regions 202a and 202c concatenated to convex region 200a, respectively. Likewise, active region 199b has P-type impurity regions 204b and 204d formed in portions of convex regions 202b and 202d concatenated to convex region 200b, respectively.

Polycrystalline silicon gate electrode interconnections 206a and 206b are arranged extending in the X direction across concave regions 202a and 202b to areas reaching convex regions 200a and 200b, respectively. As will be described later in detail, polycrystalline silicon gate electrode interconnections 206a and 206b form read gates RG1 and RG2 that are access transistors for data reading.

Likewise, polycrystalline silicon gate electrode interconnections 206c and 206d are arranged in concave regions 202c and 202d, extending in the X direction across concave regions 202c and 202d, respectively. Polycrystalline silicon gate electrode interconnections 206c and 206d form read gates RG3 and RG4 for data reading.

Polycrystalline silicon gate electrode interconnections 208a, 210a, 210b and 208b are arranged continuously extending in the X direction and being spaced in the Y direction from one another. Polycrystalline silicon gate electrode interconnection 208a is arranged adjacent to P-type impurity regions 204a and 204b, and polycrystalline silicon gate electrode interconnection 208b is adjacent to P-type impurity regions 204c and 204d. Polycrystalline silicon gate electrode interconnections 208a and 208b form charge lines CL1 and CL2, respectively. Polycrystalline silicon electrode interconnections 210a and 210b form write word lines WWL1 and WWL2, respectively.

Memory cell MC is formed of the convex and concave regions running in the Y direction from the write word line to the read gate. The layout shown in FIG. 29 is repeated in the X and Y directions.

Figure 30:
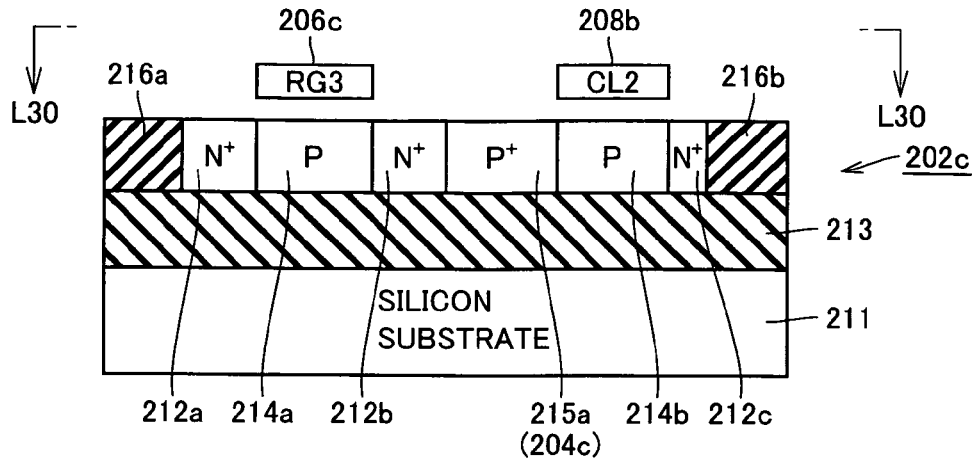
FIG. 30 schematically shows a sectional structure taken along line L30-L30 in FIG. 29.

FIG. 30 schematically shows a sectional structure taken along line L30-L30 in FIG. 29. Convex region 202c is formed on a stacked structure including a silicon substrate 211 and a buried insulating film 213.

Convex region 202c includes N-type impurity regions 212a, 212b and 212c forming a part of the active region as well as P-type impurity regions 214a and 214b formed under gate electrode interconnections 206c and 208b. P-type impurity region 204c corresponds to a P-type impurity region 215a formed between N-type impurity region 212b and P-type impurity region 214b.

Cell isolation regions 216a and 216b are formed outside convex region 202c for isolation from other cells.

Figure 31:
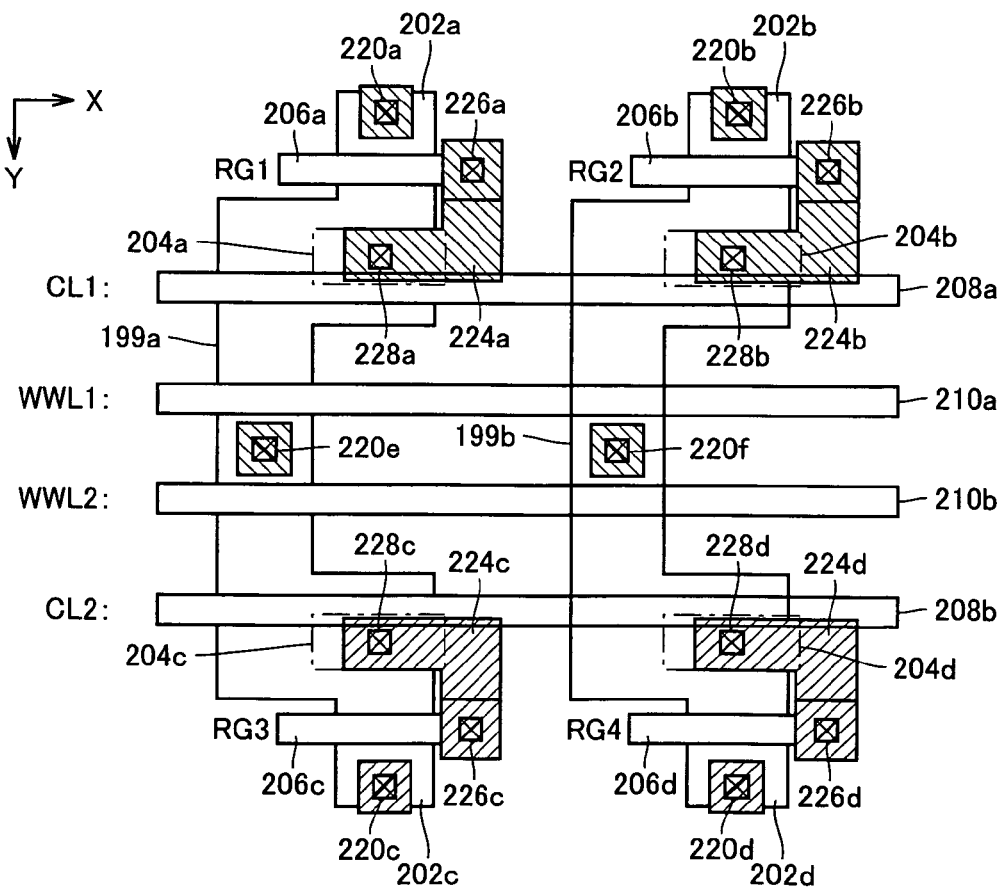
FIG. 31 schematically shows a planar layout of first metal interconnections above the planar layout shown in FIG. 29.

FIG. 31 shows a layout of first metal interconnections in a layer above the planar layout shown in FIG. 29 as well as corresponding contacts. Components corresponding to those in the planar layout shown in FIG. 29 are allotted the same reference numerals.

In active region 199a, concave region 202a is provided at its end with a contact 220a including a first metal interconnection used as an intermediate layer. Gate electrode interconnection 206a is coupled to a first metal interconnection 224a of a reversed L-shaped form through a contact 226a. First metal interconnection 224a is electrically coupled to P-type impurity region 204a through a contact 228a.

Concave region 202c is provided at its end with a contact 220c that includes the first metal interconnection used as an intermediate layer. Gate electrode interconnection 206c is coupled to a first metal interconnection 224c of a nearly L-shaped form via a contact 226c. First metal interconnection 224c is electrically coupled to P-type impurity region 204c via a contact 228c.

In active region 199b, convex region 202b is provided at its end with a contact 220b including the first metal interconnection. Gate electrode interconnection 206b is coupled to a nearly L-shaped first metal interconnection 224b via a contact 226b. The other end of first metal interconnection 224b is electrically connected to P-type impurity region 204b via a contact 228b.

Concave region 202d is likewise provided at its end with a contact 220d including the first metal interconnection. Gate electrode interconnection 206d is electrically connected to a reversed L-shaped first metal interconnection 224d through a contact 226d. The other end of first metal interconnection 224d is electrically connected to P-type impurity region 204c through a contact 228d.

P-type impurity region 215a (204c) shown in FIG. 30 is coupled to gate electrode interconnection 206c. P-type impurity region 215a (204c) is electrically connected to a body region of the storage transistor, and the potential thereof is set according to the data to be stored by a configuration that will be described later. Therefore, in P-type impurity region 214a under read gate RG3 shown in FIG. 30, a channel is selectively formed depending on a potential held in P-type impurity region 215a (204c). Thereby, the read word line is not required.

Figure 32:
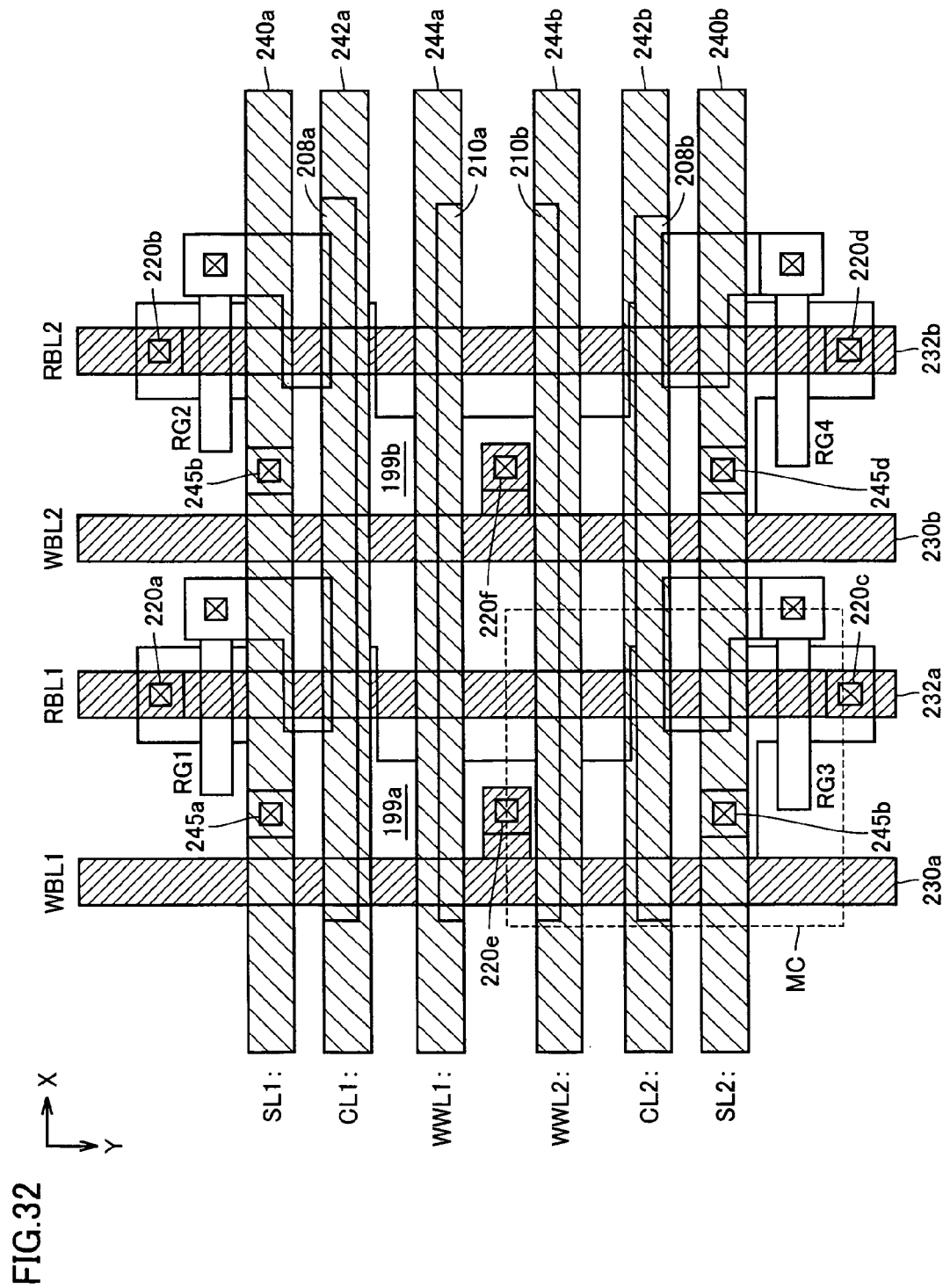
FIG. 32 schematically shows a layout of second and third metal interconnections above the planar layout shown in FIG. 31.

FIG. 32 schematically shows a layout of second and third metal interconnections in a layer above the interconnection layout shown in FIG. 31. In FIG. 32, components corresponding to those shown in FIGS. 29 and 31 are allotted the same reference numerals. FIG. 32 also shows a layout of the first metal interconnections connected to the gate electrode interconnections (although reference numerals are not assigned thereto).

In FIG. 32, second metal interconnections 230a, 232a, 230b and 232b are arranged continuously extending in the Y direction with spaces in between. Second metal interconnection 230a is arranged outside active region 199a, and is electrically connected to active region 199a through bit line via/contact 220e. Second metal interconnection 232a is arranged parallel to a straight line connecting via/contacts 220a and 220c. Second metal interconnection 232a is connected through these via/contacts 220a and 220c to the concave region of active region 199a in regions outside read gates (polycrystalline silicon gate electrodes) RG1 and RG3, respectively.

Second metal interconnection 230b is arranged adjacent to the convex region outside active region 199b. Second metal interconnection 230b is electrically coupled to active region 199b through via/contact 220f formed between polycrystalline silicon gate interconnections 210a and 210b.

Second metal interconnection 232b is arranged on a straight line connecting via/contacts 220b and 220d. Second metal interconnection 232b is electrically connected to the concave regions of active region 199b by via/contacts 220b and 220d in regions outside read gates (polycrystalline silicon gate electrodes) RG2 and RG4. Second metal interconnections 230a and 230b form write bit lines WBL1 and WBL2, respectively. Second metal interconnections 232a and 232b form read bit lines RBL1 and RBL2.

Third metal interconnections 242a, 244a, 244b and 242b are arranged extending continuously in the X direction and being aligned to polycrystalline silicon gate electrode interconnections 208a, 210a, 210b and 208b, respectively. Third metal interconnections 240a and 240b are arranged in the regions outside third metal interconnections 242a and 242b, respectively.

Third metal interconnection 240a is electrically connected to active regions 199a and 199b through via/contacts 245a and 245b, respectively. Third metal interconnection 240b is electrically connected to active regions 199a and 199b through via/contacts 245b and 245d, respectively.

Third metal interconnections 242a, 244a, 244b and 242b are electrically connected to corresponding polycrystalline silicon gate electrode interconnections 208a, 210a, 210b and 208b in regions that are not shown, respectively.

Third metal interconnections 240a and 240b form source lines SL1 and SL2, respectively, and are electrically coupled to a global source line in a region that is not shown, respectively. Third metal interconnections 242a and 242b form charge lines CL1 and CL2, respectively. Third metal interconnections 244a and 244b form write word lines WWL1 and WWL2, respectively.

As is clear from the interconnection layout shown in FIG. 32, write word lines WWL1 and WWL2 are arranged as the word lines for selecting the memory cells, and a read word line for selecting the access transistor in performing the read operation is not arranged. In the operation of selecting a read memory cell row, the charge line is used as the read word line as will be described later.

Figure 33:
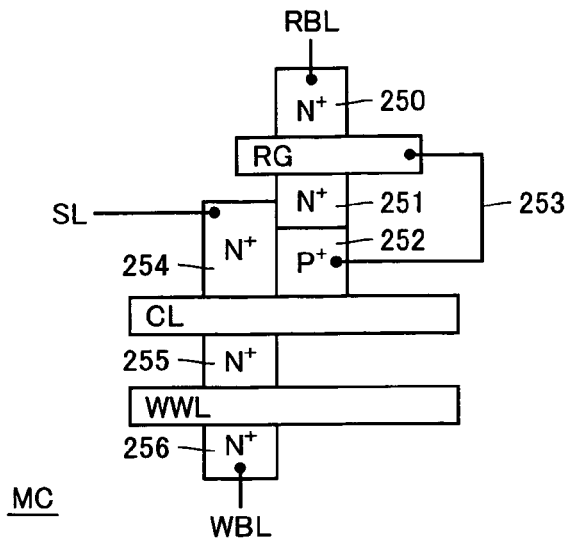
FIG. 33 schematically shows an arrangement of impurity regions and a gate electrode of a memory cell in the fifth embodiment of the invention.

FIG. 33 schematically shows a planar layout of a memory cell MC in the semiconductor memory device according to the fifth embodiment of the invention. In FIG. 33, a read gate (polycrystalline silicon gate electrode) RG is arranged between N-type impurity regions 250 and 251. A P-type impurity region 252 is arranged adjacent to N-type impurity region 251, and is electrically connected to read gate RG through a first metal interconnection 253. An N-type impurity region 254 is arranged adjacent to impurity regions 251 and 252. An N-type impurity region 255 is arranged opposing to N-type impurity region 254 with respect to charge line CL, and is used as a precharge node. An N-type impurity region 256 is arranged opposing to an N-type impurity region 255 with respect to the write word line.

N-type impurity region 250 is coupled to read bit line RBL, and N-type impurity region 256 is coupled to write bit line WBL. Impurity regions 250 and 251 as well as read gate RG form an access transistor for data reading. N-type impurity regions 254 and 255, P-type impurity region 252 and charge line CL form a storage transistor. Impurity regions 255 and 256 as well as write word line WWL form an access transistor for data writing.

A P-type region is formed below charge line CL. Therefore, the body region of the storage transistor is held at the same potential as P-type impurity region 252, and read gate RG is held at the same potential as the body region (under charge line CL) of the storage transistor.

Figure 34:
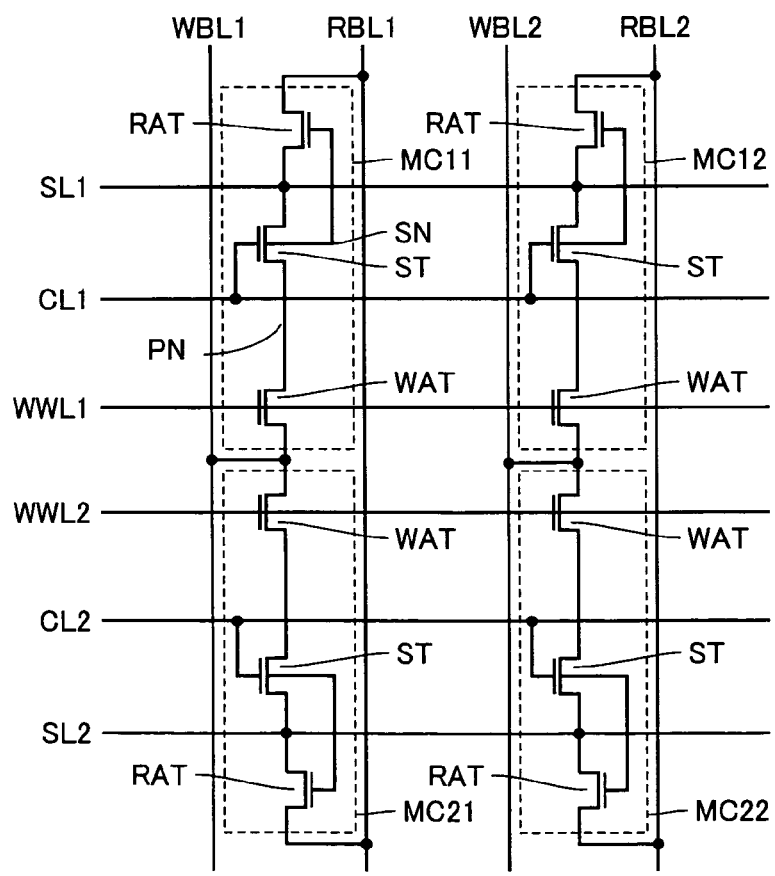
FIG. 34 shows an electrically equivalent circuit of the memory cell array shown in FIG. 32.

FIG. 34 shows an electrically equivalent circuit of the memory cells in the planar layout shown in FIG. 32. In FIG. 34, memory cells MC11 and MC21 arranged in alignment in the column direction are arranged between read and write bit lines RBL 1 and WBL1 each extending in the column direction, and are connected to these bit lines RBL1 and WBL1, respectively. Likewise, memory cells MC12 and MC22 arranged in alignment in the column direction are arranged between write and read bit lines WBL2 and RBL2, and are connected to these bit lines WBL2 and RBL2, respectively.

Source line SL1, charge line CL1 and write word line WWL1 each extending in the row direction are commonly arranged to memory cells MC11 and MC12 arranged in alignment in the row direction. Write word line WWL2, charge line CL2 and source line SL2 each extending in the row direction are arranged commonly to memory cells 21 and 22 arranged in alignment in the row direction.

Since memory cells MC11, MC12, MC21 and MC22 have the same structure, the corresponding portions in FIG. 34 are allotted the same reference numerals. Each of memory cells MC11, MC12, MC21 and MC22 includes a read access transistor RAT for data reading, a write access transistor WAT for data writing and storage transistor ST for data storage.

Read access transistor RAT has a gate connected to the body region (storage node SN) of corresponding storage transistor ST, and selectively forms a path for current flow between source line SL1 and read bit line RBL1 according to its gate to source potential.

Storage transistor ST has a gate coupled to charge line CL1 as well as conduction nodes (source and drain) which are coupled to source line SL1 and precharge node PN, respectively.

Write access transistor WAT electrically couples precharge node PN to corresponding write bit line WBL (WBL1 or WBL2) in response to a signal potential of write word line WWL1.

Figure 35:
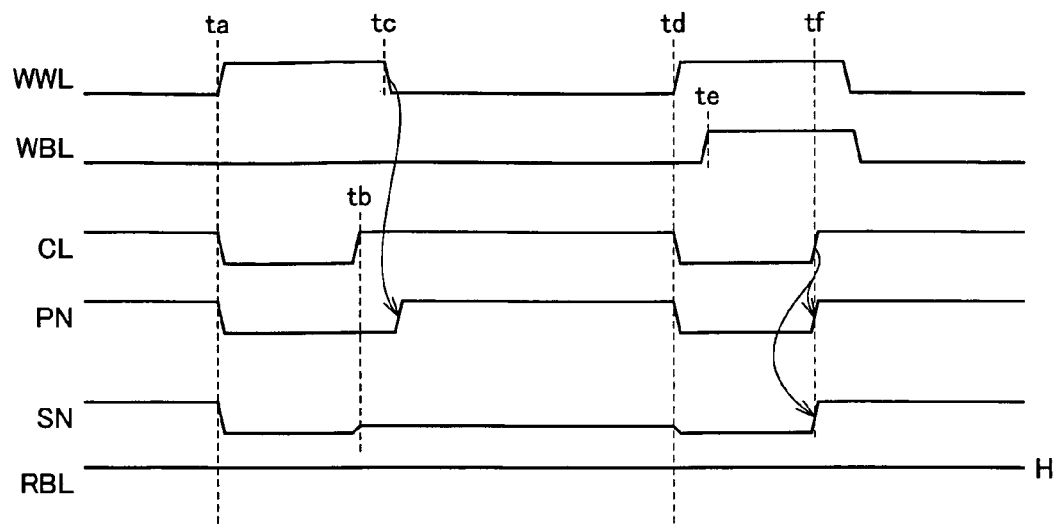
FIG. 35 is a signal waveform diagram representing operations for data writing of the memory cell array shown in FIG. 34.

FIG. 35 is a signal waveform diagram representing an operation in data writing of the memory cells shown in FIG. 34. In FIG. 35, generic reference numerals and characters are used for indicating the signal lines, and specific signal lines such as "write word line WWL1" are not referred to. FIG. 35 shows signal waveforms in the write operation of a memory cell of a given write target.

The signal waveforms in data writing shown in FIG. 35 are substantially the same as those for the data writing described in connection with the first and second embodiments. In the write operation, read bit line RBL (RBL1 or RBL2) is kept at keeps the H level same as source line SL, i.e., at the power supply voltage level. Thereby, even when read access transistor RAT receives on its gate (read gate) the signal at the H level in the data write operation, read access transistor RAT maintains the off state to prevent flowing of a current between source line SL and read bit line RBL. Referring to FIG. 35, the data write operation of the memory cell array shown in FIG. 34 will be briefly described below.

At a time ta, write word line WWL is first driven to the high level of the intermediate voltage lower than the power supply voltage, for performing the data writing. At this time, charge line CL is driven to the ground voltage level. The data writing into memory cell MC11 will be considered below. Write bit line WBL is at the L level. Thus, precharge node PN in memory cell MC11 is driven to the ground voltage level.

At this time, through the capacitive coupling, the voltage level of storage node SN lowers from the H level to the L level according to the lowering of the voltage level of charge line CL. When data "0" is to be written, write bit line WBL is kept at the L level. In this state, the channel is formed in write access transistor WAT, and precharge node PN is kept at the same voltage level as write bit line WBL.

Even in the case when charge line CL (CL1) is driven to the H level at a time tb, the potential of precharge node PN is transmitted to the channel formation region of storage transistor ST when a channel is formed in storage transistor ST. Accordingly, the channel block operation suppresses the voltage rising of storage node SN that is otherwise caused by the gate coupling, and the voltage level of the storage node rises only slightly.

When write word line WWL (WWL1) is driven to the L level at a time tc, write access transistor WAT turns nonconductive. Thereafter, precharge node PN is changed with the charging electric charges supplied from source line SL through storage transistor ST, and the voltage level of precharge node PN returns to the H level.

At a time td, writing of data "1" starts. In this case, write word line WWL is driven to the high level (intermediate voltage level), and charge line CL is driven from the H level of the power supply voltage to the L level of the ground voltage. Accordingly, precharge node PN in the write target memory cell MC11 attains the ground voltage level. According to the potential lowering of charge line CL, the voltage level of storage node SN storing data of the L level lowers to the ground voltage level.

After the precharging of precharge node PN, at a time te, write bit line WBL is driven to the high level of the intermediate voltage the same as write word line WWL The gate and source of the write access transistor WAT attains the same voltage level, and write access transistor WAT turns nonconductive.

After the voltage level of write bit line WBL rises, at a time tf, the voltage level of charge line CL rises to the H level of the power supply voltage. Since write access transistor WAT is nonconductive, precharge node PN is in the floating state. Therefore, precharge node PN and storage node SN are driven to the H level of the power supply voltage through the capacitive coupling with the charge line.

At this time, the gate potential of corresponding read access transistor RAT attains the power supply potential level. However, read bit line RBL has been precharged to the power supply voltage level, and all the gate, source and drain of read access transistor RAT are at the same potential so that read access transistor RAT maintains the off state, and the potential of corresponding read bit line RBL does not change.

By precharging read bit line RBL to the voltage level equal to the H level of charge line CL, it is possible to suppress the flow of an unnecessary current through the read bit line in this write operation.

In this data write operation, the write bit line voltage may be changed at the same timing as the change in write word line voltage when H data is to be written, as disclosed in the article 4 already described. In this write sequence, the write bit line is driven to the voltage level higher than the write word line. At this time, charge line CL is likewise changed from the H level to the L level. In this state, a high voltage across charge line CL and source line SL causes a GIDL (Gate Induced Drain Leakage) to supply holes from source line SL into the body region, to raise the potential of the body region. Thereafter, the voltage on charge line CL is raised, and the potential of the body region is raised to the H level through the capacitive coupling between the body region and the charge line. At this time, the voltage level of the precharge node also rises to the H level due to the capacitive coupling. In this write sequence, it is possible to raise sufficiently the voltage level of storage node SN.

Figure 36:
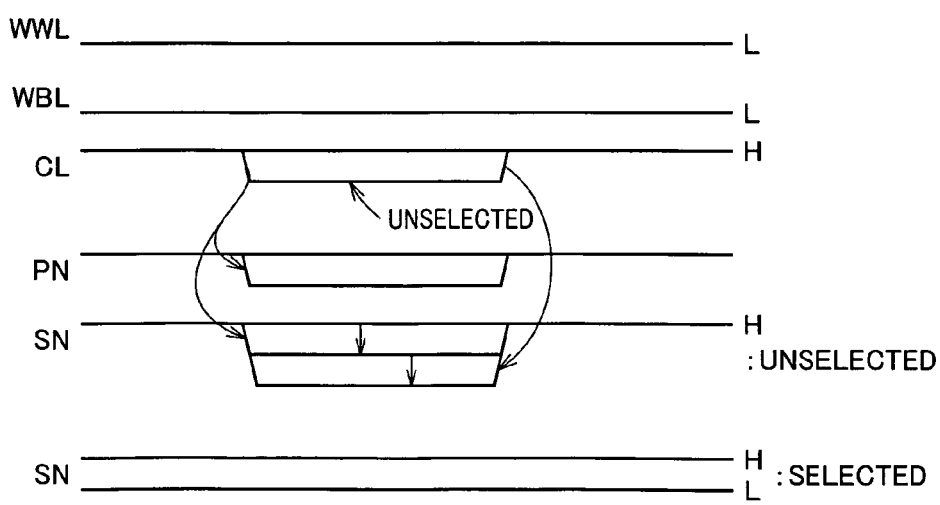
FIG. 36 represents signal waveforms in a data read operation of the memory cell array shown in FIG. 35.

FIG. 36 is a signal waveform diagram representing operations for data reading. Referring to FIG. 36, the data reading of the memory cell array shown in FIG. 34 will be described below.

In data reading, write word line WWL and write bit line WBL are at the L level of the ground voltage. In memory cell MC (MC11, MC12, MC21, and MC22), therefore, write access transistor WAT is nonconductive, and precharge node PN is in the floating state.

In the data read operation, charge line CL corresponding to the selected row is kept at the H level, and charge line CL corresponding to the unselected row is driven to the L level. In this operation, the capacitive coupling between the gate and body region of the storage transistor lowers the voltage levels of the precharge node and the body region of storage transistor ST of the memory cell in the unselected row. Thus, the gate voltage of read access transistor RAT in the unselected row attains the L level equal to or lower than the ground voltage level independently of the storage data.

Thus, even when storage node SN has stored the H level data, the voltage level of the H data on storage node SN is lowered to or below the ground voltage level by lowering charge line CL to the L level, and accordingly becomes lower than the voltage on source line SL. Therefore, even when read bit line RBL is kept at the ground voltage level, read access transistor RAT in the unselected row has the gate voltage equal to or lower than the source/drain voltage, and keeps the nonconductive state.

The charge line in the selected row is kept at the H level. Read bit line RBL in the selected column is driven to the ground voltage level or to a predetermined read voltage level lower than the power supply voltage. The read access transistor of the memory cell in the selected row and selected column has the gate voltage at the level according to the storage data, and the source thereof is provided by the impurity region connected to the read bit line. Thus, a current corresponding to the storage data flows between source line SL and read bit line RBL, and the data reading can be performed. The read bit line in the unselected column is kept at the H level of the power supply voltage.

The memory cell in the selected column and the unselected row is in the state where the read access transistor has the gate potential at the L level equal to that of the body region. Also, the voltage on source line SL is at the H level, and the voltage on the read bit line is at the ground voltage level. In this state, the source of the read transistor is the impurity region connected to the read bit line, but the gate and source are at the same potential so that the read access transistor maintains the off or nonconductive state.

As for the memory cell in the selected row and the unselected column, the read access transistor has the gate voltage depending on the voltage level of the body region, the impurity region connected to source line SL at the H level and the impurity region connected to read bit line RBL at the H level of the power supply voltage. Accordingly, the read transistor has the gate voltage equal to or lower than the source voltage independently of the storage data, and maintains the off state.

Accordingly, even when the read gate is coupled to the body region of the storage transistor, erroneous reading does not occur in the unselected memory cell, and the data can be accurately read from the selected memory cell.

After the completion of the data reading, charge line CL in the unselected row is driven to the H level of the power supply voltage again. Accordingly, in the memory cell in the unselected row, the voltage level of the body region of storage transistor ST returns to the original voltage level through the capacitive coupling. This can prevent the data destruction in the unselected memory cell.

Figure 37:
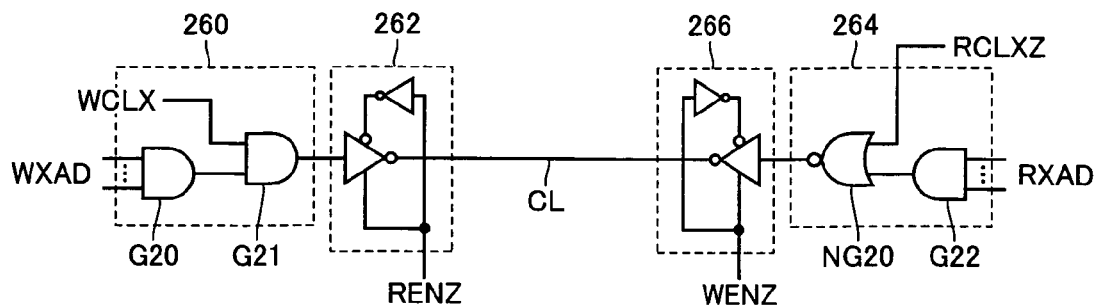
FIG. 37 schematically shows a configuration of a portion driving a charge line of the semiconductor memory device according to the fifth embodiment of the invention.

FIG. 37 shows by way of example a configuration of a portion driving charge line CL in the semiconductor memory device according to the fifth embodiment of the invention. In FIG. 37, a write port control unit includes a write charge line selection drive circuit 260, and a write charge line driver 262 for driving charge line CL according to the output signal of the write charge line select drive circuit 260.

Write charge line select drive circuit 260 includes an AND type decode circuit G20 for decoding a write row address signal WXAD, and an AND circuit G21 for producing the charge line drive timing signal according to the output signal of AND type decode circuit G20 and a write charge line drive timing signal WCLX.

Write charge line driver 262 is formed of a tristate inverter buffer, and attains the output high-impedance state when a read instructing signal RENZ is active (at the L level).

A read port control unit includes a read charge line select drive circuit 264 and a read charge line driver 266 for driving charge line CL according to the output signal of read charge line select drive circuit 264.

Read charge line select drive circuit 264 includes an AND type decode circuit G22 receiving a read row address signal RXAD, and an NOR circuit NG20 receiving the output signal of AND type decode circuit G22 and a read charge line activation timing signal RCLXZ, which is an active low signal.

Read charge line driver 266 is formed of a tristate inverter buffer, and is set to the output high-impedance state when a write mode instructing signal WENZ is active. Write mode instructing signal WENZ is low when made active.

Figure 38:
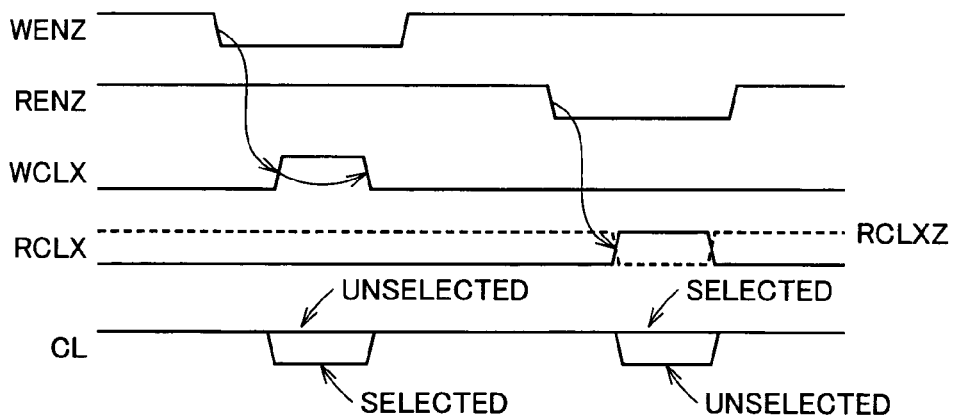
FIG. 38 is a signal wave form diagram representing an operation of a charge line drive unit shown in FIG. 37.

FIG. 38 is a signal waveform diagram representing an operation of the charge line drive unit shown in FIG. 37. Referring to FIG. 38, the operation of the charge line drive unit shown in FIG. 37 will be described below.

During standby, write and read mode instructing signals WENZ and RENZ are both at the H level. Therefore, both the tristate inverter buffers in charge line drivers 262 and 266 are active. Write and read charge line activation timing signals WCLX and RCLXZ are at the L and H levels, respectively. Therefore, both the output signals of charge line select drive circuits 260 and 264 are at the L level, and charge line drivers 262 and 266 keep charge line CL at the H level of the power supply voltage.

In the write mode, write instructing signal WENZ attains the L level to set read charge line driver 266 to the output high-impedance state. Then, write charge line select drive circuit 260 performs the decoding operation according to write row address signal WXAD. According to the activation of write charge line drive timing signal WCLX, charge line CL corresponding to the selected row is driven to the L level. Since the output signal of AND type decode circuit G20 is at the L level, write charge line driver 262 keeps charge line CL in the unselected row at the level of power supply voltage VDD.

When the write mode is completed, write mode instructing signal WENZ attains the H level. Accordingly, the write port enters the standby state, and charge line CL is charged to and kept at the power supply voltage level through charge line drivers 262 and 266.

In the read mode, read mode instructing signal RENZ attains the L level, and accordingly write charge line driver 262 is set to the output high-impedance state. Write mode instructing signal WENZ is at the H level so that read charge line driver 266 keeps the active state.

In read charge line select drive circuit 264, the decode operation is performed according to read row address signal RXAD. The output signal of AND type decode circuit G22 attains the H level for the selected row, and attains the L level for the unselected row.

When read charge line activation timing signal RCLXZ attains the L level thereafter, NOR circuit NG20 operates as an inverter. The output signal of AND type decode circuit G21 is at the H level. Therefore, charge line CL is kept at the power supply voltage level as in the standby state. In the unselected row, the output signal of AND type decode circuit G22 is at the L level. Therefore, when read charge line activation timing signal RCLXZ attains the L level, the output signal of NOR circuit NG20 attains the H level, and accordingly, read charge line driver 266 drives charge line CL to the ground voltage level.

When the reading is completed, read mode instructing signal RENZ attains the H level, and write charge line driver 262 turns active. When the reading is completed, read charge line activation timing signal RCLXZ returns to the H level, and the output signal of charge line select drive circuit 264 is at the L level. Therefore, charge line CL is kept at the power supply voltage level by charge line drivers 262 and 266 on the opposite sides thereof.

By using the configuration as shown by way of example in FIG. 37, the voltage level of charge line CL in the selected state can be switched for writing and for reading.

In the fifth embodiment of the invention, the write port may be used as the port for both the writing and reading. Specifically, the write bit line is used also as the read bit line, and the write word line is also used as the read word line, so that the writing and reading of the data can be performed. This configuration can be achieved by arranging, for the write port, the port control circuit and the port access circuit of the first or second embodiment.

In the example of the instant fifth embodiment, the voltage level of charge line CL is selectively changed depending on the selected row and the unselected row. In the data read operation, however, charge line CL may be kept at the H level and the voltage level of source line SL may be changed depending on the selected and unselected rows, so that a similar effect can be achieved.

As a specific example, the following configuration may be used. In the data write, source line SL is set to the voltage level equal to the precharge voltage of read bit line RBL, and accordingly, the source and drain of the read access transistor are kept at the same voltage level. Even when the voltage level of body region SN of storage transistor ST changes according to the write data, the flow of the current through the read access transistor is prevented.

In data reading, the source line (e.g., SL1) in the unselected row (e.g., WWL1/RWL1) is set to the voltage level equal to that of the read voltage supplied to the read bit line (e.g., RBL1), and the source line (SL2) in the selected row is set to the voltage level lower than the read voltage supplied to the read bit line. In this case, the read access transistor (RAT) of the memory cell (MC11) in the selected column and unselected row does not pass a current independently of the gate potential as the drain and source of the read access transistor are at the same potential. The read access transistor of the memory cell (MC21) in the selected column and selected row has the source potential lower than the drain voltage, and selectively passes the current from the read bit line to the source line according to the gate potential, i.e., the voltage at the body region of the storage transistor.

In this configuration, the read bit line must be kept at a constant read voltage level during the data reading, and a constant voltage generating circuit supplies such constant read voltage to the read bit line (for preventing the unselected memory cell from passing a current due to a voltage difference between the source and the drain, and thereby preventing erroneous reading). For the above configuration, the following example configuration may be used. A source follower transistor is used to supply the read current to the selected bit line, to hold the voltage of the selected bit line at the voltage level corresponding to the gate potential of the source follower transistor. The data reading is performed by sensing the current flowing through the read bit line. In the operation of storing the H data, the current flows through the read bit line. In the operation of storing the L data, the current does not flow through the read bit line.

According to the fifth embodiment of the invention, as described above, the body region (storage node) of the storage transistor is coupled to the gate of the read access transistor. Therefore, an additional-read word line is not required for controlling the on/off state of the read access transistor according to the storage data. In this case, charge line CL is used as the read word line, and thereby only the read access transistor in the selected row can be accurately made conductive to perform the data reading so that the interconnection layout can be made simple. Further, the read word line is not required, so that the pitch conditions of the interconnections are alleviated, and the memory cells can be arranged at a high density.

The memory cell has the capacitorless structure using the accumulated charges in the body region of the storage transistor, and the scalability of the memory cells can follow the miniaturization in the process, similarly to the first to fourth embodiments already described.

Sixth Embodiment

Figure 39:
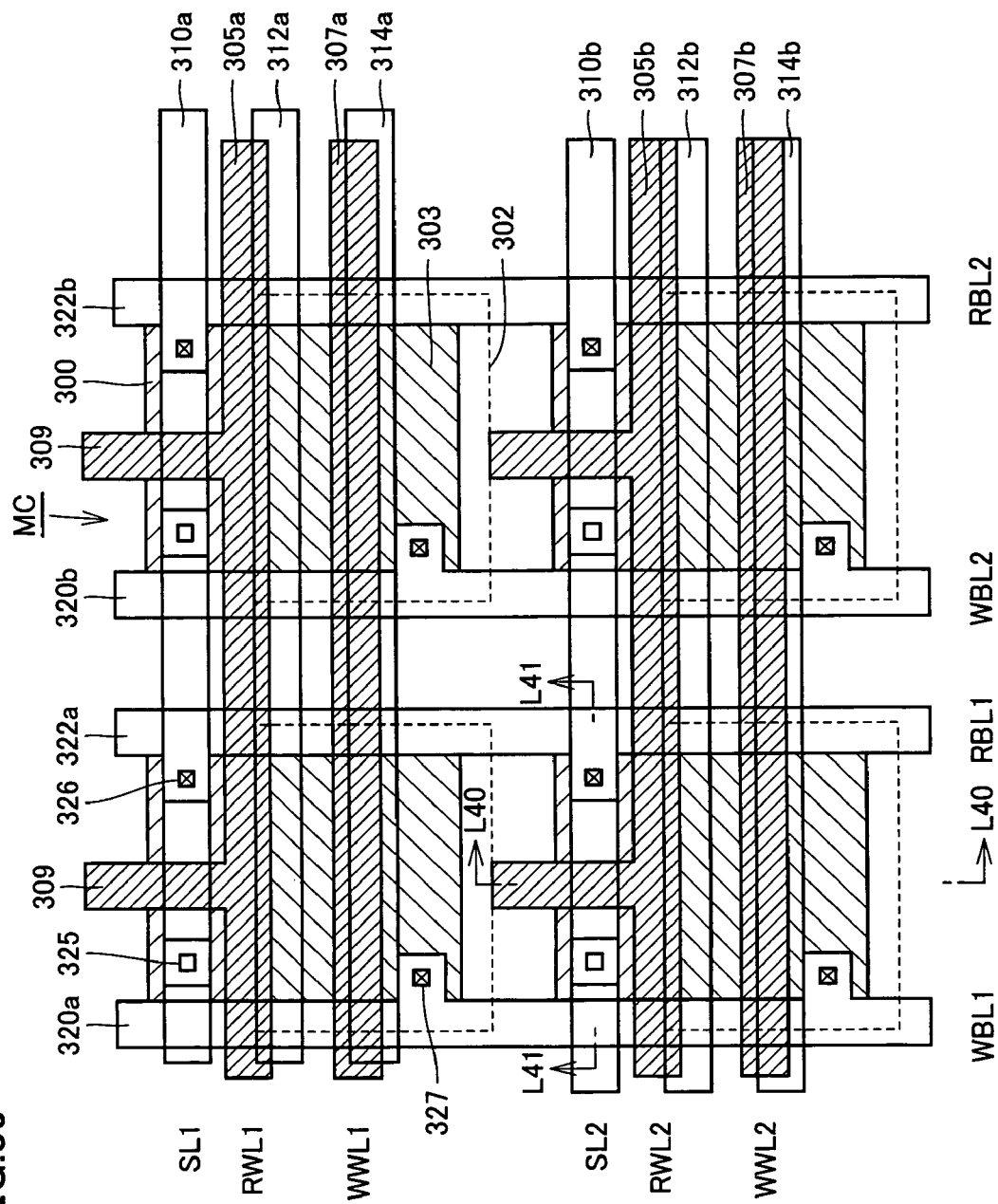
FIG. 39 schematically shows a planar layout of a memory cell array of a semiconductor memory device according to a sixth embodiment of the invention.

FIG. 39 schematically shows a layout of a memory cell array of a semiconductor memory device according to a sixth embodiment of the invention. In FIG. 39, active regions forming memory cells MC are arranged in rows and columns with spaces in between. The active region forming memory cell MC includes an N-type active region including N-type impurity region 300 and a P-type diffusion region 302 including a P-type impurity region 303. These impurity regions 300 and 303 have the same width in the X direction, and are arranged opposing to each other in the Y direction.

Gate electrode interconnections 305a and 305b are arranged extending continuously in the X direction along a boundary region between impurity regions 300 and 303. Gate electrode interconnections 307a and 307b are arranged extending continuously in the X direction parallel to gate electrode interconnections 305a and 305b with spaces in between. Gate electrode interconnections 307a and 307b are arranged crossing P-type diffusion regions 302 (P-type impurity regions). Each of gate electrode interconnections 305a and 305b has a convex interconnection (projection) 309 arranged in a region of each memory cell MC and extending across N-type impurity region 300 in the Y direction.

Second metal interconnections 310a and 310b are arranged continuously extending in the X direction to cross N-type impurity region 300. Second metal interconnections 310a and 310b form source lines SL1 and SL2, respectively.

Second metal interconnections 312a and 312b are arranged parallel to gate electrode interconnections 305a and 305b, respectively. These second metal interconnections 312a and 312b are in electrical contact with gate electrode interconnections 305a and 305b in regions which are not shown, respectively. Gate electrode interconnection 305a and second metal interconnection 312a form read word line RWL1. Gate electrode interconnection 305b and second metal interconnection 312b form read word line RWL2.

Second metal interconnections 314a and 314b are arranged parallel to gate electrode interconnections 307a and 307b. These gate electrode interconnections 307a and 307b are in electrical contact with second metal interconnections 314a and 314b at regions which are not shown, respectively. Gate electrode interconnection 307a and second metal interconnection 314a form write word line WWL1, and gate electrode interconnection 307b and second metal interconnection 314b form write word line WWL2, respectively.

First metal interconnections 320a, 322a, 320b and 322b are arranged continuously extending in the Y direction along the boundary region of memory cells MC. First metal interconnections 320a and 320b form write bit lines WBL1 and WBL2, respectively, and first metal interconnections 322a and 322b form read bit lines RBL1 and RBL2, respectively.

Second metal interconnections 310a and 310b forming source lines SL1 and SL2, respectively, are electrically connected at the formation regions of the corresponding memory cells through N-type impurity regions 300 and via/contacts 325. First metal interconnections 320a and 320b are electrically connected to P-type impurity regions 303 of the corresponding memory cells MC through write bit line contacts 327. First metal interconnections 322a and 322b forming read bit lines RBL1 and RBL2 are electrically connected to the N-type impurity regions of memory cells MC via read bit line contacts 326. Source line via/contacts 325 and read bit line contacts 326 are arranged opposing to each other with respect to projection 309 of gate electrode interconnection 305a or 305b.

In the structure of the memory cells shown in FIG. 39, charge line CL is not provided. The N-channel regions (body regions) formed immediately below gate electrode interconnections 305a and 305b forming read word lines WEL1 and RWL2 are used as the storage nodes, respectively. Therefore, the two transistor elements provide one dual-port memory cell.

Figure 40:
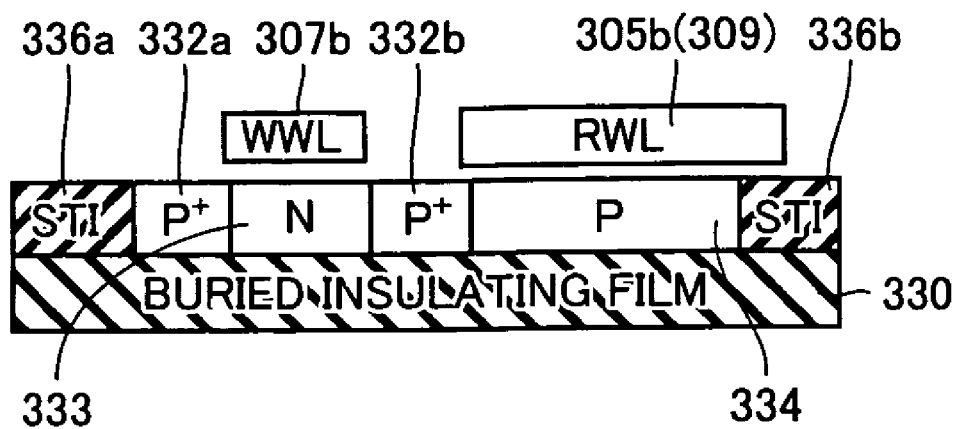
FIG. 40 schematically shows a sectional structure taken along line L40-L40 in FIG. 39.

FIG. 40 schematically shows a sectional structure taken along line L40-L40 in FIG. 39. FIG. 40 does not show second metal interconnections 310b, 312b and 314b in the upper layer for the sake of simplicity.

In FIG. 40, the active region of memory cell MC is formed at the surface of a buried insulating film (oxide film) 330. The boundary of this active region is defined by cell isolation regions 336a and 336b or STI (Shallow Trench Isolation) films. Heavily doped P-type regions 332a and 332b are formed being spaced from each other in a region between cell isolation regions 336a and 336b. These P-type regions 332a and 332b form P-type impurity regions 303 shown in FIG. 39. An N-type region 333 is formed between heavily doped P-type regions 332a and 332b. A P-type region 334 is formed between heavily doped P-type region 332b and cell isolation region 336b.

Gate electrode interconnection 307b is arranged on N-type region 333 with a gate insulating film (not shown) interposed in between. Gate electrode interconnection 305b is arranged on P-type region 334 with a gate insulating film interposed in between. Gate electrode interconnection 305b corresponds to projection 309 shown in FIG. 39.

Figure 41:
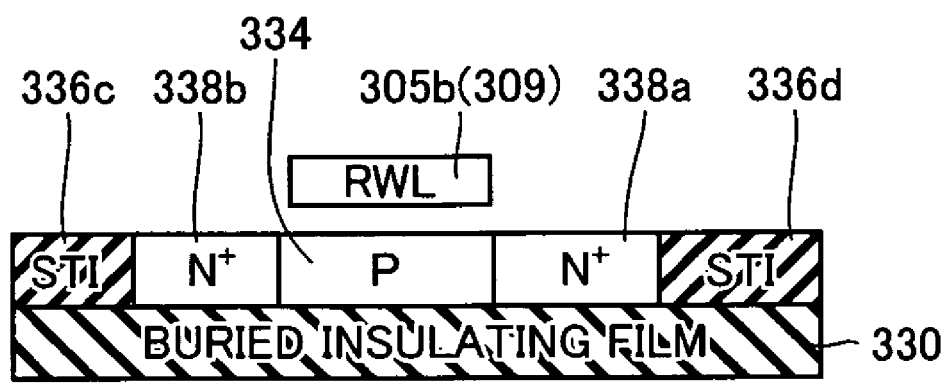
FIG. 41 schematically shows a sectional structure taken along line L41-L41 in FIG. 39.

FIG. 41 schematically shows a cross sectional structure taken along line L41-L41 in FIG. 39. FIG. 41 does not show the interconnections in the upper layer, i.e., first and second metal interconnections 320a, 320b and 310b.

In FIG. 41, heavily doped N-type regions 338a and 338b are formed being spaced from each other on buried insulating film 330. P-type region 334 is arranged between heavily doped N-type regions 338a and 338b. Heavily doped N-type regions 338a and 338 form N-type impurity regions 300 shown in FIG. 39. In the correspondence to the structure shown in FIG. 39, heavily doped N-type region 338b is connected to second metal interconnection 310b forming source line SL2 through a via/contact. Heavily doped N-type region 338a is connected to first metal interconnection 322a forming write bit line WBL1 through the contact (326).

A gate electrode interconnection 305b (projection 309) is formed on the surface of P-type region 334 with a gate insulating film (not shown) interposed in between.

As shown in FIGS. 39 to 41, memory cell MC is formed of the P-type SOI transistor and the N-type SOI transistor. Similarly to the third embodiment, the P-type transistor is used for data writing, and the N-type transistor is used for the data reading. However, a charge line is not employed in contrast to the third embodiment. The N-type SOI transistor for reading is used as the storage transistor for storing charges or data in the body region according to the charge line potential.

FIG. 42 shows specifically the arrangement of memory cell MC shown in FIG. 39. In N-type impurity region 300 of the region (active region) of memory cell MC, gate electrode interconnection 305b is formed into a reversed T-shaped form between heavily doped N-type regions 338a and 338b. The P-type body region (334) is formed under gate electrode interconnection 305b. Heavily doped N-type regions 338a and 338b are electrically connected to read bit line RBL and source line SL through contact 326 and via/contact 327.

In P-type impurity region 302, N-type region 333 is formed under gate electrode interconnection 307b. On the opposite sides of N-type region 333, heavily doped P-type regions 332a and 332b are arranged opposing to each other with respect to gate electrode interconnection 307b. Heavily doped P-type region 332b is connected to write bit line WBL through contact 327. Heavily doped P-type region 332b, P-type region 334, heavily doped N-type regions 338a and 338b, and gate electrode interconnection 305b form a storage/read access transistor SRAT for storing the data and reading the storage data. P-type region 334 forms the body region of storage/read access transistor SRAT.

Heavily doped P-type regions 332a and 332b, N-type region 333 and gate electrode interconnection 307b form a write access transistor PWAT for data writing. N-type region 333 forms a body region of write access transistor PWAT. When write access transistor PWAT is conductive, the body region of storage/read access transistor SRAT is coupled to the write bit line. In data writing, therefore, the charges transmitted from write bit line WBL to heavily doped P-type region 332b are transmitted to P-type region 334 for accumulation. Similarly to the memory cell structure of the third embodiment show in FIG. 20, therefore, the effect similar to that of the third embodiment can be achieved by writing the charges directly into the body region.

Since P-type region 334 is formed into the reversed T-shaped form, its area can be made larger than that in the memory cell structure shown in FIG. 20 so that the body region, i.e., the charge accumulation region can be increased. In storage/read access transistor SRAT, impurity regions 338b and 338a forming the source and drain regions are arranged in the extension direction of the gate electrode interconnection, opposing each other with respect to gate electrode projection 309. Therefore, the length in the Y direction (see FIG. 39) can be shorter than that in the memory cell structure shown in FIG. 20. Since the storage transistor is not employed, the sizes of the memory cell can be reduced.

Figure 43:
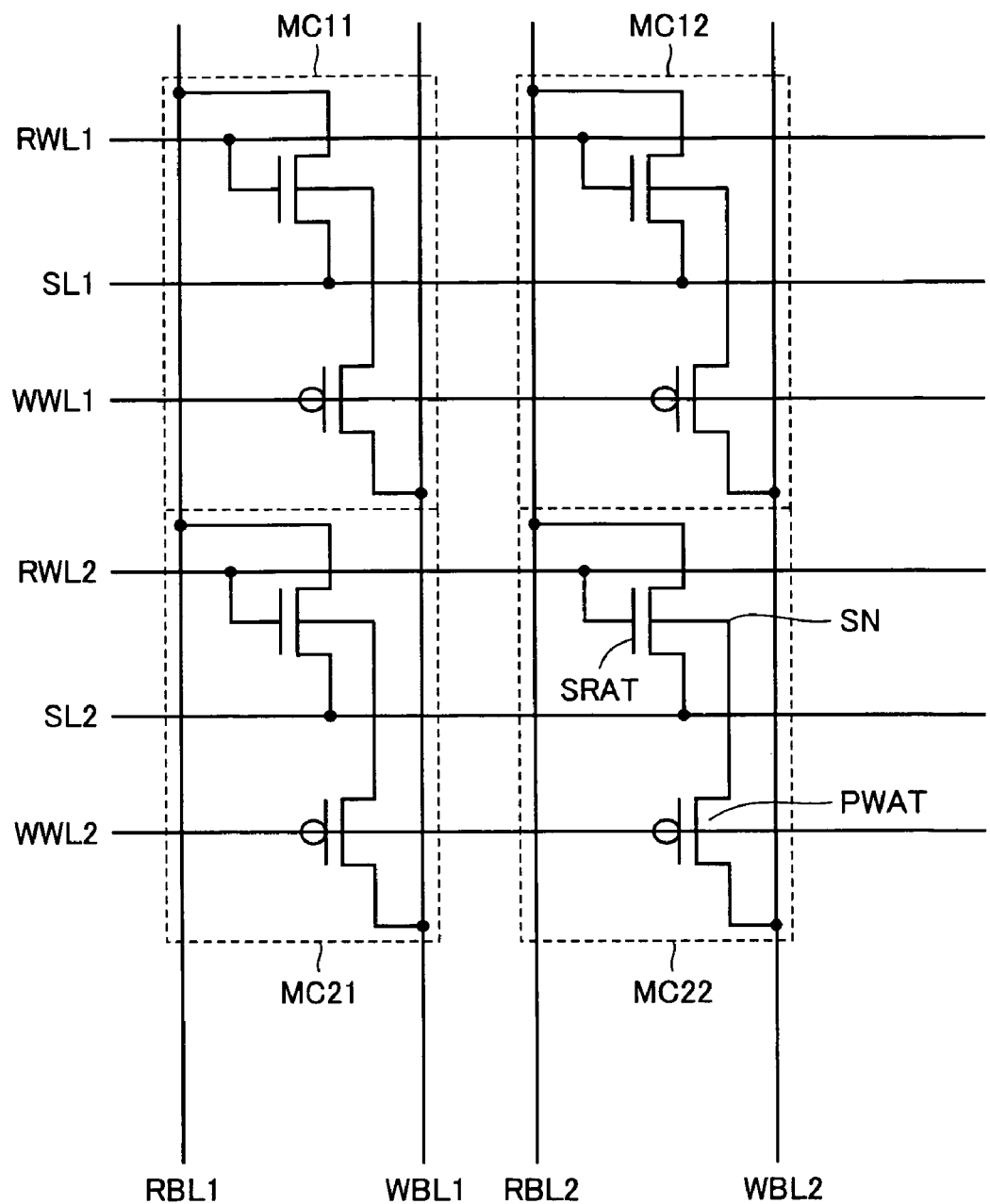
FIG. 43 shows an electrically equivalent circuit of the memory cell array shown in FIG. 39.

FIG. 43 shows an electrically equivalent circuit of the memory cells shown in FIGS. 39 to 42. FIG. 43 shows the memory cells MC11, MC12, MC21 and MC22 arranged in two rows and two columns, corresponding to the planar layout of the memory cells in FIG. 39.

Memory cell MC (generically representing MC11, MC12, MC21 and MC22) includes P-type write access transistor PWAT and N-type storage/read access transistor SRAT. P-type write access transistor PWAT has a first conduction node connected to corresponding write bit line WBL (generically representing WBL1 and WBL2), and a second conduction node connected to the body region (storage node SN) of storage/read access transistor SRAT. Storage/read access transistor SRAT has a first conduction node (source node) connected to corresponding source line SL (generically representing SL1 and/or SL2), and a second conduction no de (drain node) connected to the corresponding read bit line RBL (generically representing RBL1 and/or RBL2).

In the configuration of memory cell MC shown in FIG. 43, one storage/read access transistor SRAT in the sixth embodiment forms read access transistor ATR and storage transistor ST shown in FIG. 23, as is apparent from the comparison with the memory cell arrangement shown in FIG. 23. Therefore, the number of the transistor elements in the memory cell is reduced by one, and the memory cell size can be reduced. In memory cell MC, the write port (write bit line and write word line) is provided separately from and independently of the read port (read bit line and read word line), and the dual-port memory cell can be achieved.

Figure 44:
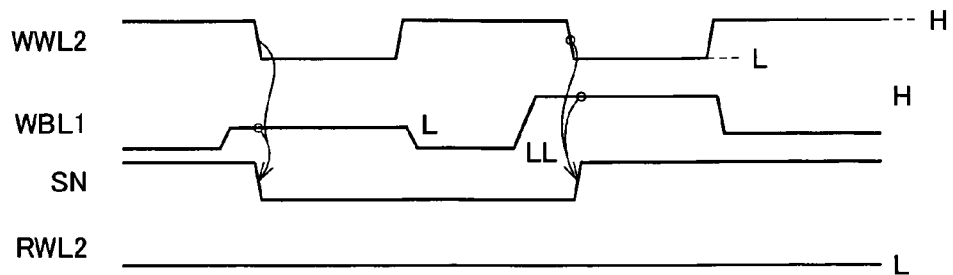
FIG. 44 is a signal waveform diagram representing operations for data writing of a storage device according to a sixth embodiment of the invention.

FIG. 44 is a signal waveform diagram representing an operation of writing data into the memory cell shown in FIG. 43. The signal waveform diagram of FIG. 44 is the same as that of FIG. 21 except for that charge line CL2 is not employed, and storage node SN is the same as the body region of read access transistor SRAT. Therefore, the operation similar to the data write operation of the third embodiment is performed. Referring to the signal waveform diagram of FIG. 44, the data write operation of the memory device shown in FIGS. 39 to 43 will be briefly described below.

In the standby state, write word line WWL2 is at the power supply voltage level, and write bit line WBL1 is at the ground voltage level. Read word line RWL2 is kept at the L level of the unselected state. Therefore, in P-type region 334 that is the body region of storage/read access transistor SRAT, a channel is not formed, and N-type regions 338a and 338b are isolated from each other. P-type region 334 also functions as the storage node, and is kept at the potential corresponding to the storage data.

Further, write word line WL1 in the standby state is at the L level or the LL level lower than the L level, and is lower than that of write word line WWL2. Therefore, in P-type write access transistor PWAT, a channel is not formed in N-type region 333, and P-type regions 332a and 332b are isolated from each other.

In writing the L data, write bit line WBL1 is first set to the L level, and subsequently write word line WWL2 is driven to the L level of the selected state. The L level of write word line WWL2 may be equal to the voltage level of write bit line WBL1, or my be lower than it. Therefore, the L level of write word line WWL in the selected state may be equal to the ground voltage level, or may be equal to the negative voltage level, similarly to the third embodiment. Preferably, the L level of write bit line WBL in the data write operation is equal to the ground voltage level, and the LL level is equal to a negative voltage level.

In selected memory cell MC21 in the above state, an inversion layer (channel) is formed at N-type region 333 shown in FIG. 42. The L level voltage of write bit line WBL1 is transmitted to P-type region 334 via P-type region 332a, N-type region 333 and P-type region 332b. Therefore, storage node SN, i.e., P-type region 334 forming the body region of storage/read access transistor SRAT is set to the L level, and the L data is written. In the memory cell on the selected row and unselected column, the write bit line is at the LL level equal to or lower than the voltage level of write word line WWL2 in the selected state, and P-type write access transistor PWAT maintains the nonconductive state. In the memory cell in the unselected row and selected column, the write word line is at the H level, and P-type write access transistor PWAT is kept in the off or nonconductive state.

After completion of the data writing, write word line WWL2 is driven to the H level of the unselected state, and write bit line WBL1 is driven to the LL level of the standby state. Accordingly, writing of the L data into memory cell MC21 shown in FIG. 43 is completed.

In writing the H data, write bit line WBL1 is driven from the LL level of the standby state to the H level. Write word line WWL2 is at the H level, and P-type write access transistor PWAT does not have a channel formed, and keeps the off state.

Subsequently, selected write word line WWL2 is driven to the L level. Accordingly, an inversion layer is formed in N-type region 333 of selected memory cell MC21, and the H level voltage on write bit line WBL1 is transmitted through P-type region 332b to storage node SN (P-type region 334) to raise the voltage level of the storage node. In this operation, read word line RWL2 is at the L level, and storage/read access transistor SRAT maintains the off state, so that the H data can be reliably written into storage node SN.

In the memory cell located in the selected row and unselected column, corresponding write bit line WBL is at the LL level, and P-type write access transistor PWAT maintains the off state. In the memory cell in the unselected row, write word line WWL is at the H level, and P-type write access transistor PWAT maintains the off state independently of the potential of the write bit line.

After the writing is completed, write word line WWL2 is driven to the H level of the power supply voltage again. Also, write bit line WBL1 is set to the LL level lower than the L level potential of write word line WWL, and P-type write access transistor PWAT is rendered nonconductive.

In this sixth embodiment of the invention, therefore, the charges are directly supplied from the write bit line into the storage node through write access transistor PWAT, to set the voltage level of the storage node. Therefore, the effect similar to that of the third embodiment can be achieved in connection with the data writing.

Figure 45:
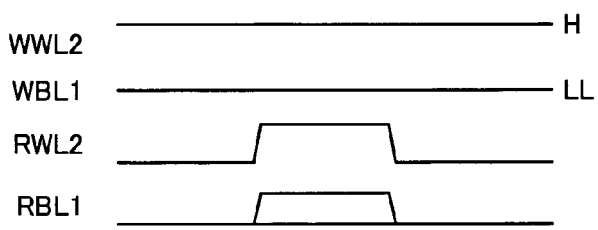
FIG. 45 represents signal waveforms in a data read operation of the storage device according to the sixth embodiment of the invention.

FIG. 45 shows operation waveforms appearing in the operation of reading data from memory cell MC21 shown in FIG. 43. The signal waveform diagram of FIG. 45 is the same as that of FIG. 22 except for that charge line CL2 is not employed. Referring to FIG. 45, the operation of reading the storage data from memory cell MC 21 shown in FIG. 43 will be briefly described below.

In the data reading operation, write word line WWL2 is kept at the H level of the unselected state. Also, write bit line WBL1 is kept at the LL level of the standby state. Read word line RWL2 is driven from the L level of the unselected state to the H level of the selected state. In this case, the threshold voltage of storage/read access transistor SRAT depends on the storage data of P-type region 334 or storage node SN, and storage/read access transistor SRAT is turned on or off depending on the storage data. Read bit line RBL1 is kept at the ground voltage level. Source line SL is at the H level of the power supply voltage.

When the storage data of memory cell MC21 is the H data, the potential of storage node SN or the body region of storage/read access transistor SRAT is high, and the threshold voltage thereof is low. Therefore, when the H data is stored, storage/read access transistor SRAT keeps the on state, and read bit line RBL1 is supplied with the current from the source line. When storage/read access transistor SRAT stores the L data, and the threshold voltage thereof is high, storage/read access transistor SRAT is in the off state, and a current is not supplied from source line SL to read bit line RBL1. By sensing the current of read bit line RBL1, the data reading can be performed.

As compared with the configurations of the memory cells of the third embodiment, in this sixth embodiment, the charge transistor for data storage is not required, and the memory cell size can be further reduced. Except for this effect, the six embodiment can achieve substantially the same effect and operations as the third embodiment.

For the process of manufacturing the memory cells in the sixth embodiment, a manufacturing process of ordinary SOI transistors can be used. Specifically, openings are formed for the respective N- and P-type impurity implantation regions after forming the body region and the gate electrode interconnection. Ion implantation of N-type and P-type impurities are performed at a low impurity concentration through these openings to form the body region and lightly doped source/drain impurity regions. Thereafter, openings are formed for heavily doped N-type impurity region and for heavily doped P-type impurity region, and the N- and P-type impurities are implanted at a high impurity concentration to form the source/drain regions. Thus, the memory cell transistor can be formed through the formation process of the ordinary SOI transistor. However, another manufacturing process for the memory cell transistors, which can be applied to the first to fifth embodiments, will now be described with reference to FIGS. 46 to 48.

Figure 46A:
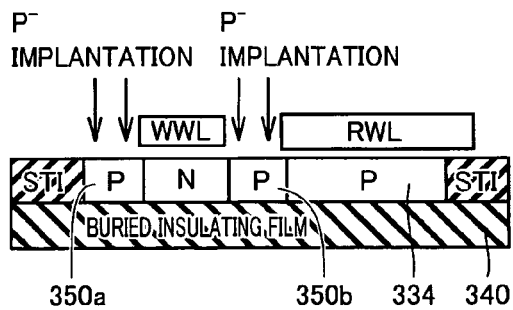
FIG. 46A illustrates a P-type impurity implanting step in a memory cell manufacturing process of the sixth embodiment.
Figure 46B:
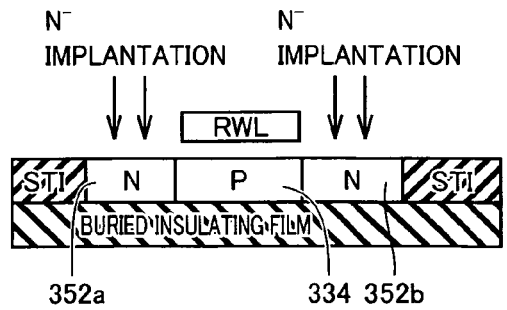
FIG. 46B illustrates a step of implanting an N-type impurity into the memory cell.
Figure 47A:
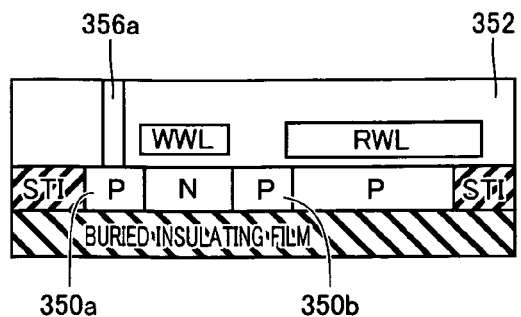
FIG. 47A illustrates the P-type impurity implanting step in the memory cell manufacturing process of the sixth embodiment.
Figure 47B:
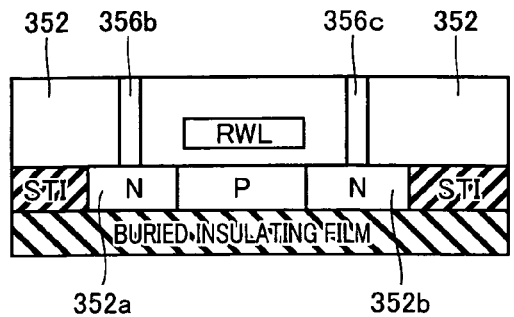
FIG. 47B illustrates the step of implanting the N-type impurity into the memory cell.
Figure 48A:
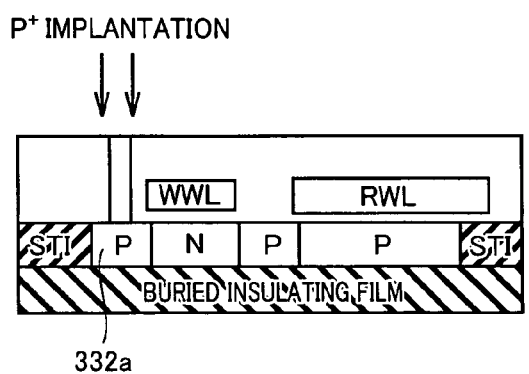
FIG. 48A illustrates the P-type impurity implanting step in the memory cell manufacturing process of the sixth embodiment according to the invention.
Figure 48B:
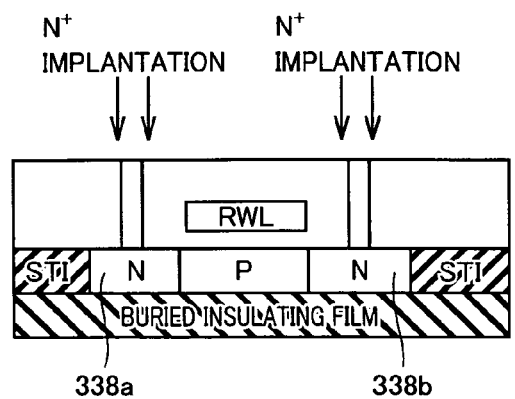
FIG. 48B illustrates the step of implanting the N-type impurity into the memory cell.

FIGS. 46A, 47A and 48A show P-type impurity implantation steps in the sectional structures taken along line L40-L40 in the planar layout of FIG. 39. FIGS. 46B, 47B and 48B show N-type impurity implantation steps in the sectional structures taken along line L41-L41 in the planar layout of FIG. 39. The P-type impurity implantation is performed through the steps different from those for the N-type impurity implantation.

In FIG. 46A, N- and P-type regions 333 and 334 as well as gate electrode interconnections 307b and 305b are first formed on a buried insulating film 340 through ordinary steps. Then, an opening is formed for a P-type impurity implantation region. Then, ion implantation of the P-type impurities is performed at a low concentration on regions 350a and 350b using, as the mask, gate electrode interconnections 307b and 305b. These regions 350a and 350b will be heavily doped P-type regions (source/drain regions) 332a and 332b later, respectively.

In FIG. 46B, buried insulating film 340, P-type region 334 and gate electrode interconnection 305b are formed, and then an opening is formed in a region to be lightly doped with the N-type impurities. In this case, the N-type impurities are implanted at a low concentration into the regions 352a and 352b through gate electrode interconnection 305b. Regions 352a and 352b will be heavily doped N-type regions 338a and 338b later, respectively. P-type impurity implanting steps may be performed before the N-type impurity implanting steps, or may be after.

Referring to FIG. 47A, after lightly implanting the P-type impurities as shown in FIG. 46A, an interlayer insulating film 352 is formed over the whole substrate surface. Thereafter, a through hole 356a is formed in interlayer insulating film 352 for region 350a to be the heavily doped P-type impurity region.

For the N-type impurities, as shown in FIG. 47B, through holes 356b and 356c are formed in interlayer insulating film 352, which is formed after lightly implanting the N-type impurities as shown in FIG. 46B.

In FIG. 48A, after forming the through hole as shown in FIG. 47A, P-type impurities are implanted at a high concentration via through hole 356a, to increase the concentration of the P-type impurities in region 350a for forming heavily doped P-type region 332a. Interlayer insulating film 352 prevents the ion implantation into the other regions.

In FIG. 48B, after forming the through hole as shown in FIG. 47B, the N-type impurities are implanted via through holes 356b and 356c, to increase the impurity concentration in regions 352a and 352b for forming heavily doped N-type regions 338a and 338b.

In the above manufacturing process, P-type region 350b adjacent to the body region of storage/read access transistor SRAT is a lightly doped impurity region. However, there is no particular problem because P-type region 350b is merely required to transfer the charges to the body region of storage/read access transistor SRAT. When P-type region 350b is to be a heavily doped region, a further through hole is formed to implant P-type impurities at a high concentration.

In the steps shown in FIGS. 47A, 47B, 48A and 48B, in the case when interlayer insulating film 352 is formed and the through hole for the impurity implantation is formed, the P-type impurities are to be implanted, the through hole for implanting the N-type impurities is not formed. Conversely, for the implantation of the N-type impurities, the through hole for implanting the P-type impurities is not formed. The implantation steps of the N- and P-type impurities are performed in different steps. After the steps shown in FIGS. 48A and 48B are completed, the through holes are formed again, and contacts for the first metal interconnections are formed. Then, the first metal interconnections are formed, to form the write bit lines and the read bit lines and also the intermediate layers for forming the vias for the source lines.

As shown in FIGS. 46A and 46B to 48A and 48B, the through holes are formed in the interlayer insulating film and the ion implantation is selectively performed, so that the heavy doping with the impurities can be performed on only the required regions to form the heavily doped impurity regions. After the impurities are implanted by the ion implantation via through holes 356a-356c, a heat treatment is performed to diffuse the implanted impurities so that the impurity concentration of each region can be increased.

By performing the impurity ion implantation via the through holes, the impurities can be reliably implanted at high concentrations into the required regions, even when the gate electrode interconnection has the T-shaped form as shown in FIG. 42, for example, and the conductivity types on the opposite sides of the read gate electrode interconnection are different from each other. Without arranging the isolation region, the write access transistor and the storage/read access transistor, which are different in conductivity types, can be apposed.

The manufacturing process shown in FIGS. 46A and 46B to 48A and 48B can be used also as the manufacturing process for the memory cell transistors of the first to fifth embodiments.

[Modification]

Figure 49:
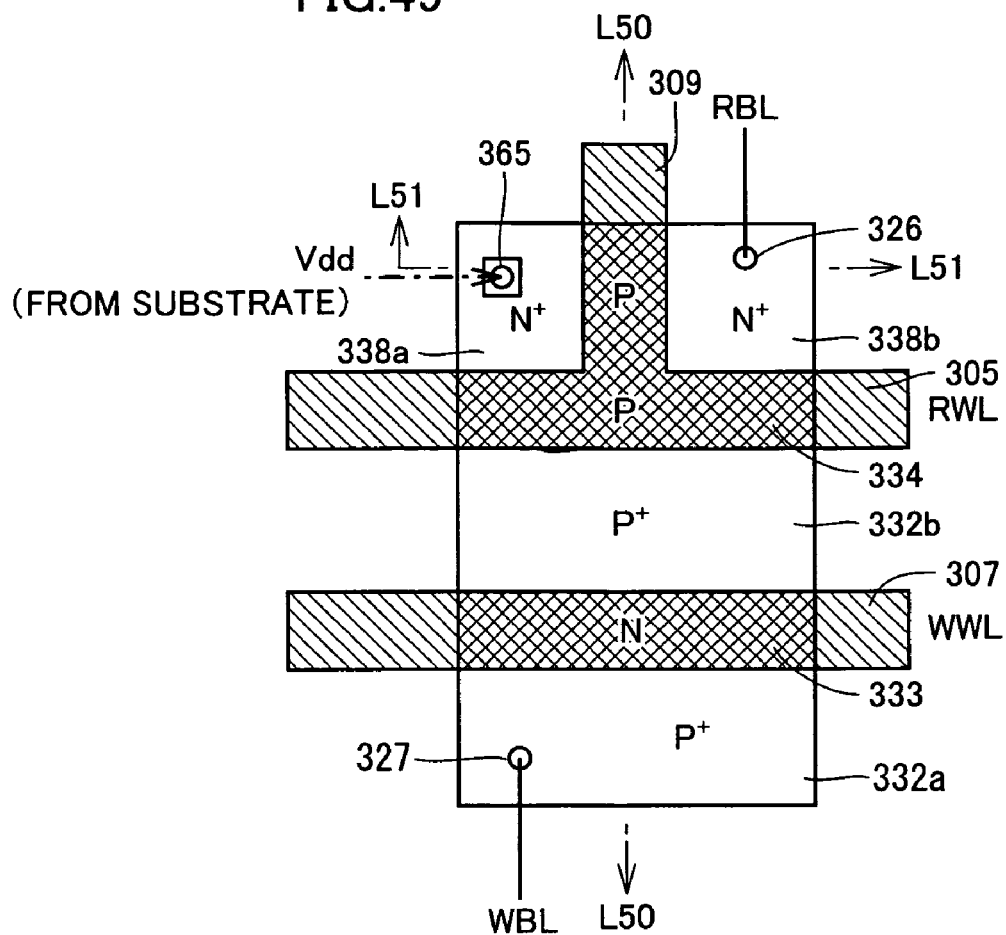
FIG. 49 schematically shows a planar layout of a memory cell in a modification of the sixth embodiment of the invention.

FIG. 49 schematically shows a planar layout of memory cell MC according to a modification of the sixth embodiment of the invention. Memory cell MC shown in FIG. 49 differs from that of the planar layout shown in FIG. 42 in the following structure. Heavily doped N-type region 338a forming the source region of the storage/read access transistor is not connected to source line SL, but is supplied with a power supply voltage Vdd from the substrate side via a through hole (contact) 356 at a lower side. Other structures in the planar layout of the memory cell shown in FIG. 49 are the same as those of the memory cell shown in FIG. 42. The corresponding portions are allotted the same reference numerals, and description thereof is not repeated.

Figure 50:
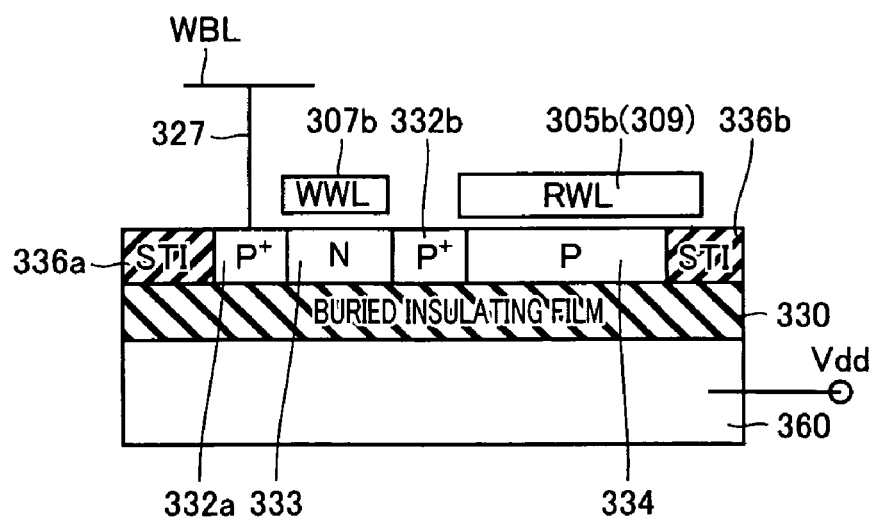
FIG. 50 schematically shows a sectional structure taken along line L50-L50 in FIG. 49.

FIG. 50 schematically shows a sectional structure taken along line L50-L50 shown in FIG. 49. In the structure shown in FIG. 50, buried insulating film 330 is formed at a surface of a semiconductor substrate region 360. Semiconductor substrate region 360 is supplied with power supply voltage Vdd as a bias voltage. Heavily doped P-type region 332a is coupled to write bit line WBL via contact 327. Other sectional structures of the memory cell shown in FIG. 50 are the same as those shown in FIG. 40. The corresponding portions are allotted the same reference numerals, and description thereof is not repeated.

Semiconductor substrate region 360 may be a substrate at a wafer level, or may be a well region formed in a region where the memory cell array is arranged. Buried insulating film 330 is formed in this well region, and an opening is formed in buried insulating film 330 to form a source contact. After epitaxially growing a silicon film, the memory cell transistor is formed by the process, e.g., as shown in FIGS. 46A and 46B to 48A and 48B.

Figure 51:
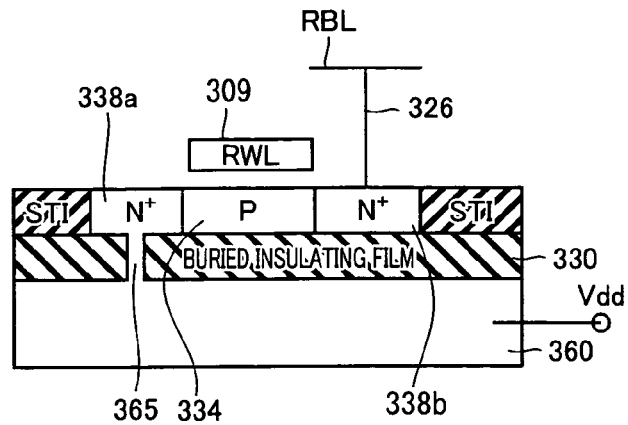
FIG. 51 schematically shows a sectional structure taken along line L51-L51 in FIG. 49.

FIG. 51 schematically shows a sectional structure taken along line L51-L51 shown in FIG. 49. In FIG. 51, heavily doped N-type impurity region 338a is electrically connected to substrate 360 via a through hole (contact) 365 formed in buried insulating film 330. Heavily doped N-type region 338b is connected to read bit line RBL via contact 326. P-type region 334 serving as the body region of the storage/read access transistor is arranged between heavily doped N-type regions 338a and 338b. Gate electrode 309 forming read word line RWL is arranged on P-type region 334.

Contact (through hole) 365 is formed in advance before epitaxially growing the silicon film on embedded insulating film 330.

Figure 52:
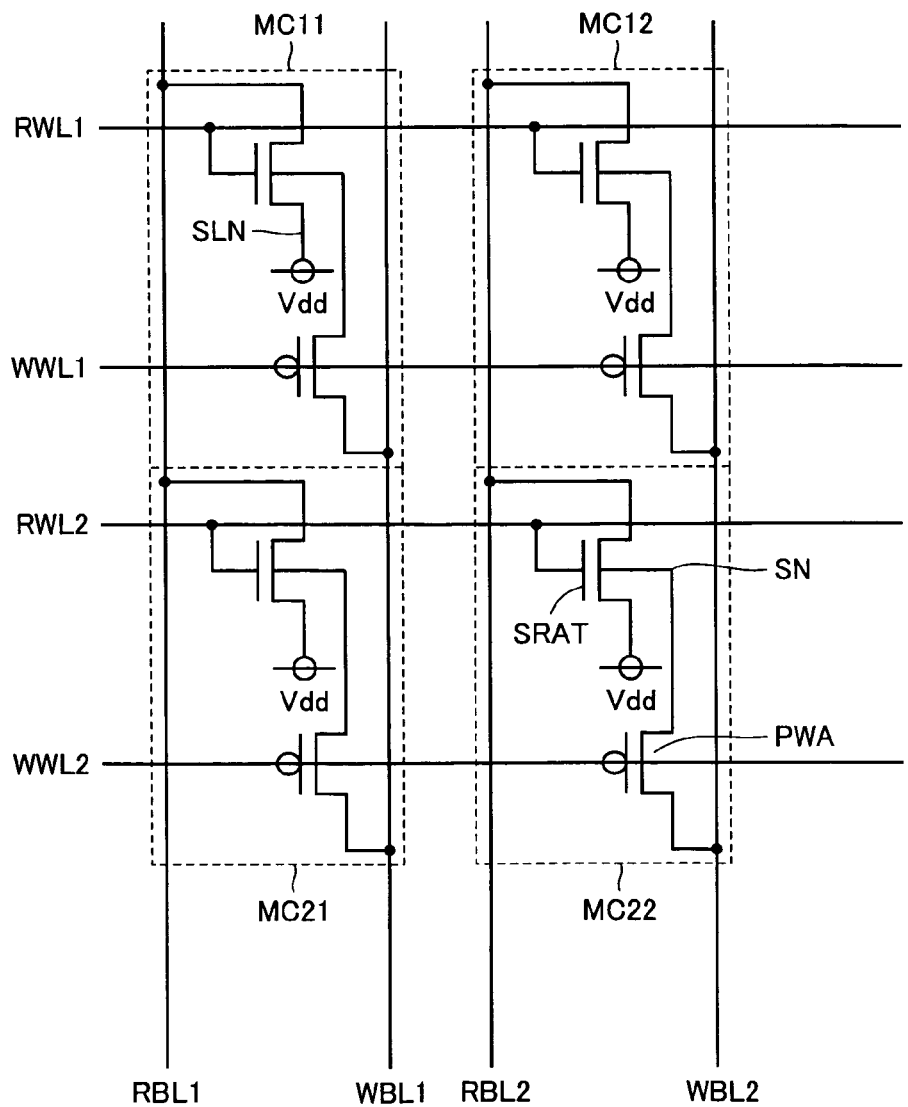
FIG. 52 schematically shows an electrically equivalent circuit of a memory cell array in the modification of the sixth embodiment of the invention.

FIG. 52 shows an electrically equivalent circuit of the memory cell array of the modification of the sixth embodiment of the invention. The electrically equivalent circuit shown in FIG. 52 differs from that circuit shown in FIG. 43 in the following configuration. In each of memory cells MC11, MC12, MC21 and MC22, the source node of storage/read access transistor SRAT is coupled to a power supply node Vdd. Source lines SL (SL1 and SL2) are not arranged. Therefore, the region where source lines SL are arranged can be used as an interconnecting region for arranging the read and write word lines, and the pitch conditions on the second metal interconnections are alleviated.

A planar layout of this memory cell array is the same as the interconnection layout of the memory cell array shown in FIG. 39 except for the layout relating to first metal interconnections 310a and 310b forming source line SL.

Heavily doped P-type region 332b may be replaced with a lightly doped P-type impurity region as shown in FIGS. 47A and 48A.

The memory cell structure shown in FIGS. 51 and 52 can be applied to the first and second embodiments in which source line SL is fixed to the power supply voltage level.

According to the sixth embodiment of the invention, as described above, the storage transistor and the read access transistor are formed of the one common transistor, and accordingly, the memory cell size can be reduced. The gate electrode of the storage/read access transistor has a reversed T-shaped form, and impurity regions that form source and drain regions of the storage/read access transistor, respectively, can be opposed to each other with respect to the gate electrode projection forming the leg of this reversed T-shaped. Thereby, the write access transistor and the storage/read access transistor can be distinctly isolated from each other in one memory cell formation region. Also, one conduction node (drain) of the write access transistor may be reliably connected to the body region of the storage/read access transistor. Further, the body region structure of the reversed T-shaped form of the storage/read access transistor can increase the area of the charge accumulation node, and the potential change according to the storage data can be accurately caused in the body region (storage node).

Seventh Embodiment

Figure 53:
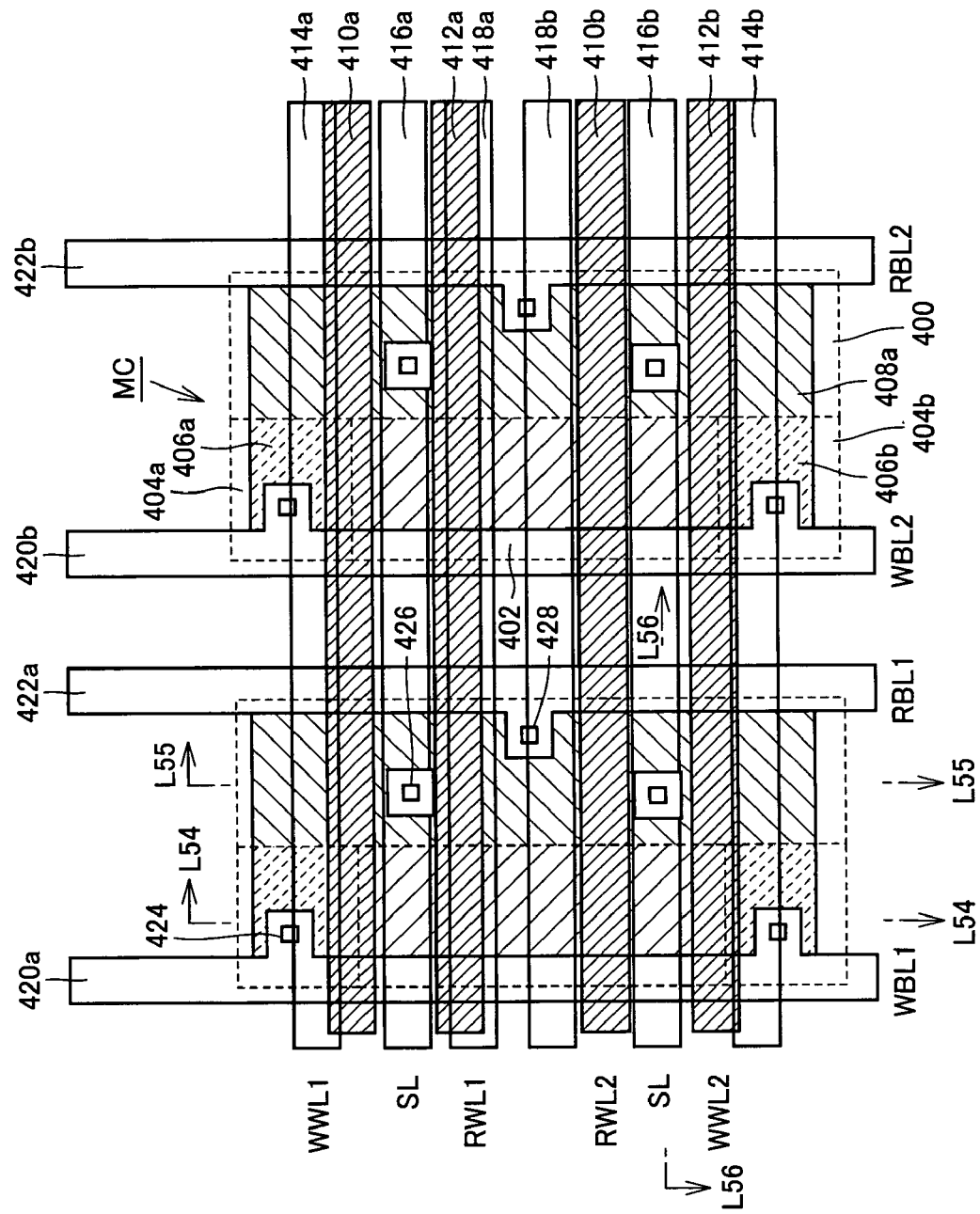
FIG. 53 schematically shows a planar layout of a memory cell array of a semiconductor memory device according to a seventh embodiment of the invention.

FIG. 53 schematically shows a planar layout of an array of a semiconductor memory device according to a seventh embodiment of the invention. In FIG. 53, an active region is continuously formed commonly to two memory cells MC adjacent to each other in the Y direction. In the active region for these two memory cells, an N-type active region 400 is formed continuously in the Y direction. N-type active region 400 includes a heavily doped N-type region 408a.

In this memory cell active region, heavily doped P-type impurity regions 404b and 404a are arranged adjacent to and opposite sides of N-type active region 400. A P-type impurity region 402 is arranged between heavily doped P-type impurity regions 404a and 404b, which in turn include P-type regions 406a and 406b, respectively.

Gate electrode interconnections 410a, 412a, 410b and 412b are arranged with spaces and extending continuously in the X direction. A second metal interconnection 414a is arranged above and parallel to gate electrode interconnection 410a. A second metal interconnection 418a is arranged above and parallel to gate electrode interconnection 412a. A second metal interconnection 418a extending in the X direction is arranged parallel to gate electrode interconnection 410a. A second metal interconnection 416b is arranged extending in the X direction in a layer above a region between gate electrode interconnections 410b and 412b. A second metal interconnection 414b is arranged extending straight in the X direction parallel to gate electrode interconnection 412b.

Gate electrode interconnection 410a and second metal interconnection 414a form write word line WWL1. A second metal interconnection 416a forms source line SL1, and is connected electrically to an underlying N-type impurity region through a source line via/contact 426.

Gate electrode interconnection 412a and second metal interconnection 418a form read word line RWL1. Gate electrode interconnection 410b and a second metal interconnection 418b form read word line RWL2. Second metal interconnection 416b forms source line SL2, and is likewise connected electrically to the underlying N-type region through source line via/contact 426.

Gate electrode interconnection 412b and second metal interconnection 414b form write word line WWL2.

In the memory cell array arrangement, first metal interconnections 420a, 422a, 420b and 422b are arranged continuously extending in the Y direction along the boundary regions of the active regions of the respective memory cells. First metal interconnections 420a and 420b are electrically connected to underlying, heavily doped P-type regions 406a and 406b through contacts 424. First metal interconnections 422a and 422b are electrically connected to the underlying N-type impurity regions through contacts 428.

First metal interconnections 420a and 420b form write bit lines WBL1 and WBL2, respectively. First metal interconnections 422a and 422b form read bit lines RBL1 and RBL2, respectively.

Figure 54:
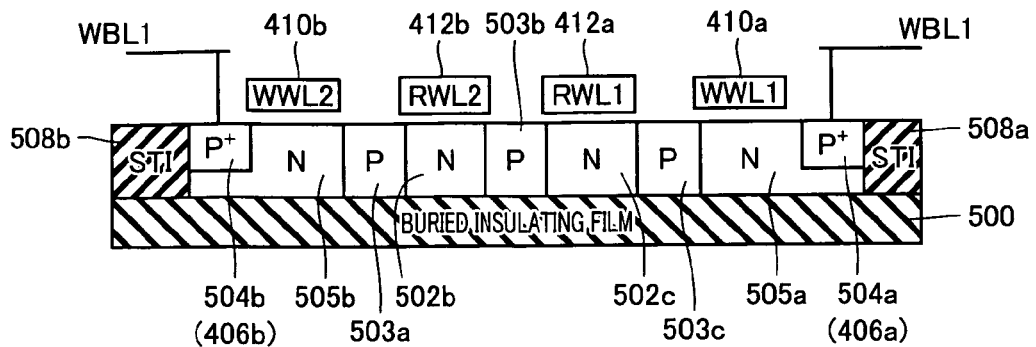
FIG. 54 schematically shows a sectional structure taken along line L54-L54 in FIG. 53.

FIG. 54 schematically shows a sectional structure taken along line L54-L54 in FIG. 53. In FIG. 54, an active region for forming the memory cell is formed on a buried insulating film 500, and a boundary of this active region for forming the memory cell is defined by cell isolation regions (STI) 508a and 508b.

N-type regions 505a and 505b are formed on buried insulating film 500. N-type region 408a shown in FIG. 53 includes these N-type regions 505a and 505b. A heavily doped P-type region 504a is formed at the surfaces of N-type regions 505a and 505b. A heavily doped P-type region 504b is formed at the surface of N-type region 505b. These heavily doped P-type regions 504a and 504b are formed shallow, and N-type regions 505a and 505b extend at the bottoms of heavily doped P-type regions 504a and 504b, respectively.

These heavily doped P-type regions 504a and 504b are connected to write bit line WBL1 through contacts 424. Heavily doped P-type regions 504a and 504b correspond to P-type regions 406a and 406b shown in FIG. 53.

P-type regions 503c-503a and N-type regions 502c and 502b are arranged alternately between N-type regions 505a and 505b. Each of P-type regions 503c-503a and N-type regions 502c and 502b is formed deep to reach buried insulating film 500.

Gate electrode interconnections 410a, 412a, 412b and 410b are arranged on the surfaces of N-type regions 505a, 505b, 502c and 502b with a gate insulating film (not shown) interposed in between. Gate electrode interconnection 410a forms write word line WWL1, and gate electrode interconnection 412a forms read word line RWL1. Gate electrode interconnection 412b forms read word line RWL2, and gate electrode interconnection 410b forms write word line WWL2.

Figure 55:
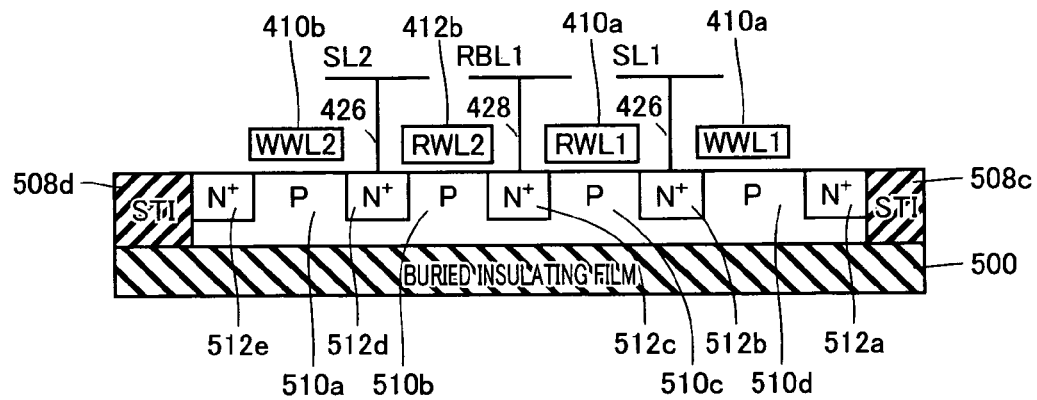
FIG. 55 schematically shows a sectional structure taken along line L55-L55 in FIG. 53.

FIG. 55 schematically shows a sectional structure taken along line L55-L55 in FIG. 53. In the structure shown in FIG. 55, a P-type region 510 is continuously formed at the surface of embedded insulating film 500. In P-type region 510, there is provided, at its surface, channel formation regions 510a-510d. Heavily doped N-type regions 512a-512e are formed sandwiching channel formation regions 510a-510d.

Gate electrode interconnections 410b, 412b, 412a and 410a are formed on channel formation regions 510a-510d with a gate insulating film (not shown) interposed in between, respectively. Heavily doped N-type region 512b is electrically connected to source line SL1 via/contact 426. Heavily doped N-type region 512c is connected to read bit line RBL1 via contact 428. Heavily doped N-type region 512d is connected to source line SL2 via via/contact 426.

Figure 56:
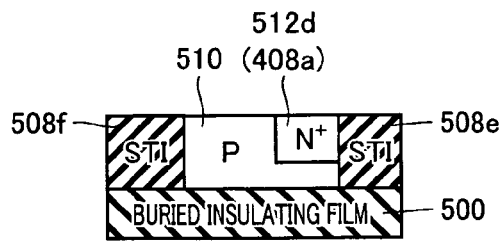
FIG. 56 schematically shows a sectional structure taken along line L56-L56 in FIG. 53.

FIG. 56 schematically shows a sectional structure taken along line L56-L56 in FIG. 53. In FIG. 56, heavily doped N-type region 512d (408a) is formed at the surface of P-type region 510. Heavily doped N-type region 512d has a shallow implantation depth, and P-type region 510 extends to the bottom of heavily doped N-type region 512d. Heavily doped N-type region 512d corresponds to N-type impurity region 408a shown in FIG. 53, and is connected to the source line (SL2) through a via/contact, although FIG. 56 does not show source line SL.

As shown in FIGS. 54 to 56, the heavily doped P-type region is formed shallowly at the surface of the N-type region, and the heavily doped N-type region is formed shallowly at the surface of the P-type region. The impurity implantation is not performed on the same region in two implantation steps of the light doping and the heavy doping. The implantation for the light doping is not performed on the heavily doped region, and only the heavy doping process is performed on the heavily doped region.

Figure 57:
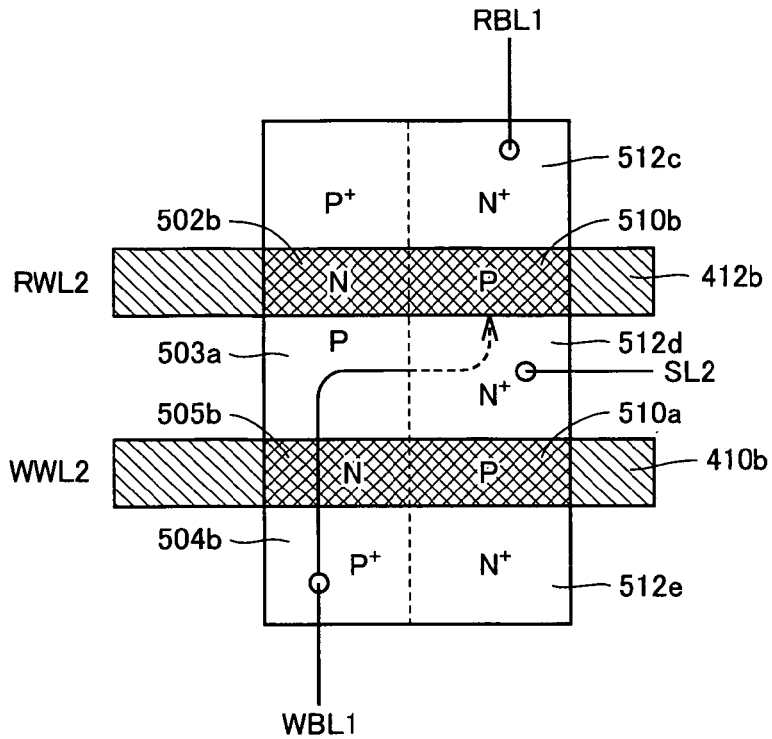
FIG. 57 schematically shows a rear layout of the memory cell together with a flow of charges (holes) in the seventh embodiment of the invention.

FIG. 57 schematically shows a planar layout of memory cell MC according to a seventh embodiment of the invention. In FIG. 57, heavily doped N-type region 512c is provided adjacent to P-type region 503b. Read bit line RBL1 is connected to heavily doped N-type region 512c.

N-type region 502b and P-type region 510b are formed adjacent to P-type region 503b and heavily doped N-type region 512c, respectively. Gate electrode interconnection 412b forming read word line RWL2 is arranged above these regions 502b and 510b.

P-type region 503a and heavily doped N-type region 512d are arranged adjacent to N-type region 502b and P-type region 510b, respectively. N- and P-type regions 505b and 510a are arranged adjacent to these regions 503a and 512d, respectively. Gate electrode interconnection 414b forming write word line WWL2 are arranged overlapping N- and P-type regions 505b and 510a, respectively. Heavily doped P-type impurity region 504b and heavily doped N-type impurity region 512e are arrange adjacent to the regions 505b and 510a, respectively.

Heavily doped P-type region 504b is electrically connected to write bit line WBL1. Heavily doped N-type region 512c is electrically connected to read bit line RBL1 via a contact.

As is clear from the sectional structures in FIGS. 54 to 56, P-type region 510 extends at the bottom of heavily doped N-type regions 510c, 510d and 512e. Also, N-type region 505b extends at the bottom of heavily doped P-type region 504b. Under heavily doped N-type region 512d, P-type region 503a is electrically connected to P-type regions 510 and 510b. Therefore, P-type region 503a continues to and is electrically connected to the body region of the N-type transistor formed of heavily doped N-type regions 512a, 512b and 510c.

Figure 58:
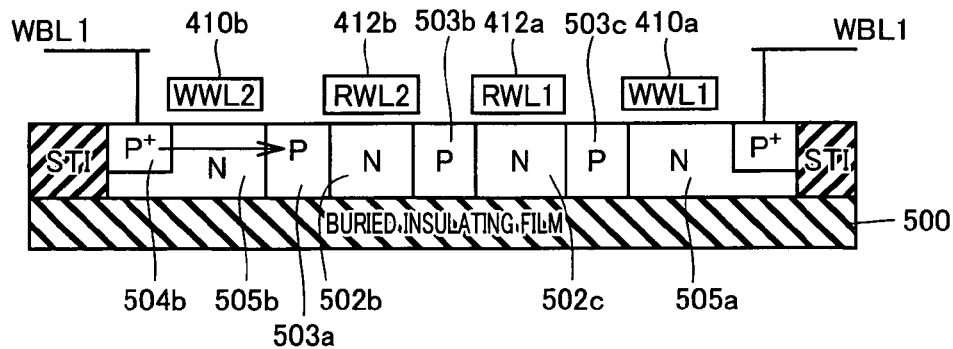
FIG. 58 schematically illustrates a path of the charges (holes) flowing through a write access transistor in a data write operation of the memory cell shown in FIG. 57.
Figure 59:
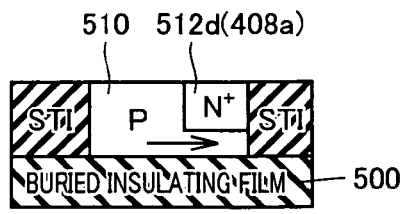
FIG. 59 illustrates a flow of the charges to a source node in the memory cell shown in FIG. 57.
Figure 60:
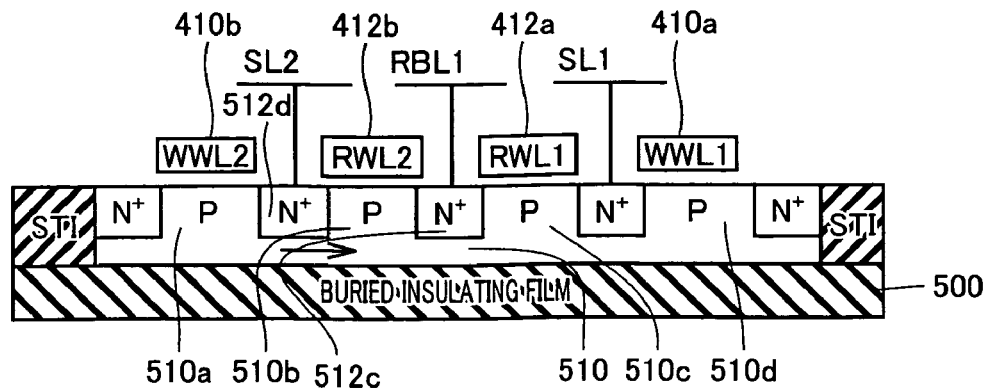
FIG. 60 schematically illustrates a flow of the charges to a substrate region of the memory cell shown in FIG. 57.

In memory cell MC of the structure shown in FIG. 57, P-type regions 504b and 503a as well as gate electrode 505b form P-type write access transistor PWAT. N-type regions 512d and 512c as well as gate electrode interconnection 412a form N-type storage/read access transistor SRAT. Therefore, the electrically equivalent circuit of the memory cell is the same as that of the memory cell of the sixth embodiment as previously described. The signal waveforms in the data write operation are the same as those shown in FIGS. 44 and 45. Therefore, specific write/read operations will not be described below, and flows of electric charges in the data write operation will now be described with reference to FIGS. 58 to 60. FIGS. 58 to 60 show the flows of currents in the case when write word line WWL2 is selected.

In the data write operation, write word line WWL2 is first set to the L level. In this case, as shown in FIG. 58, write bit line WBL2 is electrically connected to P-type region 503a through heavily doped P-type region 504b and the channel at the surface of N-type region 505b, and the charges corresponding to the storage data are transmitted to P-type region 503a. As described above, P-type region 503a is electrically connected to P-type region 510 formed at the bottom of the N-type transistor formation region. Source line SL2 is at the power supply voltage level. Therefore, a depletion layer becomes narrow in P-type region 510 under heavily doped N-type region 512d, and the transfer path of the charges is acquired. Charges move from the write bit line to P-type region 510b, and are accumulated therein. Thereby, the body region of storage/read access transistor SRAT can accumulate the charges corresponding to the storage data.

Selected write word line WWL2 is at the L level, and a channel is not form in P-type region 510a under the write word line. In this state, N-type regions 512e and 512d are electrically isolated from each other.

On the opposite sides of N-type region 502b, lightly doped P-type impurity regions 503a and 503b are arranged, respectively. Read word line RWL2 is at the L level. A channel is not formed at the surface of N-type region 502b. Therefore, P-type impurity regions 503a and 503b are kept being isolated from each other. N-type region 502b functions as a charge transfer blocking layer, and defines the path for transferring the charges. In P-type region (channel formation region) 510*b*, the channel is not formed so that storage/read access transistor SRAT maintains the off state. A current (holes) flows from P-type region 503*a* into P-type impurity region 510*b* through P-type region 510 under N-type impurity region 512*d* so that the threshold voltage of storage/read access transistor SRAT changes.

Therefore, even in the structure in which the P-type region is continuously formed for the two bits of memory cells, the body region of storage/read access transistor SRAT of the selected memory cell can reliably accumulate the charges corresponding to the storage data.

Specifically, P-type region 510 is formed under heavily doped N-type impurity region 512*d* connected to source line SL2, and charges can be transferred through P-type region 510.

As shown in FIG. 60, read bit line RBL1 is at the L level, and the further transfer of the charges to the body region under read word line RWL1 is suppressed. Since the body region of write access transistor PWAT does not accumulate the charges, the threshold voltage of the transistor-PWAT does not change. The charges are merely accumulated in the body region of storage/read access transistor SRAT connected to a read bit line RBLa, and the threshold voltage of the transistor SRAT changes.

When write word line WWL2 rises to the H level after completion of the writing, P-type regions 503*a* and 504*b* are isolated from each other, and reverse flow of the supplied charges to write bit line WBL1 does not occur.

When write word line WWL2 is driven to the H level of the unselected state, a channel is formed in P-type region 510*a*, and heavily doped N-type regions 512*d* and 512*e* are electrically coupled with each other. However, N-type region 512*e* is isolated from the write and read bit lines, and a particular problem does not occur.

In the structure according to the seventh embodiment of the invention, memory cell MC can be formed of two transistors of a write access transistor and a storage/read access transistor, and an effect similar to that of the sixth embodiment can be achieved. In the direction of extension of read and write bit lines RBL and WBL, it is not necessary to arrange a cell isolation region (STI isolation region) for isolating the memory cells, and two memory cells can be continuously arranged. Therefore, when the cell transistor arrangement is the same as that of single-port TTRAM disclosed in the article 3 or 4, the memory cells can be arranged at a high density to achieve a high-density dual-port RAM.

For the manufacturing process of the memory cells, the manufacturing process as described in the sixth embodiment can be employed.

Eighth Embodiment

Figure 61:
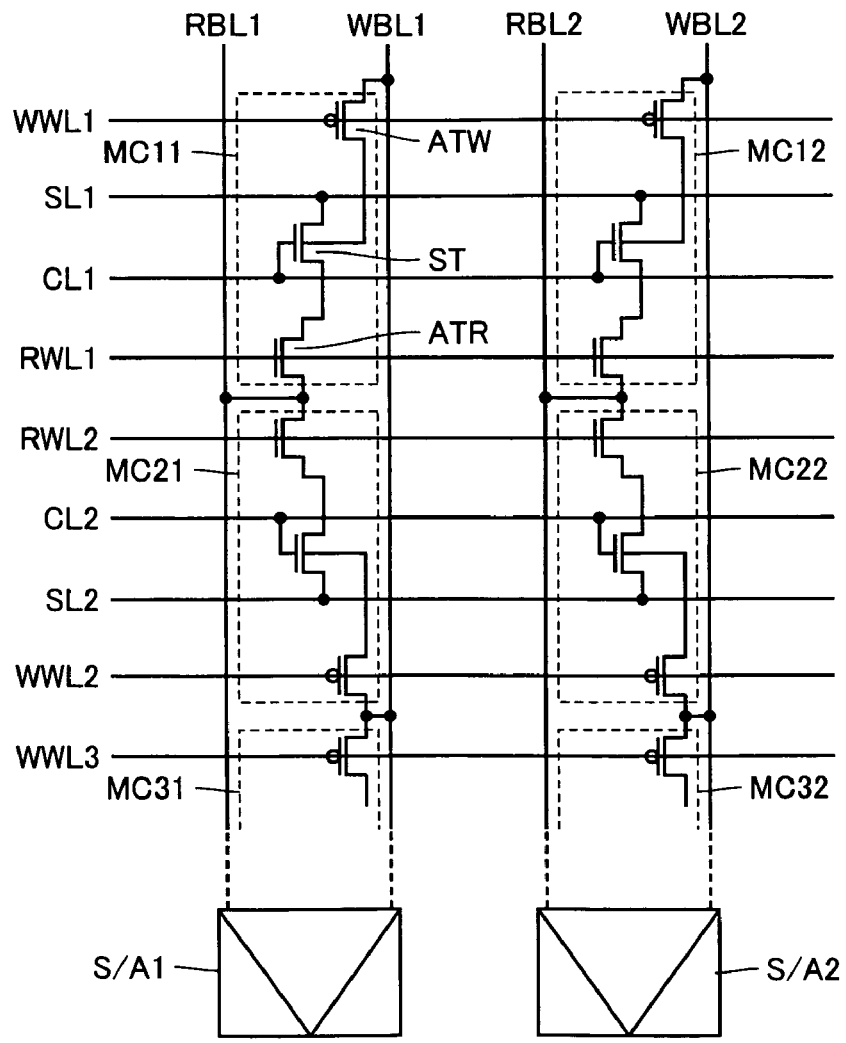
FIG. 61 schematically shows a configuration of a main portion of a semiconductor memory device according to an eighth embodiment of the invention.

FIG. 61 schematically shows a configuration of a main portion of a semiconductor memory device according to an eighth embodiment of the invention. In the configuration of the memory device shown in FIG. 61, a cross-coupled sense amplifier circuit S/A is arranged for a pair of read and write bit lines RBL and WBL. In FIG. 61, a cross-coupled sense amplifier circuit S/A is arranged for read and write bit lines RBL1 and WBL1, and a cross-coupled sense amplifier circuit S/A2 is arranged for read and write bit lines RBL2 and WBL2. Other configuration of the memory cell array shown in FIG. 61 is the same as that of the memory cell array shown in FIG. 23. The corresponding portions are allotted the same reference numerals, and description thereof is not repeated.

Each of cross-coupled sense amplifiers S/A1 and S/A2 includes a configuration of an inverter latch, and can drive high- and low-side bit line potentials to the power supply voltage level and the ground voltage level, respectively, when made active. Sense amplifier circuit S/A (S/A1 or S/A2) is made active in data reading. The specific configuration of sense amplifier circuit S/A may be achieved by cross-coupled PMOS transistors and cross-coupled NMOS transistors, and a configuration that is generally used in a DRAM (Dynamic Random Access Memory) can be employed.

Figure 62:
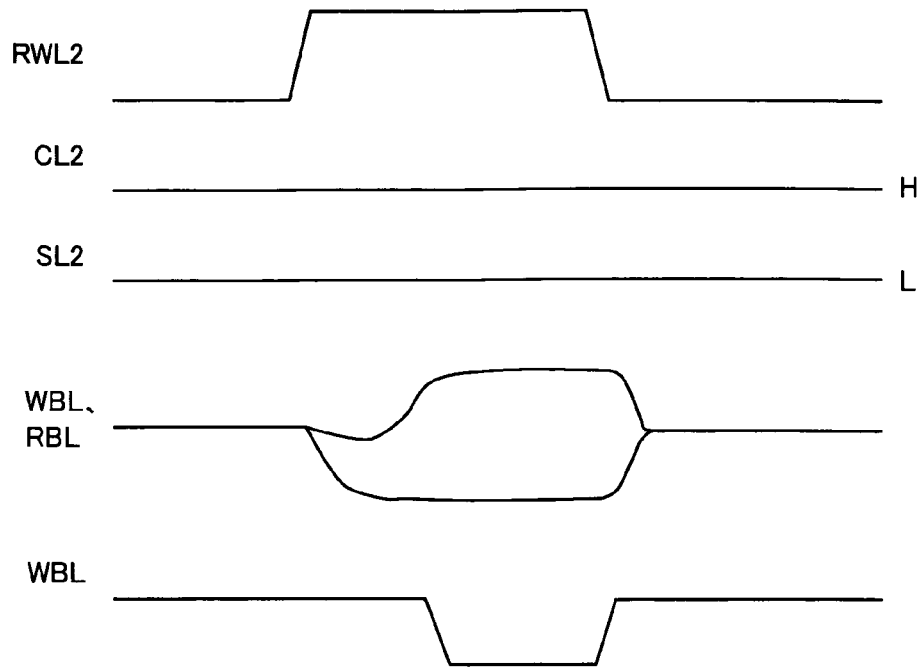
FIG. 62 is a signal waveform diagram representing operations in a data read operation of the semiconductor memory device shown in FIG. 61.

FIG. 62 shows signal waveforms of the memory device shown in FIG. 61 in the data read operation. Referring to FIG. 62, a data read operation of the memory device shown in FIG. 61 will now be described.

Operation waveforms in the data write operation are the same as those in the data write operation in the third embodiment already described with reference to FIG. 21. Accordingly, operations for the data writing will not be described.

In the data read operation, read word line RWL (RWL2) in the selected row is driven to the H level. In this operation, charge line CL (CL2) is at the H level of the power supply voltage. Source line SL (SL2) in the selected row is set to the L level (ground voltage level). In this case, write and read bit lines WBL and RBL are precharged to the intermediate voltage level. Even when write bit line WBL is precharged to the intermediate voltage level, write word line WWL is at the H level higher than the bit line precharge voltage in the data read operation, and the write access transistor maintains the off state. Even when read bit line RBL is precharged to the intermediate voltage level, read word line RWL in the unselected row is at the L level, and read access transistor ATR in the unselected row is kept off so that erroneous reading does not occur.

When read word line RWL2 is driven to the selected state and read access transistor ATR in the selected memory cell turns conductive, a path of a current flow from read bit line RBL to corresponding source line SL (SL2) is formed according to the storage data (potential in the body region) of corresponding storage transistor ST. When the voltage of the body region of storage transistor ST is high and the threshold voltage of the storage transistor is low, a current flows from read bit line RBL to the source line to lower the bit line potential. When storage transistor ST has a high threshold voltage, a current does not flow from read bit line RBL to source line SL, and read bit line RBL substantially keeps the level of the precharge voltage. Therefore, the relationships between logic values of the read data are opposite to those in the structure and configuration of the memory cells in the third embodiment (see FIGS. 21 to 23).

As described above, when read word line RWL2 corresponding to the selected row is driven to the selected state, data is read from the memory cells connected to selected read word line RWL2, and the voltage levels of corresponding read bit line RBL (RBL1, RBL2, . . . ) changes according to the storage data of the corresponding memory cell.

When the potential of the read bit line sufficiently developed, sense amplifier circuits S/A1 and S/A2 are made active to amplify differentially the potentials of read bit lines RBL (RBL1 and RBL2) and the write bit line kept at the precharge voltage level. Thus, when sense amplifier S/A performs the differential amplification, write bit line WBL (WBL1, WBL2, . . . ) is utilized as the reference bit line. Therefore, after sense amplifier circuit S/A completes the sensing operation, the voltage levels of read bit line RBL and corresponding write bit line VVBL attain the inverted levels.

After sense amplifier circuit S/A completes the sensing operation, write word line WWL2 corresponding to the selected row is driven to the L level of the selected state. Thereby, write access transistor PWAT turns conductive to store the inverted value of the read data in storage transistor ST. Specifically, when storage transistor ST accumulates the holes in its body region, its threshold voltage is low. When the amount of the accumulated holes is small, the threshold voltage of storage transistor ST increases. Therefore, when memory cell MC stores the H data, the potential of the read bit line becomes low. When the memory cell stores the L data, the read bit line potential is substantially equal to the precharge voltage level.

Sense amplifier circuit S/A drives write bit line WBL to the voltage level complementary to that of read bit line RBL. When the H data is stored, the voltage at the H level is transmitted to the write bit line. When the L data is stored, the voltage at the ground voltage level is transmitted to write bit line WBL. Thereby, the storage data can be restored into memory cell MC through a read verify write operation. Thus, the restore operation is automatically performed on the storage node (the body region of storage transistor ST) in response to each data read operation. This can suppress lowering of the potential of the storage node (the body region of storage transistor ST), and the data can be held stably over a long time period.

When the read operation is completed, read and write word lines RWL2 and WWL2 are deactivated.

Figure 63:
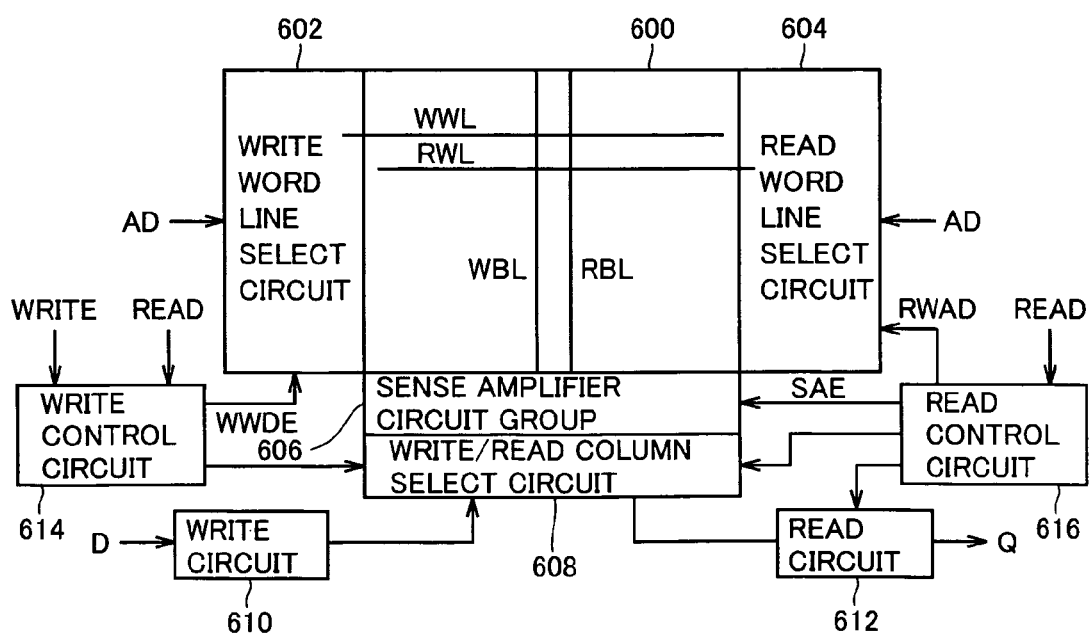
FIG. 63 schematically shows a whole configuration of the semiconductor memory device according to the eighth embodiment of the invention.

FIG. 63 schematically shows a whole configuration of the semiconductor memory device according to the eighth embodiment of the invention. In FIG. 63, the semiconductor memory device includes a memory cell array 600 having memory cells (not shown) arranged in rows and columns. In memory cell array 600, write and read word lines WWL and RWL are arranged corresponding to the memory cell rows, and write and read bit lines WBL and RBL are arranged corresponding to the memory cell columns.

A write word line select circuit 602 selecting write word line WWL and a read word line select circuit 604 selecting read word line RWL are arranged for memory cell array 600. Word line select circuits 602 and 604 can be activated to select write and read word lines WWL and RWL corresponding to the addressed row according to the address signal, respectively.

A sense amplifier circuit group 606 is arranged for write and read bit lines WBL and RBL. Sense amplifier circuit group 606 includes sense amplifier circuits S/A arranged corresponding to the respective pairs of write and read bit lines WBL and RBL, i.e., to the memory cell columns. Sense amplifier circuit S/A in sense amplifier circuit group 606 is activated according to sense amplifier activating signal SAE applied from read control circuit 616 in data reading.

For writing and reading the data, a write/read column select circuit 608, a write circuit 610 and a read circuit 612 are arranged. Write/read column select circuit 608 includes write column select gates arranged corresponding to respective write bit lines WBL, write column decoder for generating the write column select signals selecting a memory cell columns according to the write column address signal, read column select gates arranged corresponding to the respective read bit lines RBL, and read column decoder for selecting a read columns according to the read column address signal. According to the write column select signal applied from the write column decoder, the write column select gate arranged corresponding to a write-selected column, i.e., the column selected for the writing turns conductive to couple the write bit line in the write-selected column to write circuit 610. The read select gate in the read-selected column turns conductive according to the read column select signal applied from the read column decoder, to couple the read-selected column (i.e., the sense amplifier circuit) to read circuit 612.

In the data write operation, write circuit 610 transmits the internal write data to the write bit line in the selected column according to received write data D. In the data read operation, read circuit 612 buffers the internal read data transferred from the read bit line (sense amplifier circuit) in the selected column to produce read data Q to be externally outputted.

For controlling the writing and reading, there are provided a write control circuit 614 for controlling internal operations required for the writing according to a write instructing signal WRITE and a read instructing signal READ, and a read control circuit 616 for controlling the internal operations required for the reading according to read instructing signal READ.

Write control circuit 614 produces a write word line activating signal WWDE to write word line select circuit 602. Write control circuit 614 controls operations of write circuit 610 and a write column select portion of write/read column select circuit 608. In the data read operation, read control circuit 616 produces a read word line activating signal RWDE to read word line select circuit 604, and produces sense amplifier activating signal SAE to sense amplifier circuit group 606. This read control circuit 616 further controls the operation of the read column select portion of write/read column select circuit 608, and also controls the data read operation of read circuit 612.

Although not shown in FIG. 63, there are further provided a precharge circuit for precharging write and read bit lines WBL and RBL to the intermediate voltage level during the read operation. This precharge circuit may be configured to precharge write and read bit lines WBL and RBL to the intermediate voltage level in a one-shot pulse form in the data read operation, or may be configured to precharge write and read bit lines WBL and RBL to the intermediate voltage level during standby. In the data write operation, the precharge circuit stops the precharging of the write bit line.

In the semiconductor memory device shown in FIG. 63, read control circuit 616 activates read word line activating signal RWDE according to read instruction READ in the data read operation. Accordingly, read word line select circuit 604 decodes an address signal AD to drive read word line RWL in the selected row to the selected state.

When the data is read from the memory cell, read control circuit 616 activates sense amplifier activating signal SAE at a predetermined timing. Thus, sense amplifier circuit group 606 activates sense amplifier circuit S/A to amplify differentially the voltages on read and write bit lines RBL and WBL. When the sense operation is completed and the voltages on write and read bit lines WBL and RBL are established at the H and L levels, respectively, write control circuit 614 activates write word line activating signal WWDE according to read instruction READ. Responsively, write word line select circuit 602 decodes address signal AD applied together with the read instruction, and drives read word line RWL in the selected row to the selected state. Accordingly, the sense amplifier circuit restores the data of the memory cell in the selected row.

In parallel with this restoring operation, write/read column select circuit 608 performs the read bit line selection under the control of read control circuit, and transfers the data, which is amplified and latched by the sense amplifier circuit, to read circuit 612. Read circuit 612 produces external data Q from the internal read data under the control of the read control circuit.

When the read cycle is completed, write control circuit 614 deactivates write word line select circuit 602, and read control circuit 616 deactivates read word line select circuit 604, sense amplifier circuit group 606, the read column select portion of write/read column select circuit 608 and read circuit 612.

In the data write operation, write control circuit 614 controls write word line select circuit 602, write circuit 614, write/read column select circuit 608 and write circuit 610 according to write instruction WRITE, so that write bit line WBL and write word line WWL are selected, and the data is written into the memory cell in the selected row and the selected column. In the data writing, read control circuit 616 is in the standby state, and does not perform the data read operation.

Write control circuit 614 selects the write word line in the write operation at the timing different from that in the read operation. The timing adjustment can be achieved by utilizing the following configuration. In the data read operation, read control circuit 616 delays write word line activating signal RWDE to produce the sense amplifier activating signal. In the write operation, the write control circuit produces the first write row select activating signal according to write instruction WRITE. In the write operation, the write control circuit produces a sense delay signal having a longer delay time than the sense amplifier activating signal according to read instructing signal READ. A signal of a logical sum of these write row select activating signal and the sense delay signal is produced as write word line activating signal WWDE.

In the read operation, the read address signal must be applied to write control circuit 614. This can be easily accommodated for by configuring the address input circuit of the write port to takes in the address signal whenever the write access or the read access is made. However, when write and read address signal transmission lines are separately from each other, it is required to provide, in the write address input circuit, a circuit for selecting one of the write and read address signals.

For the restoring in the data read operation, such a configuration may be employed that the signal on the read word line is inverted and transmitted onto the corresponding write word line. The unselected read word line is at the L level, and the unselected write word line is at the H level. Only in the selected row, the read word line attains the H level, and the write word line attains the L level. Therefore, no problem occurs when the read word line in each memory cell row is coupled to the corresponding write word line via an inverter. In this case, write control circuit 614 is not required to perform the control for selecting a write word line, and read control circuit 616 activates the tristate inverter arranged for each read word line according to a delayed signal of the sense amplifier activating signal.

The restoring operation performed in the eighth embodiment can be applied to the memory cell structures not provided with the storage transistor in the fourth, sixth and seventh embodiments, and thereby similar effect can be achieved. Further, the eighth embodiment can employ the memory cell manufacturing process and the structure for the source line bias from the memory device substrate already described in connection with the modification of the sixth embodiment.

According to the eighth embodiment of the invention, as described above, the sense amplifier circuit arranged for each memory cell column differentially amplifies the voltages on the write and read bit lines in the data read operation, and then transfers the amplified voltages to the storage node by the use of the write word line. Therefore, the voltage changes on the storage node can be suppressed, and the data can be held stably over a long time period.

This invention can be generally applied to the dual-port RAM of a large storage capacity. In particular, the invention can be applied to embedded memories, each of which is integrated, on a single semiconductor substrate, together with a processor and/or a logic such as 3-D graphics and a network device, for achieving a highly integrated system LSIs allowing fast access.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor memory device comprising:
   a plurality of memory cells, arranged in rows and columns, each formed on an insulating film, each of the memory cells including (i) a first transistor for storing information by a voltage at a body region and having a first conduction node receiving a fixed voltage, and second and third conduction nodes isolated from said first conduction node by said body region, (ii) a second transistor having a fourth conduction node connected to said second conduction node of said first transistor, and (iii) a third transistor having a fifth conduction node connected to the third conduction node of said first transistor;
   a plurality of first word lines, arranged corresponding to the memory cell rows, each connected to control electrodes of the second transistors of the memory cells in a corresponding row;
   a plurality of second word lines, arranged corresponding to the memory cell rows, each connected to control electrodes of the third transistors of the memory cells in a corresponding row;
   a plurality of charge lines, arranged corresponding to said memory cell rows, each connected to control electrodes of the first transistors of the memory cells in a corresponding row;
   a plurality of first bit lines, arranged corresponding to said memory cell columns, respectively, each connected to sixth conduction nodes of the second transistors of the memory cells in a corresponding column; and
   a plurality of second bit lines, arranged corresponding to said memory cell columns, respectively, each connected to seventh conduction nodes of the third transistors of the memory cells in a corresponding column.

2. The semiconductor memory device according to claim 1, wherein
   each of said first transistors includes a first impurity region formed under the control electrode and forming said body region; a second impurity region adjacent to said first impurity region and forming said second conduction node connected to said second transistor; a third impurity region opposed to said second impurity region with respect to said first impurity region and forming the third conduction node connected to said third transistor; and a fourth impurity region arranged in a region of said first impurity region different from sides facing the second and third impurity regions, adjacent to said first impurity region and forming said first conduction node.

3. The semiconductor memory device according to claim 1, wherein
   the second and third transistors of the memory cells aligned in a column direction are formed in an active region arranged extending linearly in the column direction, and the first and second bit lines in the corresponding column are arranged sandwiching the active region of the memory cells in the corresponding column, and said first transistor has a region for forming said body region and said first conduction node formed in a projected region arranged in a portion between formation regions of the second and third transistors, said projected portion arranged projecting in a row direction from said active region beyond a corresponding first bit line, and regions for forming the second and third conduction nodes being shared by regions for forming the fourth and fifth conduction nodes of the second and third transistors, respectively.

4. The semiconductor memory device according to claim 1, wherein
the first and second word lines in each memory cell row are arranged sandwiching the charge line.

5. The semiconductor memory device according to claim 1, wherein
the memory cells are each formed in a rectangle-shaped active region, and
the first transistor of each memory cell has a control electrode of a T-shaped structure having a leg and a base, and the second and third transistors being arranged opposing to each other with respect to said leg, and
the second and third transistors of each memory cell have the control electrodes formed into L-shaped structures symmetrical with respect to said leg.

6. The semiconductor memory device according to claim 5, wherein
each first word line is connected to the control electrodes of the second transistors of the memory cells in two rows adjacent to each other in a column direction,
said second word line is connected to the control electrodes of the third transistors of the memory cells in the two rows adjacent to each other in said column direction,
the second and third transistors are arranged alternately to each other in the row direction, and
the memory cells arranged adjacent in the column direction in adjacent rows are connected to different bit lines.

7. The semiconductor memory device according to claim 5, wherein
each first word line has a portion extending under an adjacent second word line, and electrically coupled to the control electrode of a corresponding second transistor, and
each second word line has a portion extending under an adjacent first word line, and electrically coupled to the control electrode of the third transistor of the corresponding, adjacent memory cell.

8. A semiconductor memory device comprising:
a plurality of memory cells, arranged in rows and columns, each formed on an insulating film, each of the memory cells including (i) a first transistor for storing information by a voltage on a body region, and having a first conduction node receiving a fixed voltage, and a second conduction node isolated from said first conduction node by said body region, (ii) a second transistor having a third conduction node connected to said second conduction node of said first transistor, and (iii) a third transistor having a fourth conduction node connected to said body region of said first transistor and being different in conductivity type from the first and second transistors;
a plurality of first word lines, arranged corresponding to the memory cell rows, and each connected to control electrodes of the second transistors of the memory cells in a corresponding row;
a plurality of second word lines, arranged corresponding to said memory cell rows, each connected to control electrodes of the third transistors of the memory cells in a corresponding row;
a plurality of charge lines, arranged corresponding to said memory cell rows, each connected to control electrodes of the first transistors of the memory cells in a corresponding row;
a plurality of first bit lines, arranged corresponding to the memory cell columns, each connected to fifth conduction nodes of the second transistors of the memory cells in a corresponding column; and
a plurality of second bit lines, arranged corresponding to said memory cell columns, each connected to sixth conduction nodes of the third transistors of the memory cells in a corresponding column.

9. The semiconductor memory device according to claim 8, wherein
the memory cells aligned in the column direction are formed in an active region extending continuously in the column direction with convex and concave regions being arranged alternately in the column direction, and
the first and second transistors are formed in the convex regions, and the third transistors are formed in the concave regions.

10. The semiconductor memory device according to claim 8, wherein
in each memory cell row, the first and second word lines are arranged sandwiching the charge line.

11. The semiconductor memory device according to claim 8, wherein
in each memory cell row, the second word line and the charge line are arranged sandwiching a voltage line transmitting said fixed voltage.

12. The semiconductor memory device according to claim 8, wherein
the memory cell is formed in a rectangle-shaped active region, and
the first transistor of said memory cell has a control electrode of a T-shaped structure having a leg and a base, and the second and third transistors are arranged opposing to each other with respect to said leg,
the control electrodes of said second and third transistors have L-shaped structures arranged symmetrically with respect to said leg, and
a region forming said second transistor and a region forming said third transistor in each of the active regions are different in conductivity type from each other.

13. The semiconductor memory device according to claim 8, wherein
each of the first word line is connected to control electrodes of the second transistors of the memory cells in two rows adjacent to each other in a column direction,
each of the second word line is connected to control electrodes of the third transistors of the memory cells in two rows adjacent to each other in said column direction,
said second and third transistors are arranged alternately to each other in a row direction,
said second transistors are arranged in alignment in the column direction, and
said third transistors are arranged in alignment in the column direction, and
two second transistors located in the adjacent rows and aligned in the column direction are connected to different first bit lines, respectively, and two third transistors located in the adjacent rows and aligned in the column direction are connected to different second bit lines.

14. The semiconductor memory device according to claim 13, wherein
the first and second transistors are arranged alternately in the column direction, and the first and third transistors are arranged alternately in said column direction.

15. A semiconductor memory device comprising:
a plurality of memory cells formed on an insulating layer and arranged in rows and columns, each of the memory cells including a first transistor, a second transistor connected in series to said first transistor, and a third transistor having a control electrode connected to a body region of said first transistor and connected in series to said first transistor, and a connection node between the first and third transistors being coupled to a source line supplying a predetermined voltage;
a plurality of charge lines, arranged corresponding to the memory cell rows, each connected to control electrodes of the first transistors of the memory cells in a corresponding row;
a plurality of word lines, arranged corresponding to said memory cell rows, each connected to control electrodes of the second transistors of the memory cells in a corresponding row;
a plurality of first bit lines, arranged corresponding to said memory cell rows, each connected to the second transistors of the memory cells in a corresponding column; and
a plurality of second bit lines arranged corresponding to said memory cell columns, each connected to the third transistors of the memory cells in a corresponding column.

16. The semiconductor memory device according to claim 15, wherein
the memory cells arranged in alignment in the column direction are formed in an active region extending continuously in the column direction with convex and concave regions being alternately arranged in the column direction, and
the first and second transistors are formed in the convex regions, the third transistors are formed in the concave regions, the concave region having an impurity region coupled to the body region of said first transistor, and said impurity region being coupled to the control electrode of said third transistor.

17. A semiconductor memory device comprising:
a plurality of memory cells, arranged in rows and columns, each formed on an insulating film and including first and second transistors of different conductivity types, the first transistor having a first conduction node electrically connected to a body region of the second transistor, a second conduction node and a first control electrode, and said second transistor having a third conduction node receiving a reference voltage, a fourth conduction node and a second control electrode;
a plurality of first word lines, arranged corresponding to the memory cell rows, each connected to the first control electrodes of the first transistors of the memory cells in a corresponding row;
a plurality of second word lines arranged corresponding to said memory cell rows, respectively, and each connected to the second control electrodes of the second transistors of the memory cells in the corresponding row;
a plurality of first bit lines, arranged corresponding to the memory cell columns, each connected to the second conduction nodes of first transistors in a corresponding column; and
a plurality of second bit lines, arranged corresponding to the memory cell columns, each connected to the fourth conduction nodes of said second transistors in a corresponding column.

18. The semiconductor memory device according to claim 17, wherein
in each of the memory cells,
the first transistor has said first control electrode formed of a first electrode interconnection arranged linearly and forming a part of a corresponding first word line, and the first and second conduction nodes formed of first and second impurity regions of a first conductivity type arranged opposing to each other with respect to said first electrode interconnection, and
said second transistor has said second control electrode formed of a second electrode interconnection having a first portion parallel to said first electrode interconnection and a second portion extending in a direction crossing said first portion, said body region formed of a third impurity region of the first conductivity type adjacent to the second impurity region and formed under said second electrode interconnection, and said third and fourth conduction nodes formed of impurity regions of a second conductivity type arranged opposing to each other with respect to said second portion.

19. The semiconductor memory device according to claim 18, wherein
said insulating film is formed on a semiconductor substrate receiving said reference voltage, and
the impurity region forming said third conduction node of said second transistor is electrically connected to said semiconductor substrate via a through-opening formed in said insulating film.

20. The semiconductor memory device according to claim 17, wherein
in each of said memory cells,
said first transistor has (i) said first control electrode formed of a first electrode interconnection arranged linearly and forming a part of a corresponding first word line, (ii) said first and second conduction nodes formed of first and second impurity regions of a first conductivity type arranged opposing to each other with respect to said first electrode interconnection, said first impurity region is formed at a surface of a third impurity region of a second conductivity type forming the body region of said first transistor, and (iii) said second impurity region being formed reaching said insulating film, and
said second transistor has (a) said second control electrode formed of a second electrode interconnection parallel to said first electrode interconnection, (b) the body region formed of a fourth impurity region of the first conductivity type electrically connected to said second impurity region, adjacent to a region for forming said first transistor and formed over an entire region for forming said second transistor, and (c) the third and fourth conduction nodes formed of fifth and sixth impurity regions of the second conductivity type formed, at a surface of said fourth impurity region, opposing to each other with respect to said second electrode interconnection.

21. The semiconductor memory device according to claim 20, further comprising:
a seventh impurity region of the second conductivity type formed opposing to said fifth impurity region with respect to said first electrode interconnection, adjacent to said first impurity region and at the surface of said fourth impurity region.

22. The semiconductor memory device according to claim 17, further comprising:

a plurality of sense amplifier circuits, arranged corresponding to the memory cell columns, each being activated in a data read operation to amplify differentially and latch potentials of the first and second bit lines in a corresponding column;

a second word line select circuit being activated in said data read operation to drive the second word line arranged corresponding to an addressed row to a selected state; and a first word line select circuit for driving the first word line arranged corresponding to said addressed row when the sense amplifier circuits are active in said data read operation, and for driving the first word line corresponding to an addressed row according to an address signal in a data write operation.

23. A semiconductor memory device comprising:

a plurality of memory cells, arranged in rows and columns, each having a charge accumulation node, a first transistor of a first conductivity type transmitting charges corresponding to write data to said charge accumulation node in a data write operation, and a second transistor of a second conductivity type selectively transmitting a voltage on a reference potential node according to a potential of said charge accumulation node in a data read operation;

a plurality of first word lines, arranged corresponding to said memory cell rows, each connected to first control electrodes of said first transistors of the memory cells in a corresponding row;

a plurality of second word lines, arranged corresponding to the memory cell rows, each connected to second control electrodes of said second transistors of the memory cells in a corresponding row;

a plurality of first bit lines, arranged corresponding to the memory cell columns, each connected to first conduction nodes of said first transistors in a corresponding column;

a plurality of second bit lines, arranged corresponding to said memory cell columns each connected to second conduction nodes of the second transistors in a corresponding column;

a plurality of sense amplifier circuits arranged corresponding to said memory cell columns, and made active in a data read operation to amplify differentially voltages on the first and second bit lines in corresponding columns; and a row select circuit for, in the data read operation, driving the second word line arranged corresponding to an addressed row to a selected state according to an address signal before the sense amplifier circuits are made active, and then driving the first word line arranged corresponding to the addressed row to the selected state after said sense amplifier circuits are made active.

24. The semiconductor memory device according to claim 23, wherein said charge accumulation node is a body region of a third transistor of the second conductivity type connected in series to said second transistor between said reference potential node and a corresponding second bit line, and said body region is electrically coupled to a corresponding first bit line via said first transistor when said first transistor is made conductive.

25. The semiconductor memory device according to claim 23, wherein said charge accumulation node is a body region of said second transistor, said second transistor is connected between said reference potential node and a corresponding second bit line, and said first transistor is connected between said body region and a corresponding first bit line.

* * * * *